(12) United States Patent
Yamatani

(10) Patent No.: US 11,785,836 B2
(45) Date of Patent: Oct. 10, 2023

(54) ORGANIC ELECTROLUMINESCENCE DEVICE AND COMPOUND FOR ORGANIC ELECTROLUMINESCENCE DEVICE

(71) Applicant: Samsung Display Co., Ltd., Yongin-si (KR)

(72) Inventor: Akinori Yamatani, Yokohama (JP)

(73) Assignee: Samsung Display Co., Ltd., Yongin-si (KR)

(*) Notice: Subject to any disclaimer, the term of this patent is extended or adjusted under 35 U.S.C. 154(b) by 593 days.

(21) Appl. No.: 16/809,480

(22) Filed: Mar. 4, 2020

(65) Prior Publication Data

US 2020/0403158 A1    Dec. 24, 2020

(30) Foreign Application Priority Data

Jun. 21, 2019 (KR) .................. 10-2019-0074027

(51) Int. Cl.
| | | |
|---|---|---|
| H10K 85/30 | (2023.01) | |
| H10K 50/11 | (2023.01) | |
| H10K 85/40 | (2023.01) | |
| H10K 101/10 | (2023.01) | |

(52) U.S. Cl.
CPC ........... H10K 85/322 (2023.02); H10K 50/11 (2023.02); H10K 85/40 (2023.02); *H10K 2101/10* (2023.02)

(58) Field of Classification Search
CPC ............. H01L 51/5016; H01L 51/0094; H01L 51/008; C07F 5/027; H10K 2101/10; H10K 85/40; H10K 85/322; H10K 85/658
See application file for complete search history.

(56) References Cited

U.S. PATENT DOCUMENTS

| | | |
|---|---|---|
| 9,073,948 B2 | 7/2015 | Kottas et al. |
| 10,333,078 B2 | 6/2019 | Tanabe et al. |
| 10,333,085 B2 | 6/2019 | Nakano et al. |
| 2015/0236274 A1 | 8/2015 | Hatakeyama et al. |
| 2017/0092874 A1 | 3/2017 | Tanabe et al. |
| 2018/0069182 A1 | 3/2018 | Hatakeyama et al. |
| 2018/0094000 A1 | 4/2018 | Hatakeyama et al. |
| 2018/0301629 A1 | 10/2018 | Hatakeyama et al. |
| 2019/0207112 A1 | 7/2019 | Hatakeyama et al. |
| 2021/0053998 A1* | 2/2021 | Kim .................... H01L 51/0074 |
| 2022/0017545 A1* | 1/2022 | Han .................... H01L 51/0071 |

FOREIGN PATENT DOCUMENTS

| | | | |
|---|---|---|---|
| KR | 10-2014-0070450 A | 6/2014 | |
| KR | 10-1785755 B1 | 10/2017 | |
| KR | 10-2018-0007727 A | 1/2018 | |
| KR | 10-1886773 B1 | 8/2018 | |
| KR | 10-2018-0127918 A | 11/2018 | |
| WO | WO 2015/102118 A1 | 7/2015 | |
| WO | WO 2015/176981 A1 | 11/2015 | |
| WO | WO 2016/046350 A1 | 3/2016 | |
| WO | WO 2016/152418 A1 | 9/2016 | |
| WO | WO 2016/152544 A1 | 9/2016 | |
| WO | WO 2017/188111 A1 | 11/2017 | |
| WO | WO 2018/216990 A1 | 11/2018 | |
| WO | WO-2018216990 A1 * | 11/2018 | .............. C07F 5/027 |

OTHER PUBLICATIONS

Lee et al., machine translation of WO 2018/216900 A1 (2018) pp. 1-42. (Year: 2018).*

* cited by examiner

*Primary Examiner* — Dylan C Kershner

(74) *Attorney, Agent, or Firm* — Lewis Roca Rothgerber Christie LLP

(57) ABSTRACT

An organic electroluminescence device includes a first electrode, a second electrode, and an emission layer between the first electrode and the second electrode, wherein the emission layer includes a compound represented by Formula 1 below. Embodiments of the present disclosure exhibit improved emission efficiency and long life characteristics:

[Formula 1]

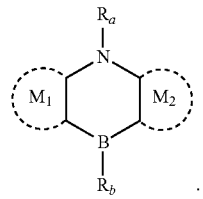

20 Claims, 2 Drawing Sheets

ORGANIC ELECTROLUMINESCENCE DEVICE AND COMPOUND FOR ORGANIC ELECTROLUMINESCENCE DEVICE

CROSS-REFERENCE TO RELATED APPLICATION

This application claims priority to and the benefit of Korean Patent Application No. 10-2019-0074027, filed on Jun. 21, 2019, the entire content of which is incorporated herein by reference.

BACKGROUND

1. Field

One or more aspects of example embodiments of the present disclosure are related to an organic electroluminescence device and a compound used therein, and for example, to a compound used as a light-emitting material and an organic electroluminescence device including the same.

2. Description of the Related Art

Recently, the development of an organic electroluminescence display device as an image display device is being actively conducted. An organic electroluminescence display device differs from a liquid crystal display device in that it is a so-called self-luminescent display device, in which holes and electrons respectively injected from a first electrode and a second electrode recombine in an emission layer, and a light emission material including an organic compound in the emission layer emits light to achieve display.

When an organic electroluminescence device is applied to a display device, a decreased driving voltage, increased light-emitting efficiency, and long lifetime of the organic electroluminescence device are desired. Further development of organic electroluminescence device materials capable of stably attaining the requirements are also desired.

Recent research has focused on phosphorescence emission using triplet state energy or delayed fluorescence emission using triplet-triplet annihilation (TTA), in which singlet excitons are produced by the collision of triplet excitons, including development of a material for thermally activated delayed fluorescence (TADF) using delayed fluorescence emission.

SUMMARY

One or more aspects of embodiments of the present disclosure are directed toward an organic electroluminescence device showing good life characteristics and excellent emission efficiency.

One or more aspects of embodiments of the present disclosure are directed toward a compound that is a material for an organic electroluminescence device having high efficiency and long life characteristics.

One or more example embodiments of the present disclosure provide a compound represented by Formula 1:

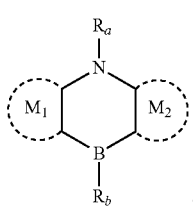

[Formula 1]

In Formula 1, $M_1$ and $M_2$ are each independently a substituted or unsubstituted hydrocarbon ring of 5 to 30 carbon atoms to form a ring, or a substituted or unsubstituted heterocycle of 2 to 30 carbon atoms to form a ring. $R_a$ is a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted silyl group, a substituted or unsubstituted carbonyl group, a substituted or unsubstituted oxy group, a substituted or unsubstituted thio group, a substituted or unsubstituted boryl group, a substituted or unsubstituted phosphinyl group, a substituted or unsubstituted phosphineoxy group, a substituted or unsubstituted phosphine sulfide group, a substituted or unsubstituted sulfonyl group, or a substituted or unsubstituted sulfinyl group. $R_b$ is a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted oxy group, a substituted or unsubstituted thio group, or a substituted or unsubstituted amino group, and in some embodiments, $R_a$ and/or $R_b$ may be selectively (e.g., optionally) combined with $M_1$ or $M_2$ to form a ring. A (e.g., one) substituent of $M_1$ and $M_2$ is a polycyclic hetero group represented by Formula 2:

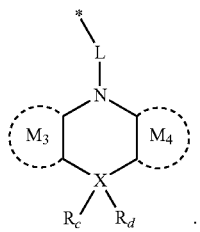

[Formula 2]

In Formula 2, X is Si or Ge, and $M_3$ and $M_4$ are each independently a substituted or unsubstituted hydrocarbon ring of 5 to 30 carbon atoms to form a ring, or a substituted or unsubstituted heterocycle of 2 to 30 carbon atoms to form a ring. L is a direct linkage, a substituted or unsubstituted arylene group of 6 to 30 carbon atoms to form a ring, or a substituted or unsubstituted heteroarylene group of 2 to 30 carbon atoms to form a ring, and $R_c$ and $R_d$ are each independently a substituted or unsubstituted alkyl group of 3 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted oxy group, a substituted or unsubstituted thio group, or a substituted or unsubstituted amino group, or $R_c$ and $R_d$ are combined with each other to form a substituted or unsubstituted hydrocarbon ring of 5 to 30 carbon atoms to form a ring, or a substituted or unsubstituted heterocycle of 2 to 30 carbon atoms to form a ring.

In an embodiment, Formula 1 may be represented by Formula 1-1 or Formula 1-2:

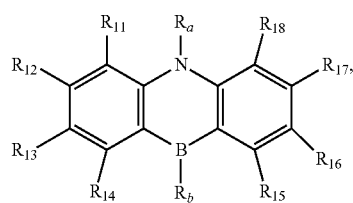

[Formula 1-1]

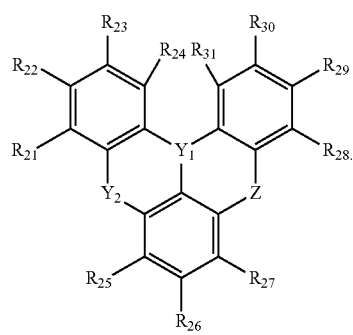

[Formula 1-2]

In Formula 1-2, $Y_1$ is B and $Y_2$ is $NR_a$, or $Y_1$ is N and $Y_2$ is $BR_b$, Z is a direct linkage, O, S, C=O, $BR_e$, $NR_f$, $CR_gR_h$, $SiR_iR_j$, $GeR_kR_l$, $POR_m$, $PSR_n$, SO, or $SO_2$, and $R_e$ to $R_n$ are each independently a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, or a substituted or unsubstituted heteroaryl group of 2 to 30 carbon atoms to form a ring. In Formula 1-1 and Formula 1-2, $R_{11}$ to $R_{18}$, and $R_{21}$ to $R_{31}$ are each independently a substituent of a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted amino group, a substituted or unsubstituted silyl group, a substituted or unsubstituted carbonyl group, a substituted or unsubstituted oxy group, or a substituted or unsubstituted thio group, or are combined with an adjacent group to form a fused ring. Any one of $R_{11}$ to $R_{18}$, or a substituent of the fused ring formed from $R_{11}$ to $R_{18}$ is the polycyclic hetero group represented by Formula 2, any one of $R_{21}$ to $R_{31}$, or a substituent of the fused ring formed from $R_{21}$ to $R_{31}$ is the polycyclic hetero group represented by Formula 2, and $R_a$ and $R_b$ are the same as defined in Formula 1.

In an embodiment, Formula 2 may be represented by Formula 2-1 or Formula 2-2:

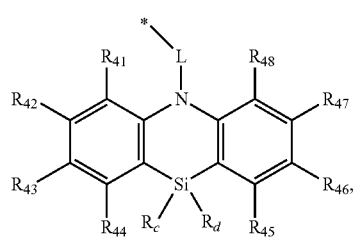

[Formula 2-1]

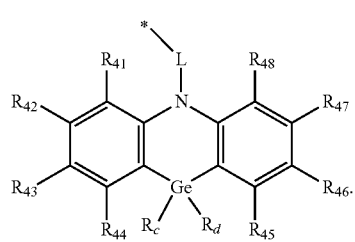

[Formula 2-2]

In Formula 2-1 and Formula 2-2, $R_{41}$ to $R_{48}$ are each independently a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted amino group, a substituted or unsubstituted silyl group, a substituted or unsubstituted carbonyl group, a substituted or unsubstituted oxy group, or a substituted or unsubstituted thio group, and L, $R_c$, and $R_d$ are the same as defined in Formula 2.

In an embodiment, Formula 1-1 may be represented by Formula 1-1A or Formula 1-1B:

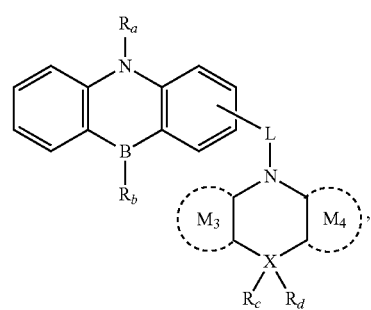

[Formula 1-1A]

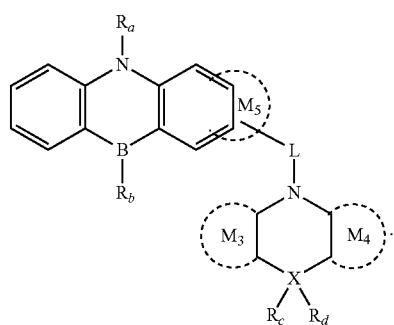

[Formula 1-1B]

In Formula 1-1B, $M_5$ is a substituted or unsubstituted hydrocarbon ring of 5 to 30 carbon atoms to form a ring, or a substituted or unsubstituted heterocycle of 2 to 30 carbon atoms to form a ring, and in Formula 1-1A and Formula 1-1B, $R_a$ and $R_b$ are the same as defined in Formula 1, and X, L, $M_3$, $M_4$, $R_c$, and $R_d$ are the same as defined in Formula 2.

In an embodiment, Formula 1-2 may be represented by one selected from Formulae 1-2A to 1-2C:

[Formula 1-2A]

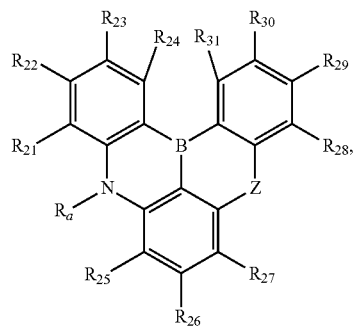

[Formula 1-2B]

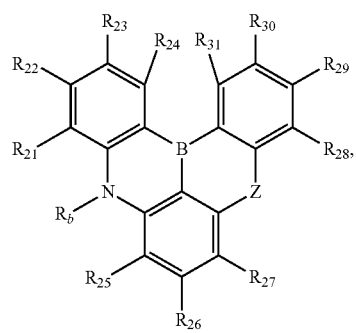

[Formula 1-2C]

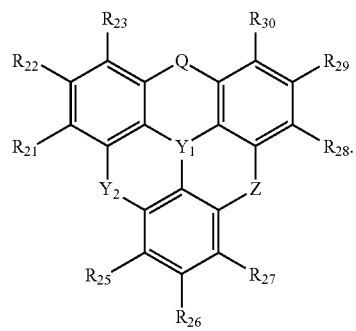

In Formula 1-2C, Q is a direct linkage, O, S, C=O, $BR_g$, or $NR_h$, $R_g$ and $R_h$ are each independently a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, or a substituted or unsubstituted heteroaryl group of 2 to 30 carbon atoms to form a ring, and in Formula 1-2A to Formula 1-2C, $R_a$, $R_b$, $Y_1$, $Y_2$, Z, and $R_{21}$ to $R_{31}$ are the same as defined in Formula 1-2.

In an embodiment, Formula 1-2 may be represented by one selected from Formula 1-2D to Formula 1-2F:

[Formula 1-2D]

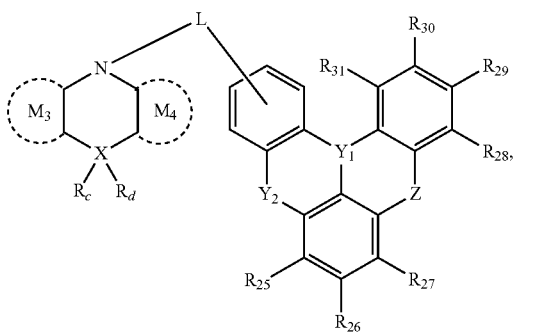

[Formula 1-2E]

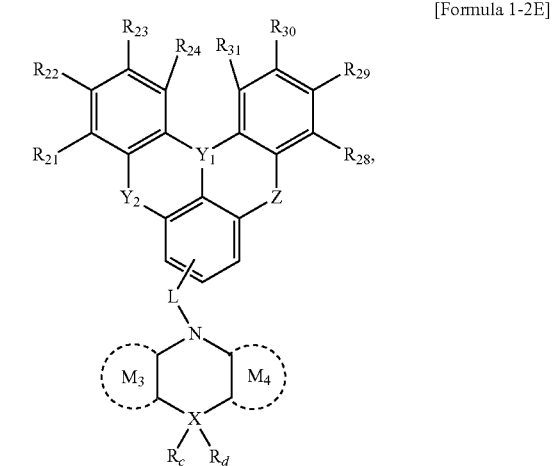

[Formula 1-2F]

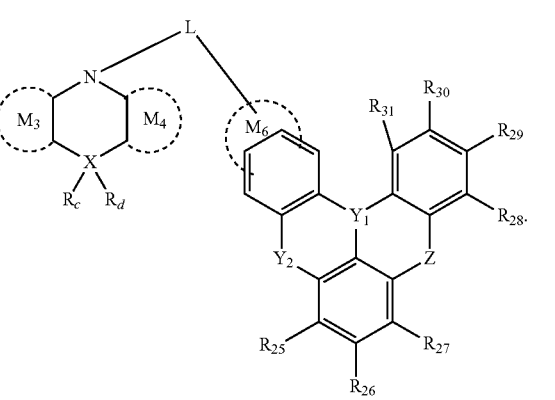

In Formula 1-2F, $M_6$ is a substituted or unsubstituted hydrocarbon ring of 5 to 30 carbon atoms to form a ring, or a substituted or unsubstituted heterocycle of 2 to 30 carbon atoms to form a ring, and in Formula 1-2D to Formula 1-2F, $R_{21}$ to $R_{31}$, $Y_1$, $Y_2$, and Z are the same as defined in Formula 1-2, and X, L, $M_3$, $M_4$, $R_c$, and $R_d$ are the same as defined in Formula 2.

In an embodiment, $M_1$ and $M_2$ may be each independently a substituted or unsubstituted benzene ring, a substituted or unsubstituted naphthalene ring, or a substituted or unsubstituted dibenzothiophene ring.

In an embodiment, $M_3$ and $M_4$ may be substituted or unsubstituted benzene rings.

The emission layer is a delayed fluorescence emission layer comprising a host and a dopant, and the dopant comprises the compound represented by Formula 1.

In an embodiment, the compound represented by Formula 1 may be a material to emit thermally activated delayed fluorescence.

One or more example embodiments of the present disclosure provide an organic electroluminescence device including a first electrode; a second electrode disposed on the first electrode; and an emission layer disposed between the first electrode and the second electrode, wherein the emission layer includes the compound of an embodiment. The first electrode and the second electrode may each independently include at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxide thereof.

In an embodiment, the emission layer may be to emit delayed fluorescence.

In an embodiment, the emission layer may be a delayed fluorescence emission layer including a host and a dopant, and the dopant may include the compound of an embodiment.

In an embodiment, the emission layer may be to emit blue light having a central wavelength of about 430 nm to about 490 nm.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
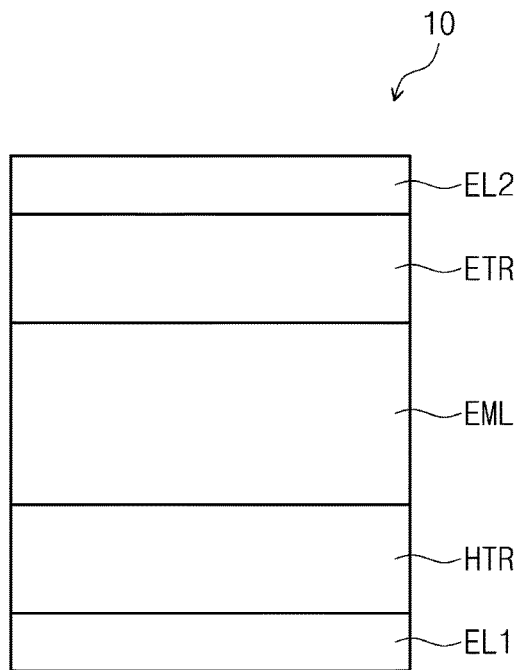
FIG. 1 is a cross-sectional view schematically illustrating an organic electroluminescence device according to an embodiment of the present disclosure.

The inventive concept may have various modifications and may be embodied in different forms, and example embodiments will be explained in more detail with reference to the accompany drawings. The inventive concept may, however, be embodied in different forms and should not be construed as limited to the embodiments set forth herein. Rather, all modifications, equivalents, and substituents which are included in the spirit and technical scope of the inventive concept should be included in the present disclosure.

It will also be understood that when an element (or a region, a layer, a part, etc.) is referred to as being "on", "connected with", or "combined with" another element, it can be directly on/connected with/combined with the other element, or a third element may be present therebetween. In contrast, when an element is referred to as being "directly on" another element, no intervening elements are present.

Like reference numerals refer to like elements throughout, and duplicative descriptions thereof may not be provided. In the drawings, the thicknesses, the ratios, and the dimensions of the elements may be exaggerated for effective explanation of technical features.

The term "and/or" includes one or more combinations which may be defined by relevant elements. Expressions such as "at least one of," "one of," "selected from," "at least one selected from," and "one selected from," when preceding a list of elements, modify the entire list of elements and do not modify the individual elements of the list.

It will be understood that, although the terms "first", "second", etc. may be used herein to describe various elements, the referenced elements are not limited by these terms. These terms are only used to distinguish one element from another element. Thus, a first element could be termed a second element without departing from the teachings of the present invention. Similarly, a second element could be termed a first element. As used herein, singular forms are intended to include plural forms as well, unless the context clearly indicates otherwise.

In addition, the terms "under", "below", "above", "on", etc. are used for explaining the correlation among elements shown in the drawings. These terms are relative concepts, and will be explained and further interpreted and understood on the basis of the directions indicated in the drawings.

It will be understood that terms (including technical terms and scientific terms) used in the present disclosure have the same meanings as commonly understood by a person skilled in the art, unless otherwise defined. In addition, the terms defined in commonly used dictionaries shall be interpreted as having meanings that are consistent with their meanings in the context of the relevant technical idea, unless otherwise interpreted as having ideal or excessively formal meaning.

It will be further understood that the terms "comprises" and/or "comprising," when used in this specification, specify the presence of stated features, numerals, steps, operations, elements, parts, or combinations thereof, but do not preclude the presence or addition of one or more other features, numerals, steps, operations, elements, parts, or combinations thereof.

Hereinafter, the organic electroluminescence device according to an embodiment of the present disclosure and a compound according to an embodiment of the present disclosure, included therein will be explained with reference to attached drawings.

FIGS. 1 to 4 are cross-sectional views schematically illustrating organic electroluminescence devices according to exemplary embodiments of the present disclosure. Referring to FIGS. 1 to 4, in an organic electroluminescence device 10 according to an embodiment, a first electrode EL1 and a second electrode EL2 are oppositely disposed to each other (e.g., face each other), and an emission layer EML is between the first electrode EL1 and the second electrode EL2.

The organic electroluminescence device 10 according to an embodiment may further include a plurality of functional layers in addition to the emission layer EML between the first electrode EL1 and the second electrode EL2. The plurality of functional layers may include a hole transport region HTR, and an electron transport region ETR. That is, the organic electroluminescence device 10 according to an embodiment may include the first electrode EL1, the hole transport region HTR, the emission layer EML, the electron transport region ETR, and the second electrode EL2, laminated in order. In addition, the organic electroluminescence device 10 according to an embodiment may include a capping layer CPL disposed on the second electrode EL2.

The organic electroluminescence device 10 according to an embodiment may include a compound according to an embodiment (described below), in the emission layer EML disposed between the first electrode EL1 and the second electrode EL2. However, embodiments of the present disclosure are not limited thereto, and for example, the organic electroluminescence device 10 according to an embodiment may include the compound in the hole transport region HTR and/or in the electron transport region ETR, which are a plurality of functional layers disposed between the first electrode EL1 and the second electrode EL2 in addition to the emission layer EML. In some embodiments, the compound may be included in the capping layer CPL disposed on the second electrode EL2.

Figure 2:
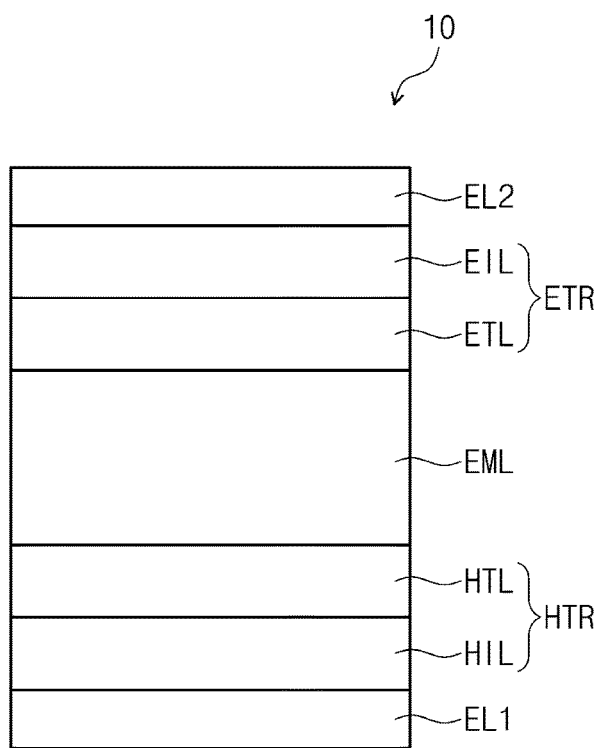
FIG. 2 is a cross-sectional view schematically illustrating an organic electroluminescence device according to an embodiment of the present disclosure.
Figure 3:
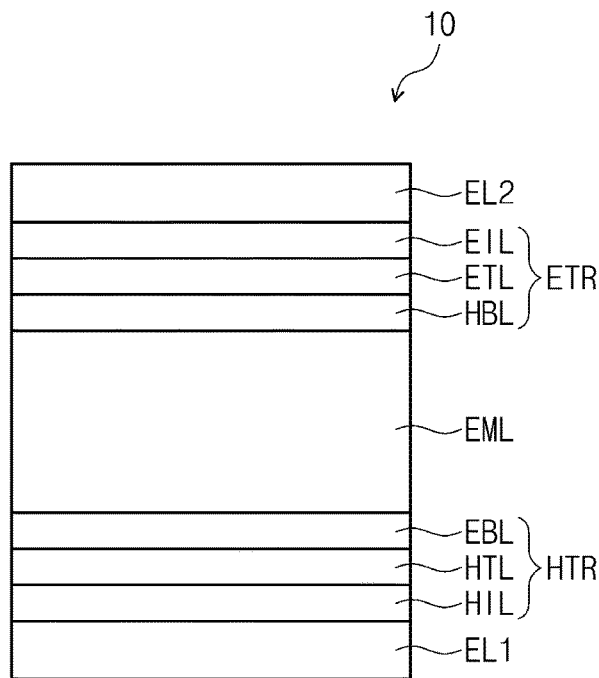
FIG. 3 is a cross-sectional view schematically illustrating an organic electroluminescence device according to an embodiment of the present disclosure.
Figure 4:
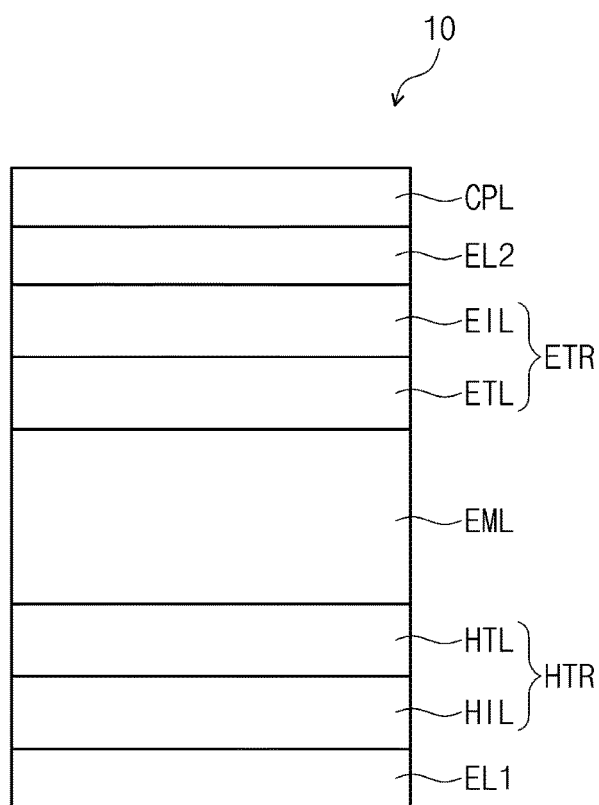
FIG. 4 is a cross-sectional view schematically illustrating an organic electroluminescence device according to an embodiment of the present disclosure.

In comparison to FIG. 1, FIG. 2 shows a cross-sectional view of an organic electroluminescence device 10 of an embodiment, in which the hole transport region HTR includes a hole injection layer HIL and a hole transport layer HTL, and the electron transport region ETR includes an electron injection layer EIL and an electron transport layer ETL. In comparison to FIG. 1, FIG. 3 shows a cross-sectional view of an embodiment of the organic electroluminescence device 10, wherein the hole transport region HTR includes a hole injection layer HIL, a hole transport layer HTL, and an electron blocking layer EBL, and the electron transport region ETR includes an electron injection layer EIL, an electron transport layer ETL, and a hole blocking layer HBL. In comparison to FIG. 2, FIG. 4 shows the cross-sectional view of an organic electroluminescence device 10 according to an embodiment, including a capping layer CPL disposed on the second electrode EL2.

The first electrode EL1 has conductivity. The first electrode EL1 may be formed using a metal alloy and/or a conductive compound. The first electrode EL1 may be an anode. In some embodiments, the first electrode EL1 may be a pixel electrode. The first electrode EL1 may be a transmissive electrode, a transflective electrode, or a reflective electrode. When the first electrode EL1 is a transmissive electrode, the first electrode EL1 may include a transparent metal oxide (such as indium tin oxide (ITO), indium zinc oxide (IZO), zinc oxide (ZnO), and/or indium tin zinc oxide (ITZO)). When the first electrode EL1 is a transflective electrode or a reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), a compound thereof, and/or a mixture thereof (for example, a mixture of Ag and Mg). In some embodiments, the first electrode EL1 may have a structure including a plurality of layers including a reflective layer or a transflective layer formed using the above materials, in addition to a transmissive conductive layer formed using ITO, IZO, ZnO, and/or ITZO. In some embodiments, for example, the first electrode EL1 may include a three layer structure of ITO/Ag/ITO. However, embodiments of the present disclosure are not limited thereto. The thickness of the first electrode EL1 may be about 1,000 Å to about 10,000 Å, for example, about 1,000 Å to about 3,000 Å.

The hole transport region HTR is provided on the first electrode EL1. The hole transport region HTR may include at least one selected from a hole injection layer HIL, a hole transport layer HTL, a hole buffer layer, and an electron blocking layer EBL. The thickness of the hole transport region HTR may be, for example, about 50 Å to about 1,500 Å.

The hole transport region HTR may be a single layer formed using a single material, a single layer formed using a plurality of different materials, or a multilayer structure including a plurality of layers formed using a plurality of different materials.

For example, the hole transport region HTR may have the structure of a single layer (such as a hole injection layer HIL, or a hole transport layer HTL), and in some embodiments, may have a structure of a single layer formed using a hole injection material and a hole transport material (e.g., simultaneously). In some embodiments, the hole transport region HTR may have a structure of a single layer formed using a plurality of different materials, or a structure including multiple layers, for example, of hole injection layer HIL/ hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/ electron blocking layer EBL, each being laminated on or from the first electrode EL1, without limitation.

The hole transport region HTR may be formed using any suitable method (such as a vacuum deposition method, a spin coating method, a cast method, a Langmuir-Blodgett (LB) method, an inkjet printing method, a laser printing method, and/or a laser induced thermal imaging (LITI) method).

The hole injection layer HIL may include, for example, a phthalocyanine compound (such as copper phthalocyanine); N,N'-diphenyl-N,N'-bis-[4-(phenyl-m-tolyl-amino)-phenyl]-biphenyl-4,4'-diamine (DNTPD), 4,4',4''-tris(3-methylphenylphenylamino)triphenylamine (m-MTDATA), 4,4', 4''-tris(N,N-diphenylamino)triphenylamine (TDATA), 4,4', 4''-tris{N,-(2-naphthyl)-N-phenylamino}triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyether ketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may further include, for example, carbazole derivatives (such as N-phenyl carbazole and/or polyvinyl carbazole), fluorene-based derivatives, N,N'-bis(3-methylphenyl)-N,N'-diphenyl-[1,1-biphenyl]-4, 4'-diamine (TPD), triphenylamine-based derivatives such as 4,4',4''-tris(N-carbazol-9-yl)triphenylamine (TCTA), N,N'-di(naphthalenyl)-N,N'-diphenyl-benzidine (NPB), 4,4'-cyclohexylidene bis[N,N-bis(4-methylphenyl)]benzenamine (TAPC), 4,4'-bis[N,N'-(3-tolyl)amino]-3,3'-dimethylbiphenyl (HMTPD), 1,3-bis(N-carbazolyl)benzene (mCP), etc.

The thickness of the hole transport region HTR may be about 50 Å to about 10,000 Å, for example, about 100 Å to about 5,000 Å. The thickness of the hole injection layer HIL may be, for example, about 30 Å to about 1,000 Å, and the thickness of the hole transport layer HTL may be about 10 Å to about 1,000 Å. For example, the thickness of the electron blocking layer EBL may be about 10 Å to about 1,000 Å. When the thicknesses of the hole transport region HTR, the hole injection layer HIL, the hole transport layer HTL, and the electron blocking layer EBL each satisfy the above-described ranges, satisfactory hole transport properties may be achieved without a substantial increase in driving voltage.

The hole transport region HTR may further include a charge generating material in addition to (e.g., simultaneously with) the above-described materials to improve conductivity. The charge generating material may be dispersed uniformly or non-uniformly in the hole transport region HTR. The charge generating material may be, for example, a p-dopant. The p-dopant may be selected from quinone derivatives, metal oxides, and cyano group-containing compounds, without limitation. Non-limiting examples of the p-dopant may include quinone derivatives (such as tetracyanoquinodimethane (TCNQ) and/or 2,3,5,6-tetrafluoro-7,7,8,8-tetracyanoquinodimethane (F4-TCNQ)), and metal oxides (such as tungsten oxide and/or molybdenum oxide), without limitation.

As described above, the hole transport region HTR may further include at least one of a hole buffer layer and an electron blocking layer EBL, in addition to the hole injection layer HIL and the hole transport layer HTL. The hole buffer layer may compensate for a resonance distance according to the wavelength of light emitted from the emission layer EML, and may thereby increase light emission efficiency. Materials included in the hole transport region HTR may be (e.g., may also be) used as materials included in the hole buffer layer. The electron blocking layer EBL may block or reduce electron injection from the electron transport region ETR to the hole transport region HTR.

The emission layer EML is provided on the hole transport region HTR. The emission layer EML may have a thickness of, for example, about 100 Å to about 1,000 Å or about 100 Å to about 500 Å. The emission layer EML may have a single layer formed using a single material, a single layer formed using a plurality of different materials, or a multilayer structure having a plurality of layers formed using a plurality of different materials.

In the organic electroluminescence device 10 of an embodiment, the emission layer EML may include the compound according to an embodiment.

In the description, the term "substituted or unsubstituted" refers to a formula structure that is unsubstituted, or substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring, an aryl group, and a heterocyclic group. In addition, each of the substituents may be further substituted or unsubstituted. For example, a biphenyl group may be interpreted as an aryl group, or as a phenyl group substituted with a phenyl group.

In the description, the term "forming a ring by combining adjacent groups with each other" may refer to forming a substituted or unsubstituted hydrocarbon ring or a substituted or unsubstituted heterocycle by combining adjacent groups with each other. The hydrocarbon ring may include an aliphatic hydrocarbon ring and an aromatic hydrocarbon ring. The heterocycle may include an aliphatic heterocycle and aromatic heterocycle. The ring formed by combining adjacent groups with each other may be a monocycle or polycycle. In addition, the ring formed by combining adjacent groups may be connected with another ring to form a spiro structure.

In the description, the term "an adjacent group" may refer to a substituent group at an atom that is directly connected with a second atom having a corresponding substituent, a substituent group at an (e.g., the same) atom having a corresponding substituent, or a substituent group stereoscopically disposed (stereochemically positioned) at the nearest position (e.g., within a distance associated with bonding or another intramolecular contact) to a corresponding substituent. For example, two methyl groups in 1,2-dimethylbenzene may be interpreted as "adjacent groups", and two ethyl groups in 1,2-diethylcyclopentene may be interpreted as "adjacent groups".

In the description, non-limiting examples of the halogen atom include a fluorine atom, a chlorine atom, a bromine atom or an iodine atom.

In the description, the term "alkyl group" may refer to a linear, branched or cyclic alkyl. The carbon number of the alkyl may be 1 to 50, 1 to 30, 1 to 20, 1 to 10, or 1 to 6. Non-limiting examples of the alkyl include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc.

In the description, the term "alkenyl group" may refer to a hydrocarbon group including one or more carbon-carbon double bonds in the middle of or at the terminal end of an alkyl group of 2 or more carbon atoms. The alkenyl group may be a linear chain or a branched chain. The carbon number is not specifically limited, and for example, may be 2 to 30, 2 to 20, or 2 to 10. Non-limiting examples of the alkenyl group may include a vinyl group, a 1-butenyl group, a 1-pentenyl group, a 1,3-butadienyl aryl group, a styrenyl group, a styrylvinyl group, etc.

In the description, the term "alkynyl group" may refer to a hydrocarbon group including one or more carbon-carbon triple bonds in the middle of or at the terminal end of an alkyl group of 2 or more carbon atoms. The alkynyl group may be a linear chain or a branched chain. The carbon number is not specifically limited, but may be 2 to 30, 2 to 20, or 2 to 10. Non-limiting examples of the alkynyl group include an ethynyl group, a propynyl group, etc.

In the description, the term "hydrocarbon ring" may refer to an optional functional group or substituent derived from an aliphatic hydrocarbon ring, or an optional functional group or substituent derived from an aromatic hydrocarbon ring. The carbon number of the hydrocarbon ring to form the ring may be 5 to 60, 5 to 30, or 5 to 20.

In the description, the term "aryl group" refers to an optional functional group or substituent derived from an aromatic hydrocarbon ring. The aryl group may be a monocyclic aryl group or a polycyclic aryl group. The carbon number to form a ring in the aryl group may be 6 to 30, 6 to 20, or 6 to 15. Non-limiting examples of the aryl group include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc.

In the description, the term "heterocycle" refers to an optional functional group or substituent derived from a ring including one or more heteroatoms selected from boron (B), oxygen (O), nitrogen (N), phosphorus (P), silicon (Si) and sulfur (S). The heterocycle may be an aliphatic heterocycle or an aromatic heterocycle. The aromatic heterocycle may be a heteroaryl group. The aliphatic heterocycle and the aromatic heterocycle may each be monocyclic or polycyclic.

In the description, the heterocycle may include one or more heteroatoms selected from B, O, N, P, Si and S. In case where the heterocycle includes two or more heteroatoms, the two or more heteroatoms may be the same or different. The heterocycle may be a monocyclic heterocycle or a polycyclic heterocycle, and may have a concept including a heteroaryl group. The carbon number to form a ring of the heterocycle may be 2 to 30, 2 to 20, or 2 to 10.

In the description, the aliphatic heterocycle may include one or more heteroatoms selected from B, O, N, P, Si and S. The carbon number to form a ring of the aliphatic heterocycle may be 2 to 30, 2 to 20, or 2 to 10. Non-limiting examples of the aliphatic heterocycle include an oxirane group, a thiirane group, a pyrrolidine group, a piperidine group, a tetrahydrofuran group, a tetrahydrothiophene group, a thiane group, a tetrahydropyrane group, a 1,4-dioxane group, etc.

In the description, the heteroaryl group may include one or more selected from B, O, N, P, Si and S as heteroatoms. If the heteroaryl group includes two or more heteroatoms, the two or more heteroatoms may be the same or different. The heteroaryl group may be a monocyclic heterocycle or a polycyclic heterocycle. The carbon number to form a ring of the heteroaryl may be 2 to 30, 2 to 20, or 2 to 10. Non-limiting examples of the heteroaryl group may include thiophenyl, furanyl, pyrrolyl, imidazolyl, thiazolyl, oxazolyl, oxadiazolyl, triazolyl, pyridinyl, bipyridinyl, pyrimidinyl, triazinyl, acridyl, pyridazinyl, pyrazinyl, quinolinyl, quinazolinyl, quinoxalinyl, phenoxazinyl, phthalazinyl, pyrido pyrimidinyl, pyrido pyrazinyl, pyrazino pyrazinyl, isoquinolinyl, indolyl, carbazolyl, N-arylcarbazolyl, N-heteroarylcarbazolyl, N-alkylcarbazolyl, benzoxazolyl, benzimidazolyl, benzothiazolyl, benzocarbazolyl, benzothiophenyl, dibenzothiophenyl, thienothiophenyl, benzofuranyl, phenanthrolinyl, isooxazolyl, thiadiazolyl, phenothiazinyl, dibenzosilolyl, dibenzofuranyl, etc.

In the present description, the description of the aryl group may be the same as the description of the arylene group, except that the arylene group is divalent. The description of the heteroaryl group may be the same as the description of the heteroarylene group, except that the heteroarylene group is divalent.

In the description, the silyl group includes an alkylsilyl group and an arylsilyl group. Non-limiting examples of the silyl group include trimethylsilyl, triethylsilyl, t-butyldimethylsilyl, vinyldimethylsilyl, propyldimethylsilyl, triphenylsilyl, diphenylsilyl, phenylsilyl, etc. However, an embodiment of the present disclosure is not limited thereto.

In the description, the boryl group includes an alkyl boryl group and an aryl boryl group. Non-limiting examples of the boryl group include a trimethylboryl group, a triethylboryl group, a t-butyldimethylboryl group, a triphenylboryl group, a diphenylboryl group, a phenylboryl group, etc.

In the description, the carbon number of the amino group is not specifically limited, but may be 1 to 30. The amino group may include an alkyl amino group, an aryl amino group, or a heteroaryl amino group. Non-limiting examples of the amino group include a methylamino group, a dimethylamino group, a phenylamino group, a diphenylamino group, a naphthylamino group, a 9-methyl-anthracenylamino group, a triphenylamino group, etc.

In the description, the carbon number of the carbonyl group is not specifically limited, and for example, may be 1 to 40, 1 to 30, or 1 to 20. For example, the carbonyl group may having the following structures, without limitation:

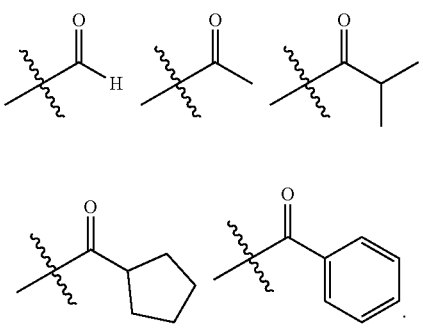

In the description, the carbon number of the sulfinyl group and the sulfonyl group is not specifically limited, and for example, may be 1 to 30. The sulfinyl group may include an alkyl sulfinyl group and an aryl sulfinyl group. The sulfonyl group may include an aryl sulfonyl group.

In the description, the thio group may be an alkyl thio group or an aryl thio group.

In the description, the oxy group may be an alkoxy group or an aryloxy group. The alkoxy group may be a linear chain, a branched chain, or a cyclic chain. The number of the carbon atom of the alkoxy group is not specifically limited, and may be, for example, 1 to 20 or 1 to 10. Non-limiting examples of the oxy group include methoxy, ethoxy, n-propoxy, isopropoxy, butoxy, pentyloxy, hexyloxy, octyloxy, nonyloxy, decyloxy, benzyloxy, etc.

In the description, the alkyl group in the alkyl thio group, the alkyl sulfoxy group, the alkyl aryl group, the alkyl amino group, the alkyl boron group and the alkyl silyl group may be the same as the alkyl group described above, including its examples.

In the description, the aryl group in the aryl oxy group, the aryl thio group, the aryl sulfoxy group, the aryl amino group, the aryl boron group, and the aryl silyl group may be the same as aryl group described above, including its examples.

In the description, the direct linkage may mean a single bond.

Meanwhile, in the description,

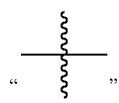

or "—*" refers to a connected position.

An emission layer EML of an organic electroluminescence device 10 of an embodiment may include a compound represented by Formula 1:

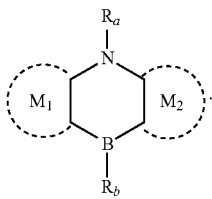

[Formula 1]

In Formula 1, $M_1$ and $M_2$ may be each independently a substituted or unsubstituted hydrocarbon ring of 5 to 30 carbon atoms to form a ring, or a substituted or unsubstituted heterocycle of 2 to 30 carbon atoms to form a ring.

In Formula 1, $R_a$ may be a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted silyl group, a substituted or unsubstituted carbonyl group, a substituted or unsubstituted oxy group, a substituted or unsubstituted thio group, a substituted or unsubstituted boryl group, a substituted or unsubstituted phosphinyl group, a substituted or unsubstituted phosphineoxy group, a substituted or unsubstituted phosphine sulfide group, a substituted or unsubstituted sulfonyl group, or a substituted or unsubstituted sulfinyl group.

In addition, $R_b$ may be a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted oxy group, a substituted or unsubstituted thio group, or a substituted or unsubstituted amino group.

$R_a$ and $R_b$ may be selectively combined with $M_1$ or $M_2$ to form a ring. For example, $R_a$ and $R_b$ may be selectively combined with $M_1$ or $M_2$ to form a fused ring.

In Formula 1, any one among substituents of $M_1$ and $M_2$ is a polycyclic hetero group represented by Formula 2 (e.g., $M_1$ and $M_2$ are substituted once or at least once by a polycyclic hetero group represented by Formula 2):

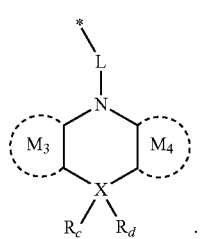

[Formula 2]

In Formula 2, X is Si or Ge. In addition, in Formula 2, $M_3$ and $M_4$ may each independently be a substituted or unsubstituted hydrocarbon ring of 5 to 30 carbon atoms to form a ring, or a substituted or unsubstituted heterocycle of 2 to 30 carbon atoms to form a ring.

L may be a direct linkage, a substituted or unsubstituted arylene group of 6 to 30 carbon atoms to form a ring, or a substituted or unsubstituted heteroarylene group of 2 to 30 carbon atoms to form a ring.

$R_c$ and $R_d$ may each independently be a substituted or unsubstituted alkyl group of 3 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted oxy group, a substituted or unsubstituted thio group, or a substituted or unsubstituted amino group. In some embodiments, $R_c$ and $R_d$ may be combined with each other to form a substituted or unsubstituted hydrocarbon ring of 5 to 30 carbon atoms, or a substituted or unsubstituted heterocycle of 2 to 30 carbon atoms.

For example, in the polycyclic hetero group represented by Formula 2, $R_c$ and $R_d$ may be an isopropyl group (iPr-*), or a phenyl group (Ph-*,

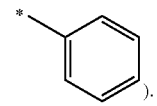

).

In some embodiments, $R_c$ and $R_d$ may be combined with each other to form a heterocycle with Si as a ring-forming atom.

The compound of an embodiment may include a core part represented by Formula 1 including an azaborine moiety, and an azasiline group or azagermine group represented by Formula 2 as a substituent of the core part as a polycyclic hetero group. The compound of an embodiment may show excellent life characteristics and improved efficiency properties when compared with a case of including only an azaborine moiety by including a polycyclic hetero group having a heavy atom, as a substituent, or a case of being substituted with a substituent not including a heavy atom.

For example, in the compound of an embodiment, represented by Formula 1, $M_1$ and $M_2$ may each independently be a substituted or unsubstituted benzene ring, a substituted or unsubstituted naphthalene ring, a substituted or unsubstituted phenanthrene ring, a substituted or unsubstituted fluorene ring, a substituted or unsubstituted benzothiophene ring, a substituted or unsubstituted dibenzothiophene ring, a substituted or unsubstituted benzofuran ring, a substituted or unsubstituted dibenzofuran ring, a substituted or unsubstituted carbazole ring, a substituted or unsubstituted pyridine ring. However, embodiments of the present disclosure are not limited thereto.

For example, in Formula 2, $M_3$ and $M_4$ may be each independently a substituted or unsubstituted benzene ring, a substituted or unsubstituted naphthalene ring, a substituted or unsubstituted phenanthrene ring, a substituted or unsubstituted fluorene ring, a substituted or unsubstituted benzothiophene ring, a substituted or unsubstituted dibenzothiophene ring, a substituted or unsubstituted benzofuran ring, a substituted or unsubstituted dibenzofuran ring, a substituted or unsubstituted carbazole ring, or a substituted or unsubstituted pyridine ring. However, embodiments of the present disclosure are not limited thereto.

Formula 1 may be represented by Formula 1-1 or Formula 1-2:

[Formula 1-1]

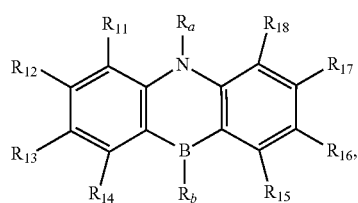

[Formula 1-2]

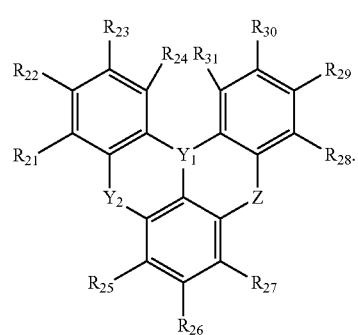

In Formula 1-1, $R_{11}$ to $R_{18}$ may each independently be a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted amino group, a substituted or unsubstituted silyl group, a substituted or unsubstituted carbonyl group, a substituted or unsubstituted oxy group, or a substituted or unsubstituted thio group, or may be combined with an adjacent group to form a fused ring.

In Formula 1-1, any one of $R_{11}$ to $R_{18}$, or a substituent of any fused ring formed by the combination of $R_{11}$ to $R_{18}$ with an adjacent group may be a polycyclic hetero group represented by Formula 2.

In Formula 1-1, $R_a$ and $R_b$ may be the same as in Formula 1.

In Formula 1-2, $Y_1$ may be B and $Y_2$ may be $NR_a$, or $Y_1$ may be N and $Y_2$ may be $BR_b$.

In Formula 1-2, Z may be a direct linkage, O, S, C=O, $BR_e$, $NR_f$, $CR_gR_h$, $SiR_iR_j$, $GeR_kR_l$, $POR_m$, $PSR_n$, SO, or $SO_2$.

$R_e$ to $R_n$ may each independently be a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, or a substituted or unsubstituted heteroaryl group of 2 to 30 carbon atoms to form a ring.

In Formula 1-2, $R_{21}$ to $R_{31}$ may each independently be a substituent of a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted amino group, a substituted or unsubstituted silyl group, a substituted or unsubstituted carbonyl group, a substituted or unsubstituted oxy group, or a substituted or unsubstituted thio group, or may be combined with an adjacent group to form a fused ring.

Any one of $R_{21}$ to $R_{31}$, or a substituent of a fused ring formed by the combination of $R_{21}$ to $R_{31}$ with an adjacent group may be a polycyclic hetero group represented by Formula 2.

Formula 2 may be represented by Formula 2-1 or Formula 2-2:

[Formula 2-1]

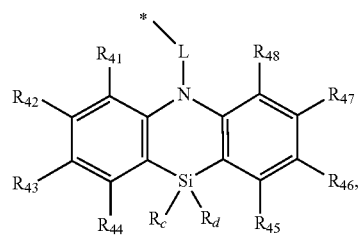

[Formula 2-2]

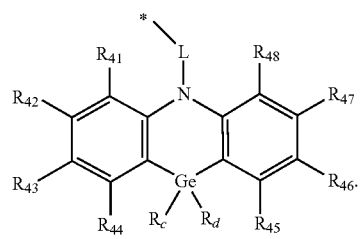

In Formula 2-1 and Formula 2-2, $R_{41}$ to $R_{48}$ may each independently be a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted amino group, a substituted or unsubstituted silyl group, a substituted or unsubstituted carbonyl group, a substituted or unsubstituted oxy group, or a substituted or unsubstituted thio group.

In Formula 2-1 and Formula 2-2, L, $R_c$, and $R_d$ may be the same as defined in Formula 2.

For example, $R_{41}$ to $R_{48}$ may each independently be a hydrogen atom, an alkyl group, or a substituted or unsubstituted phenyl group. L may be a direct linkage, or a substituted or unsubstituted phenylene group.

In the compound of an embodiment represented by Formula 1-1, seven of $R_{11}$ to $R_{18}$ may be hydrogen atoms, and any one of $R_{11}$ to $R_{18}$ may be the polycyclic hetero group represented by Formula 2 above. In addition, in Formula 1-1, two adjacent substituents selected from $R_{11}$ to $R_{18}$ may be combined with each other to form a fused ring, and the fused ring may be substituted with the polycyclic hetero group represented by Formula 2 above.

Formula 1-1 may be represented by Formula 1-1A or Formula 1-1B:

[Formula 1-1A]

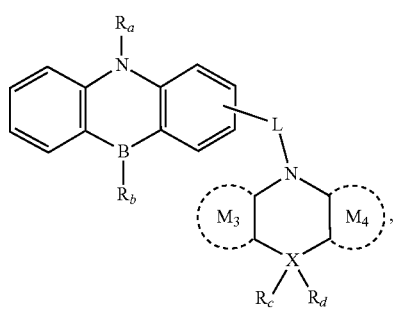

[Formula 1-1B]

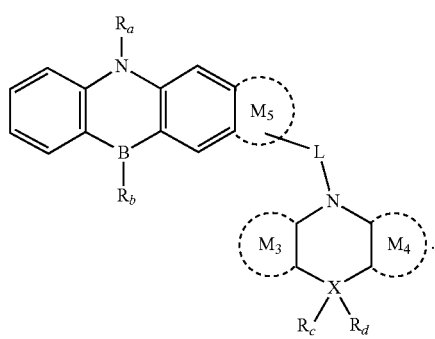

In Formula 1-1A and Formula 1-1B, $R_a$ and $R_b$ may be the same as described in Formula 1. In addition, in Formula 1-1A and Formula 1-1B, $M_3$, $M_4$, X, $R_c$, and $R_d$ may be the same as described in Formula 2.

In Formula 1-1B, $M_5$ may be a substituted or unsubstituted hydrocarbon ring of 5 to 30 carbon atoms, or a substituted or unsubstituted heterocycle of 2 to 30 carbon atoms.

For example, in Formula 1-1B, $M_5$ may be a substituted or unsubstituted benzene ring, a substituted or unsubstituted naphthalene ring, a substituted or unsubstituted phenanthrene ring, a substituted or unsubstituted fluorene ring, a substituted or unsubstituted benzothiophene ring, a substituted or unsubstituted dibenzothiophene ring, a substituted or unsubstituted benzofuran ring, a substituted or unsubstituted dibenzofuran ring, a substituted or unsubstituted carbazole ring, or a substituted or unsubstituted pyridine ring. However, embodiments of the present disclosure are not limited thereto.

The compound of an embodiment represented by Formula 1-2 may be represented by any one selected from Formulae 1-2A to 1-2C:

[Formula 1-2A]

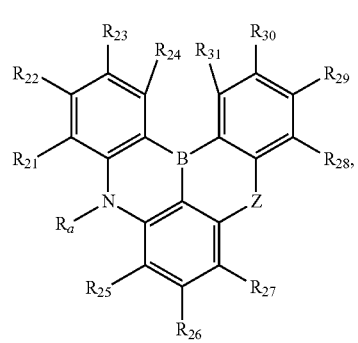

[Formula 1-2B]

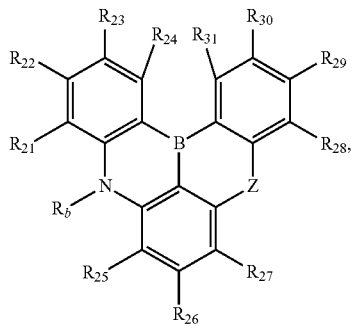

[Formula 1-2C]

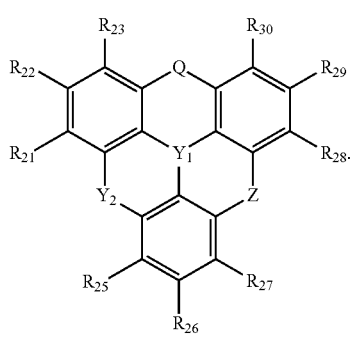

In Formula 1-2A to Formula 1-2C, $Y_1$, $Y_2$, Z, and $R_{21}$ to $R_{31}$ may be the same as described in Formula 1-2.

In Formula 1-2C, Q may be a direct linkage, O, S, C=O, $BR_g$, or $NR_h$. In addition, $R_g$ and $R_h$ may each independently be a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, or a substituted or unsubstituted heteroaryl group of 2 to 30 carbon atoms to form a ring.

Formula 1-2 may be represented by any one selected from Formula 1-2D to Formula 1-2F:

[Formula 1-2D]

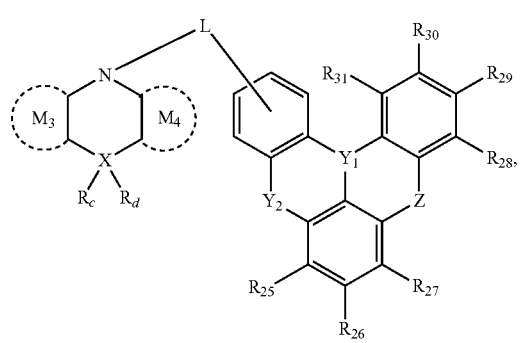

21
-continued

[Formula 1-2E]

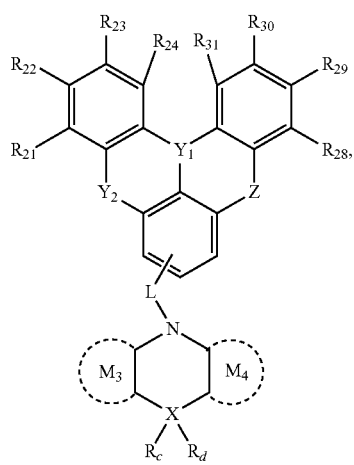

[Formula 1-2F]

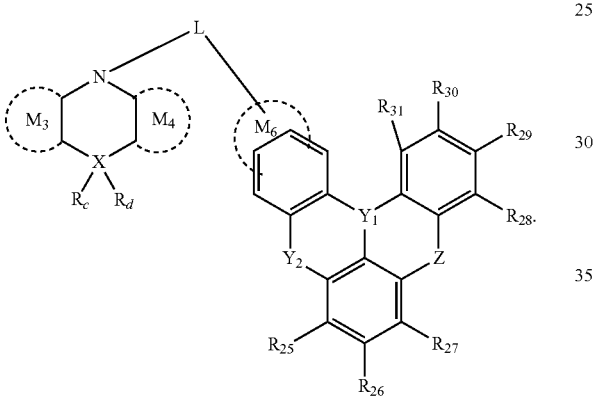

In Formula 1-2F, $M_6$ may be a substituted or unsubstituted hydrocarbon ring of 5 to 30 carbon atoms, or a substituted or unsubstituted heterocycle of 2 to 30 carbon atoms.

For example, in Formula 1-2F, $M_6$ may be a substituted or unsubstituted benzene ring, a substituted or unsubstituted naphthalene ring, a substituted or unsubstituted phenanthrene ring, a substituted or unsubstituted fluorene ring, a substituted or unsubstituted benzothiophene ring, a substituted or unsubstituted dibenzothiophene ring, a substituted or unsubstituted benzofuran ring, a substituted or unsubstituted dibenzofuran ring, a substituted or unsubstituted carbazole ring, or a substituted or unsubstituted pyridine ring. However, embodiments of the present disclosure are not limited thereto.

In Formula 1-2D to Formula 1-2F, $R_{21}$ to $R_{31}$, $Y_1$, $Y_2$, and Z may be the same as described in Formula 1-2. In addition, in Formula 1-2D to Formula 1-2F, X, L, $M_3$, $M_4$, $R_c$, and $R_d$ may be the same as described in Formula 2.

The compound of an embodiment may be any one selected from the compounds represented in Compound Group 1. The organic electroluminescence device 10 of an embodiment may include at least one compound among the compounds represented in Compound Group 1 in an emission layer EML.

22

In Compound Group 1, $^i$Pr represents an isopropyl group, and Ph represents a phenyl group:

[Compound Group 1]

1

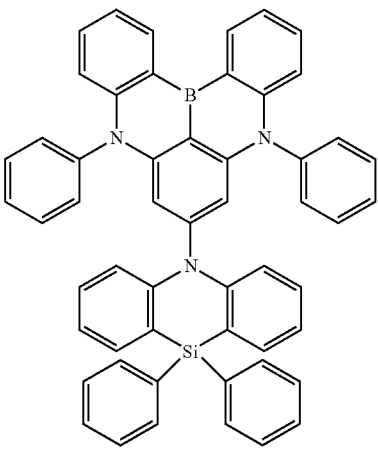

2

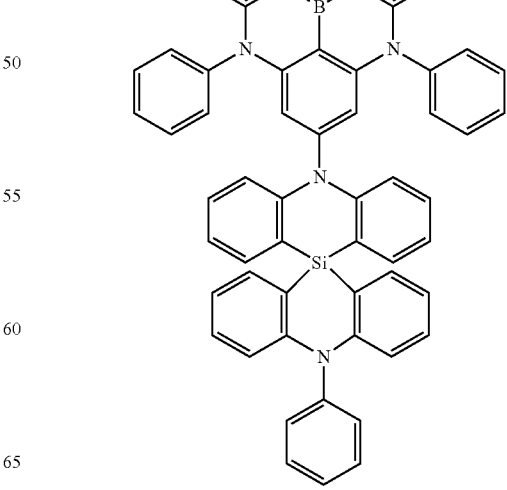

3

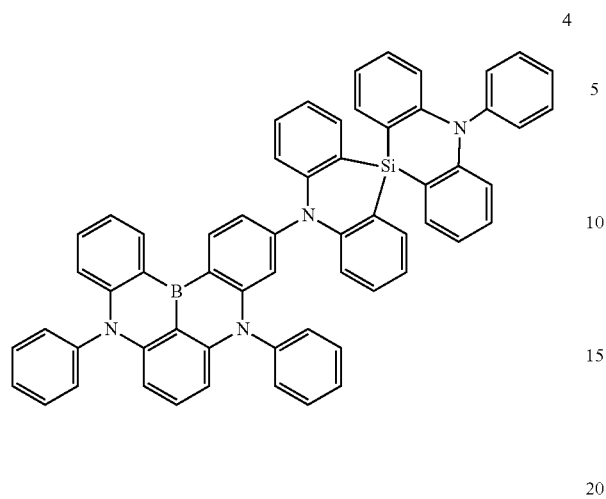
4
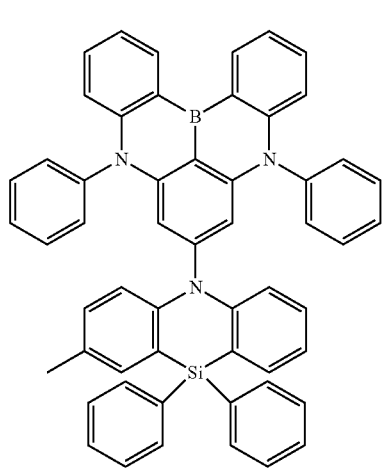
7
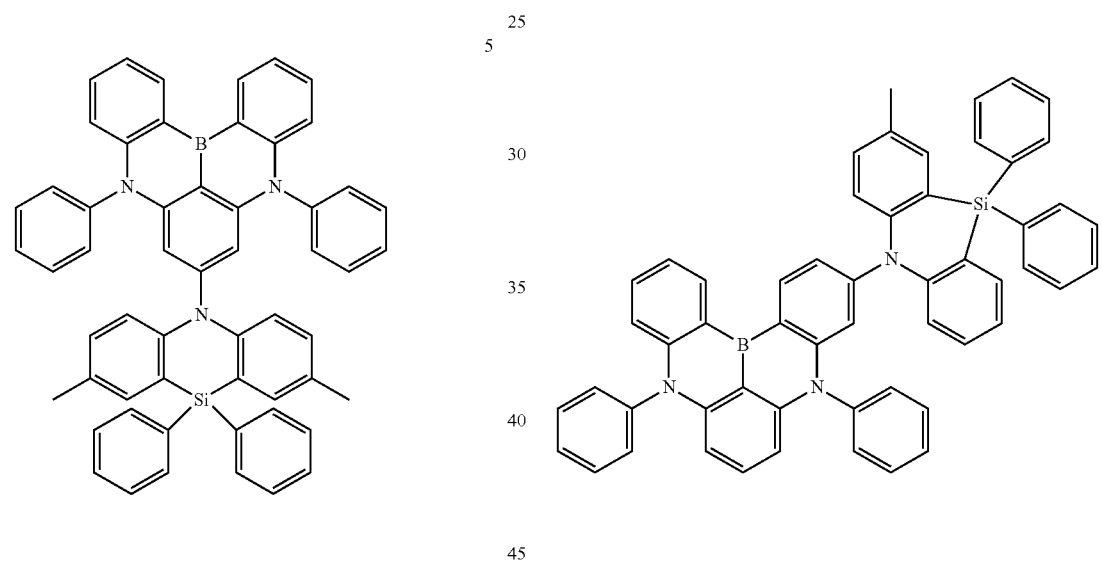
5
8
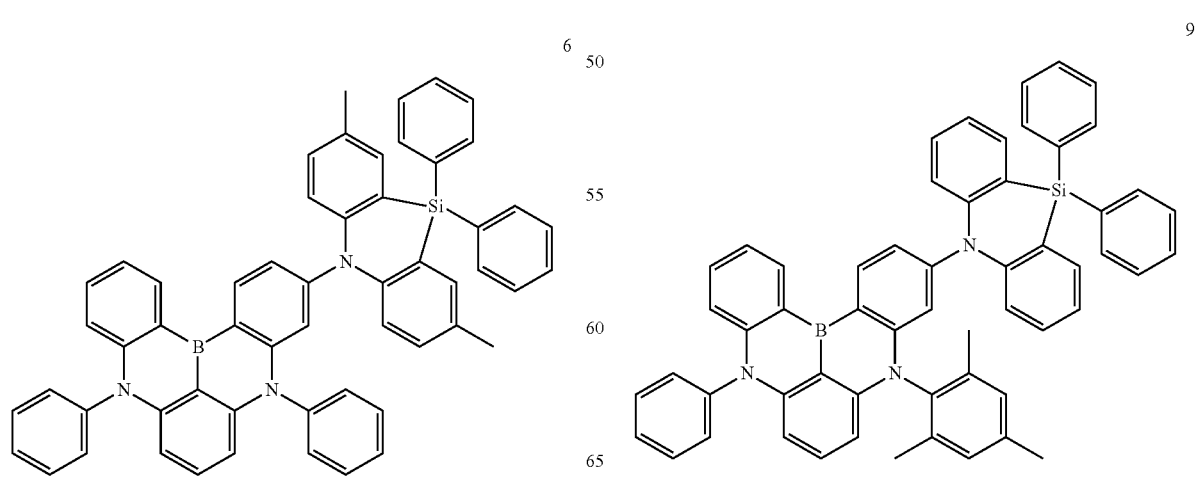
6
9

10
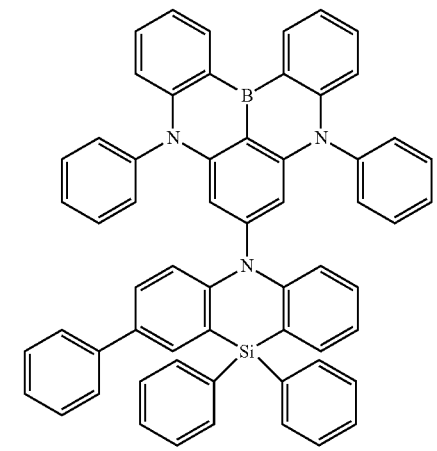
11
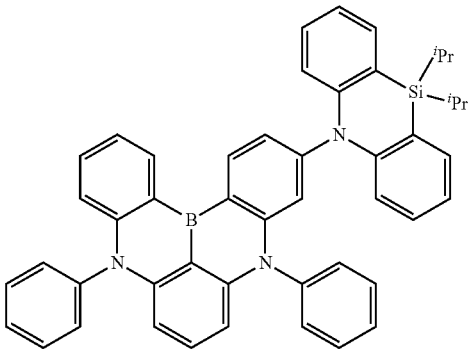
12
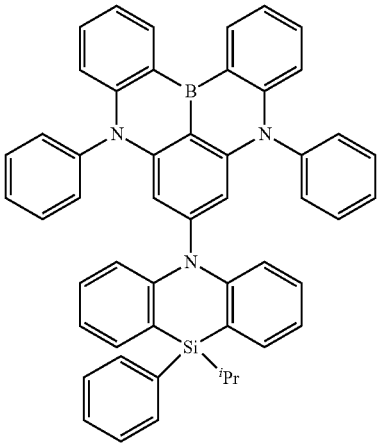
13
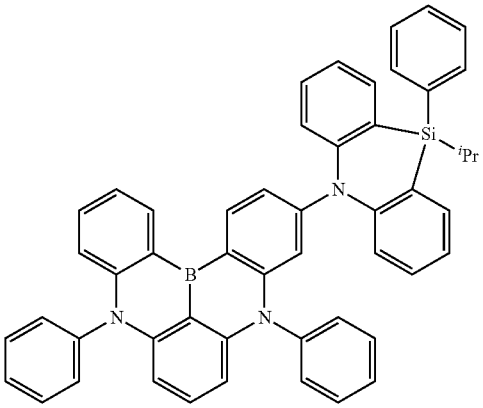
14
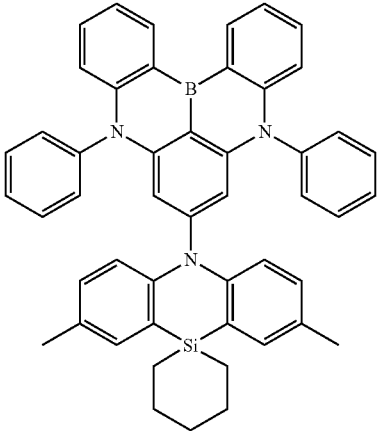
15
16

17
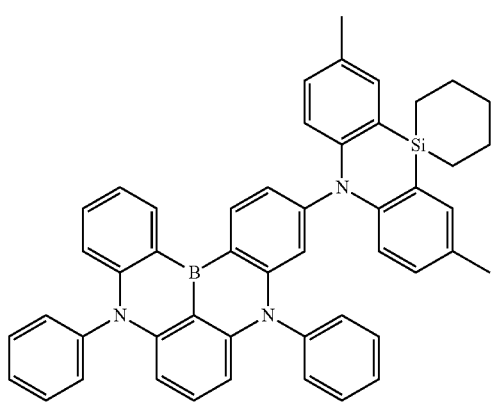
18
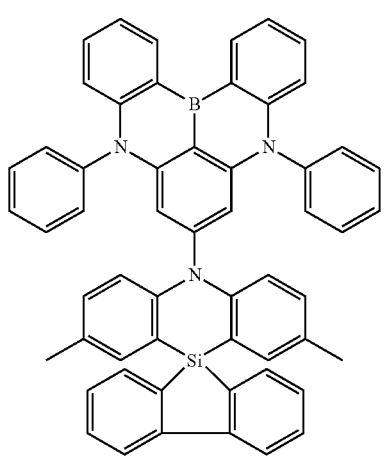
19
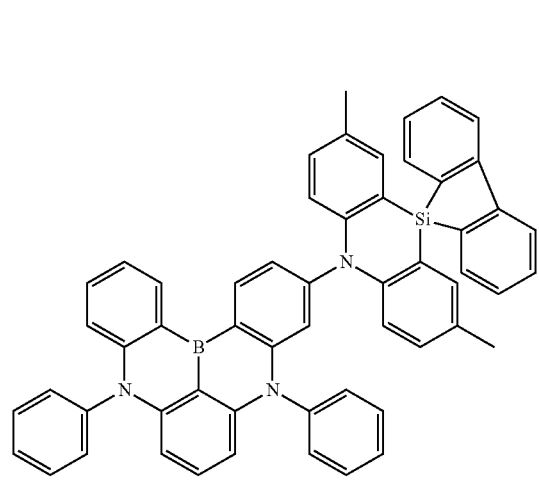
20
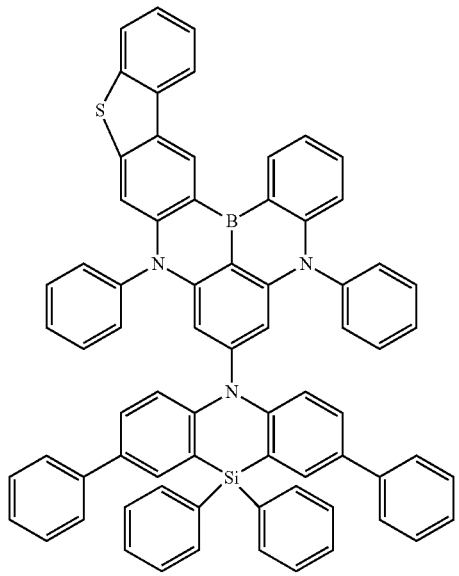
21
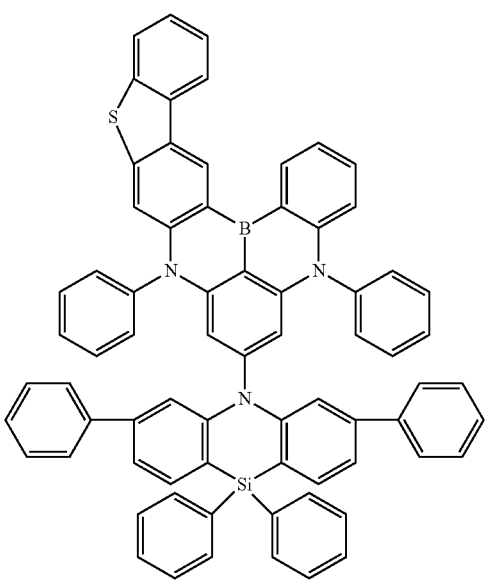
22
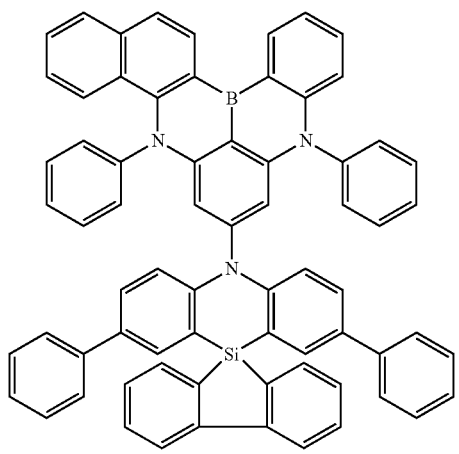

23
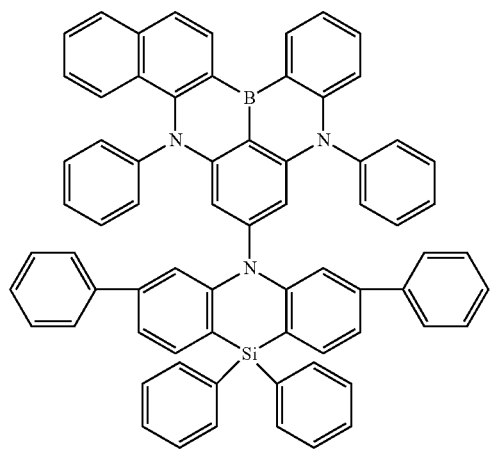
26
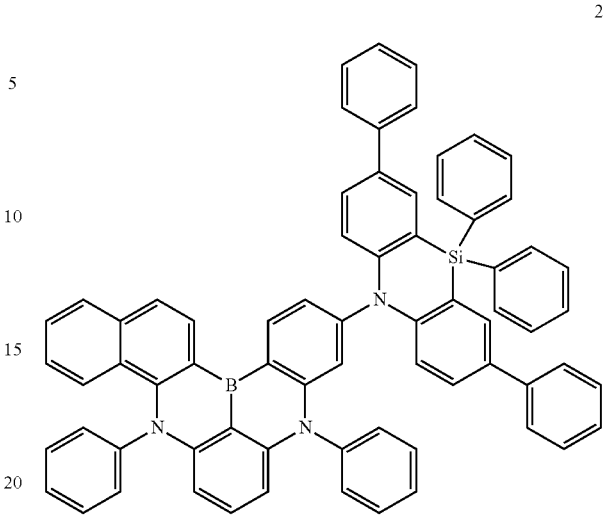
24
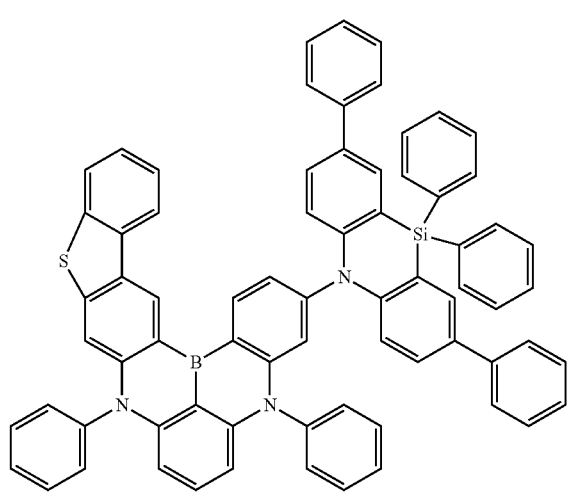
27
25
28
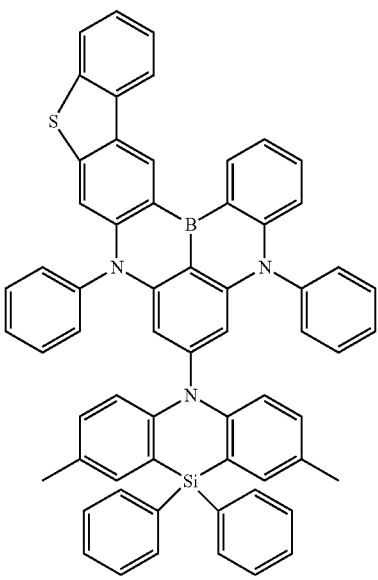

29
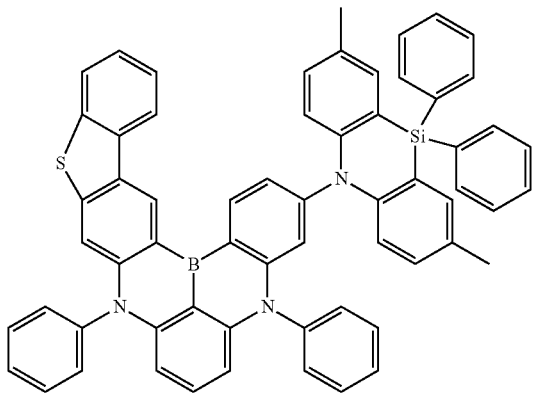
30
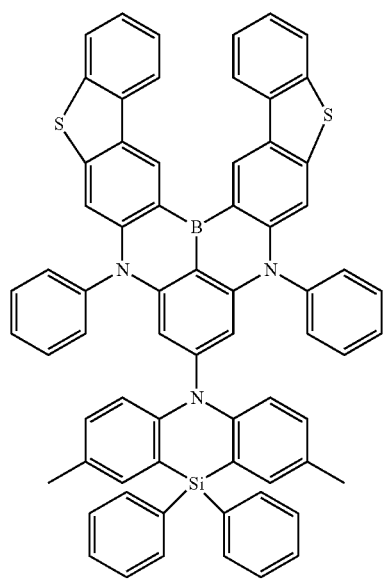
31
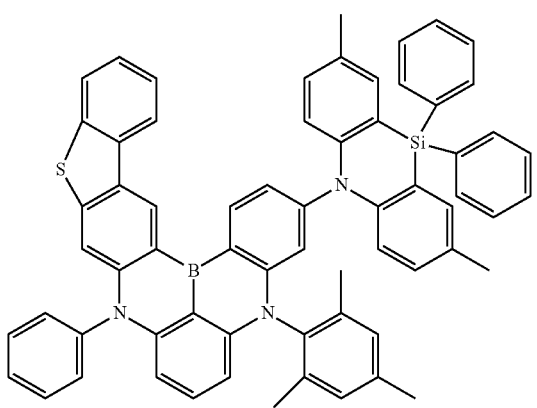
32
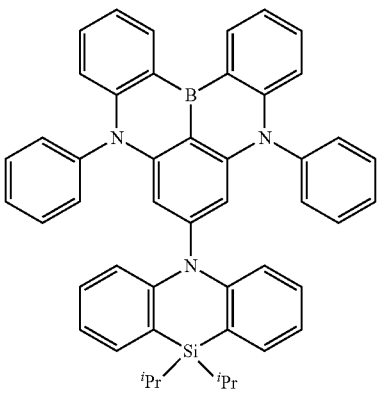
33
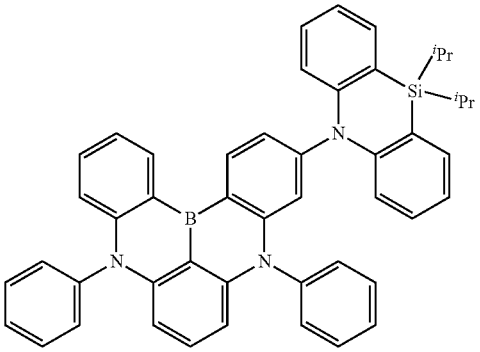
34
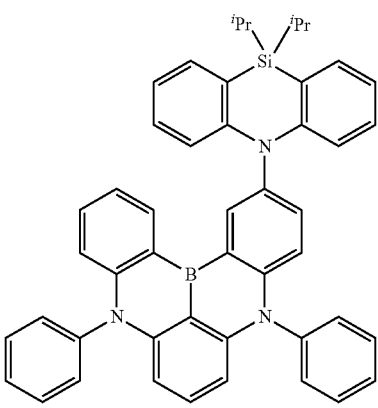
35
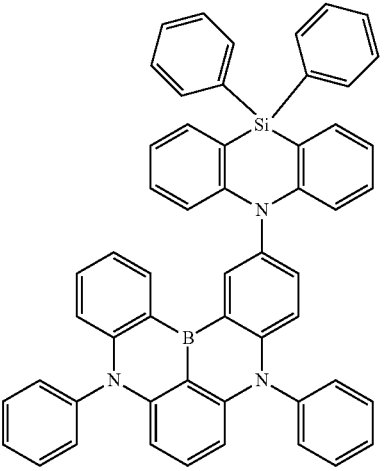

-continued
36
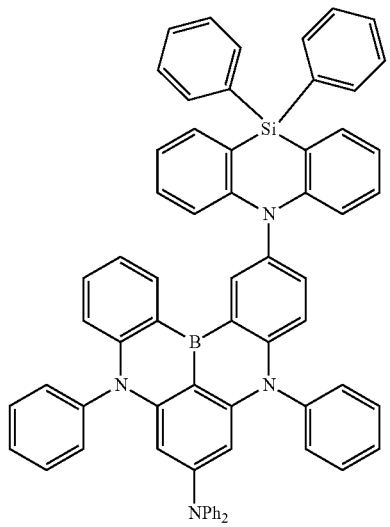
37
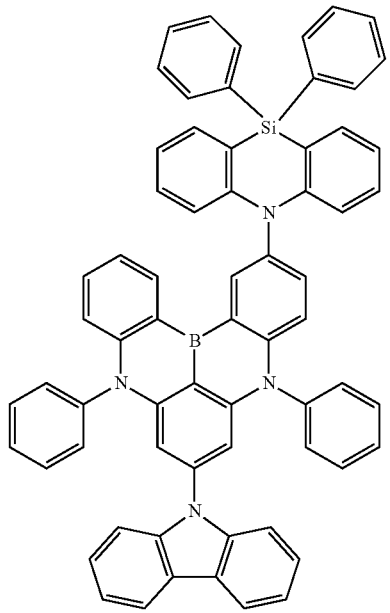
38
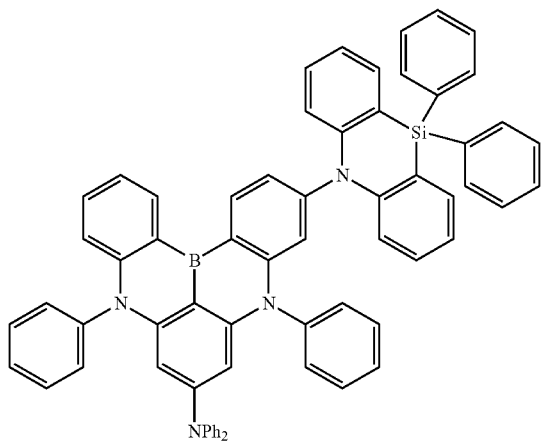
-continued
39
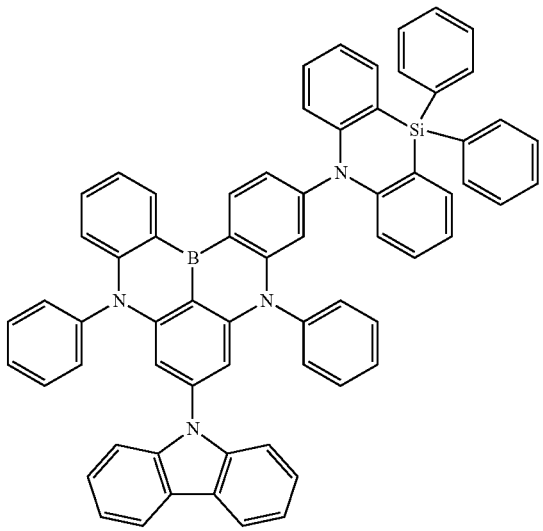
40
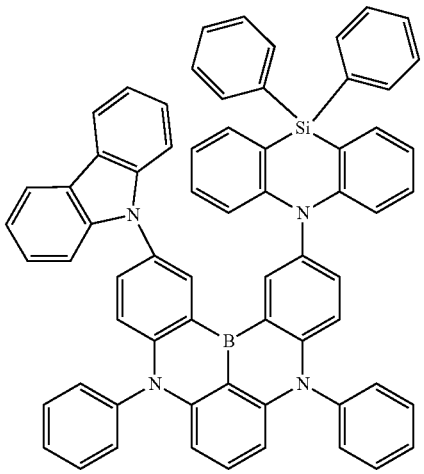
41
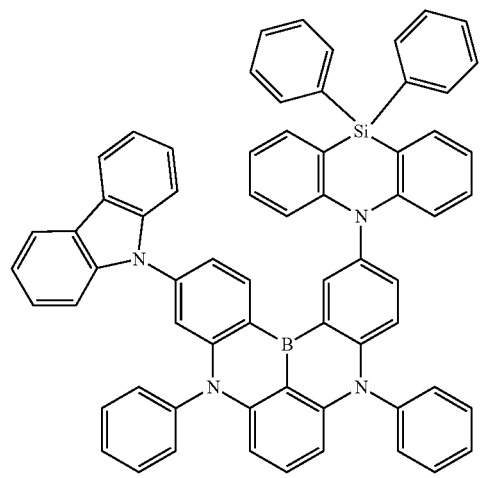

-continued
42
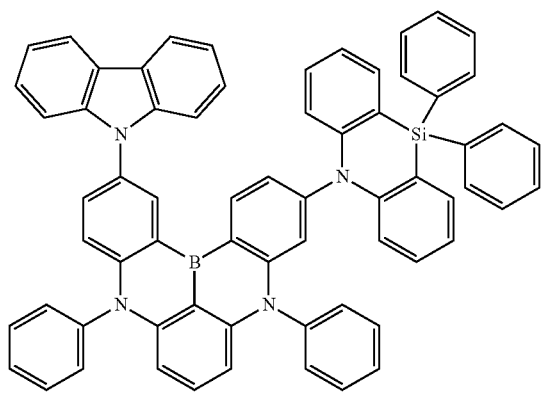
43
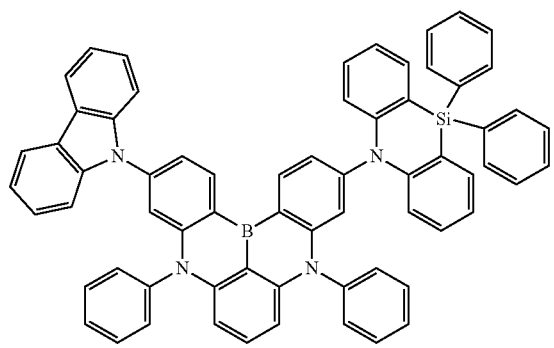
44
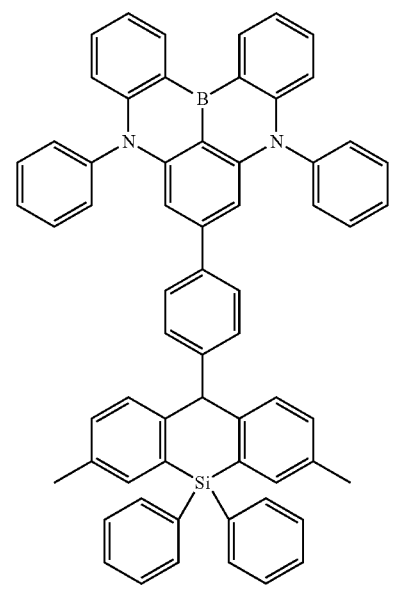
-continued
45
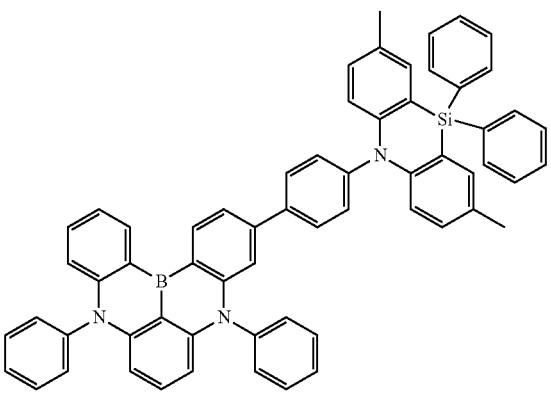
46
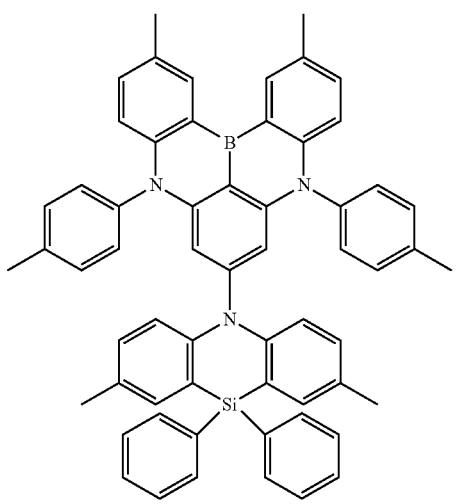
47

-continued
48
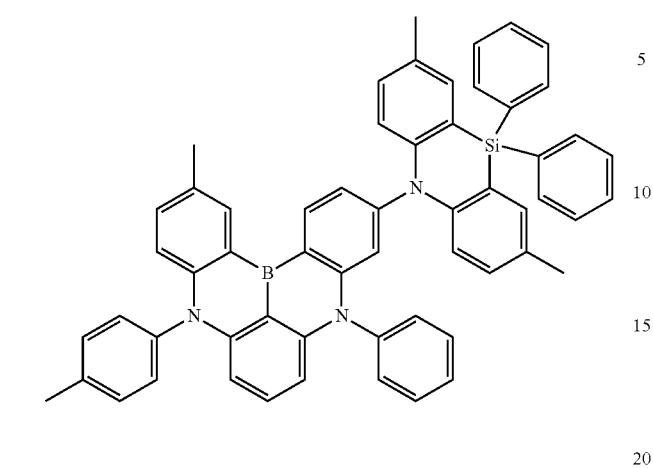
49
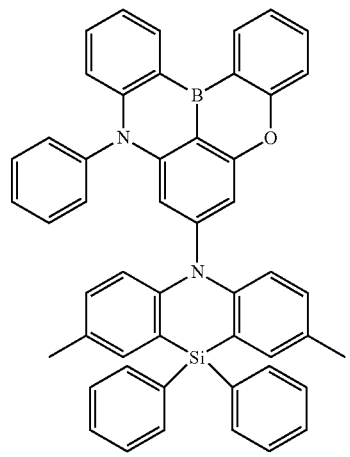
50
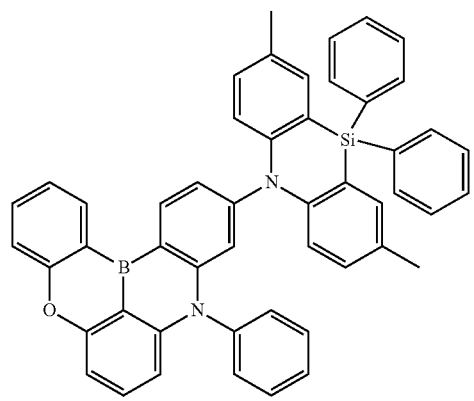
-continued
51
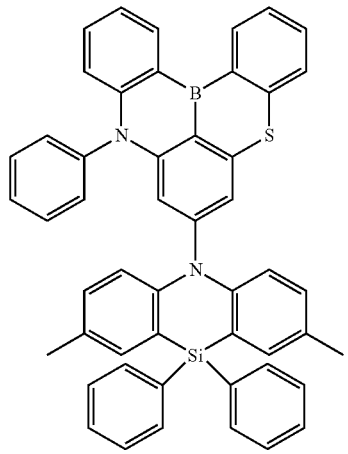
52
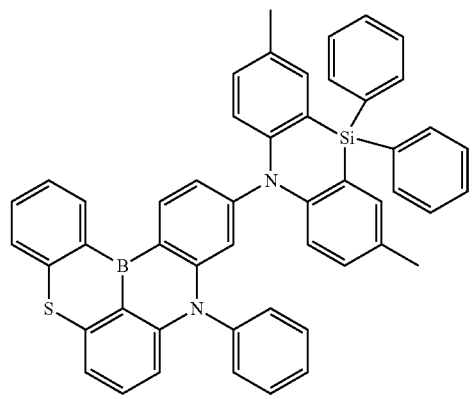
53
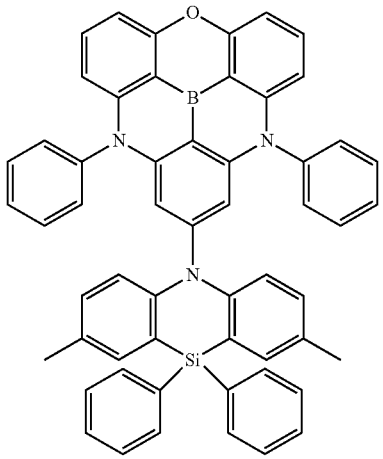

54
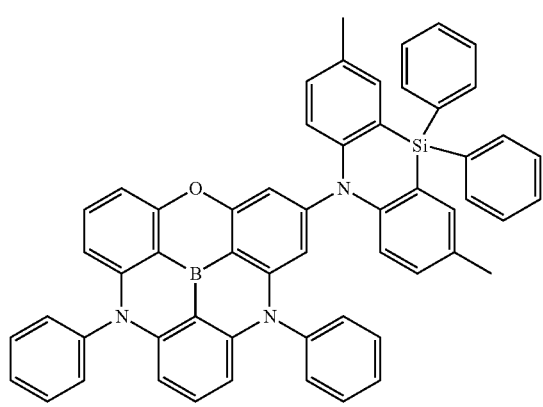
55
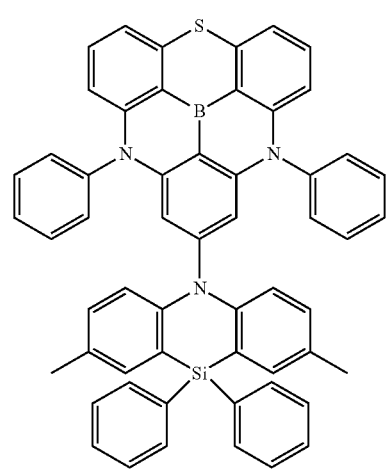
56
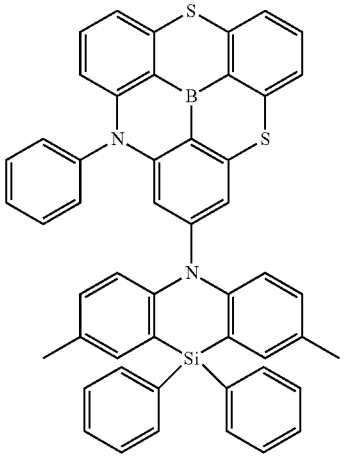
57
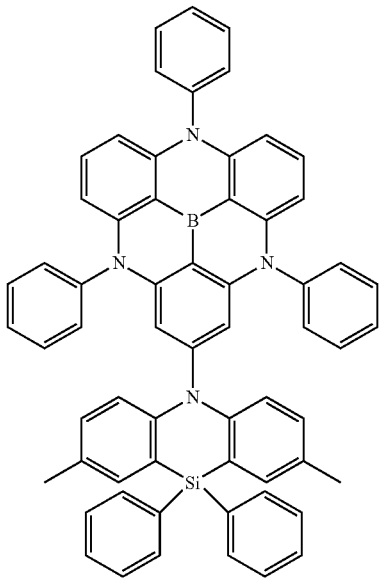
58
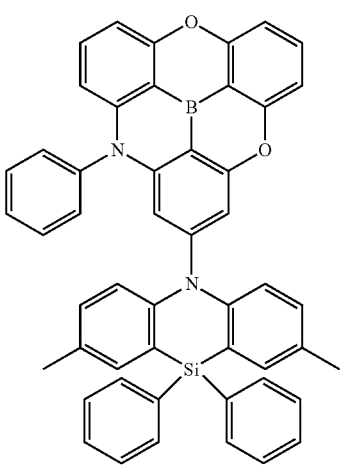
59
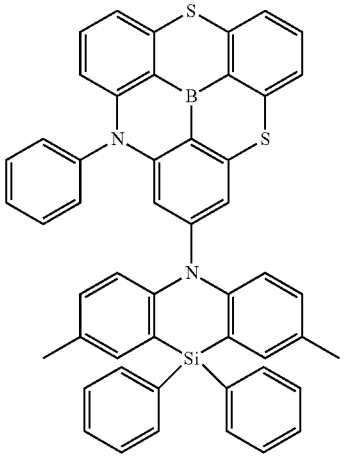

41
-continued
60
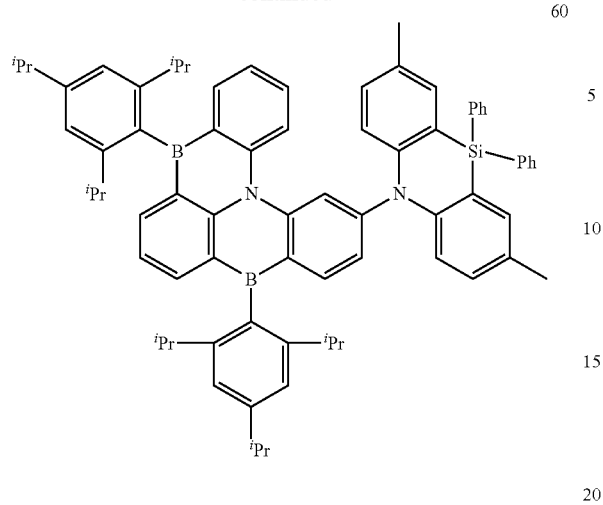
61
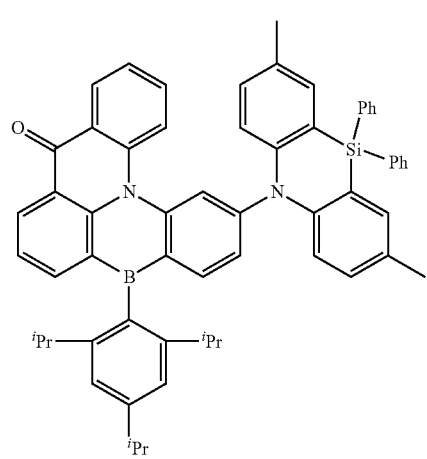
62
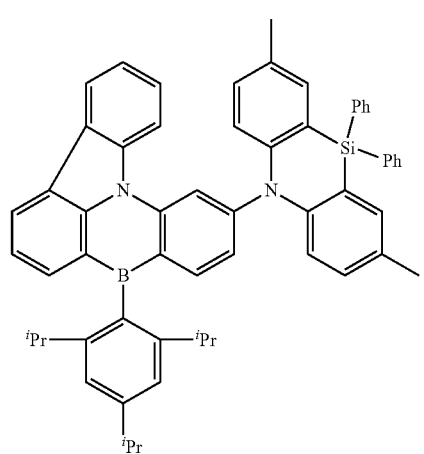
42
-continued
63
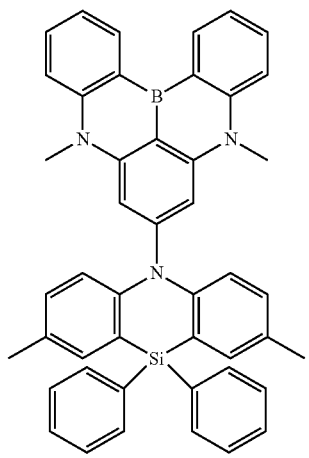
64
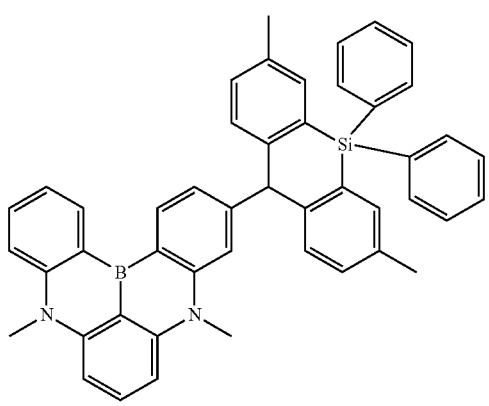
65
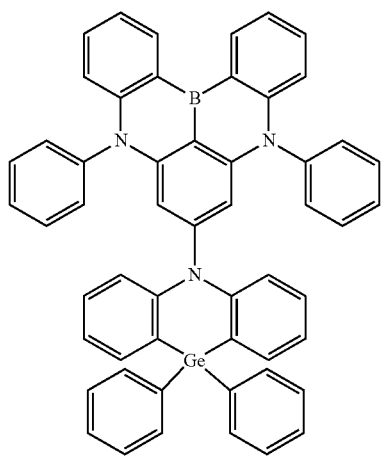

66
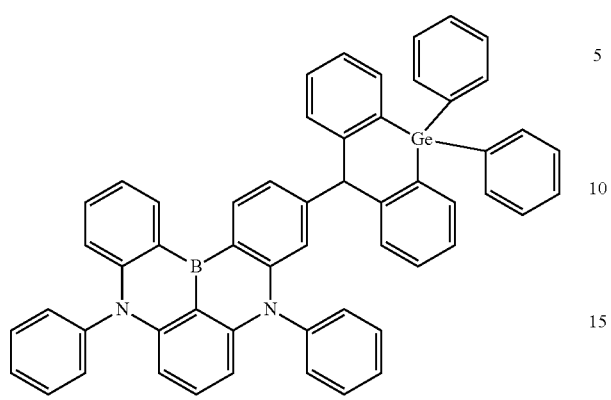
67
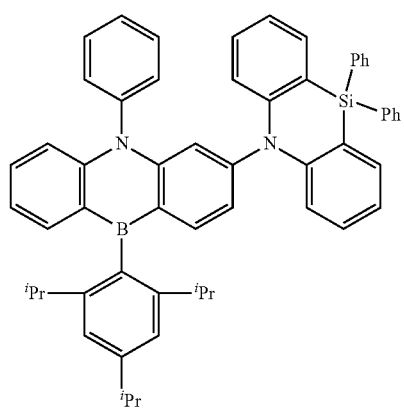
68
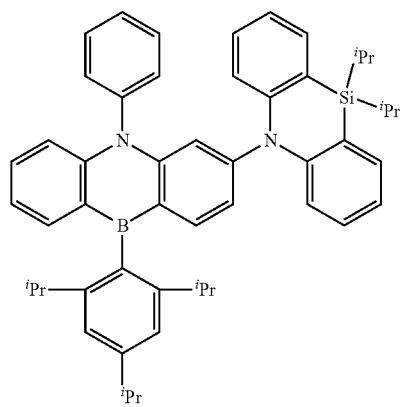
69
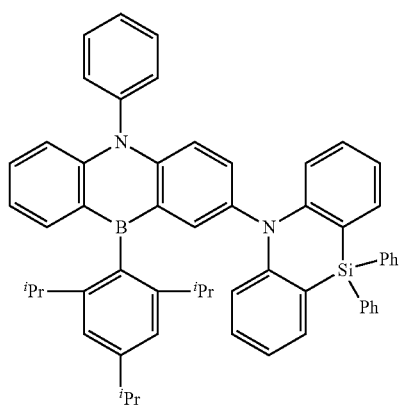
70
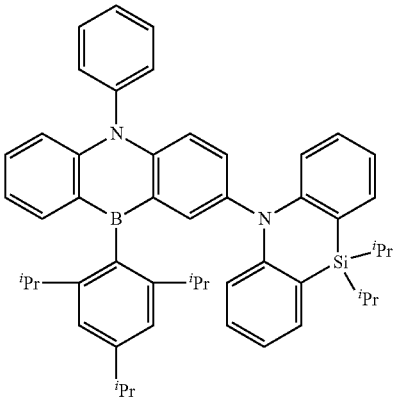
71
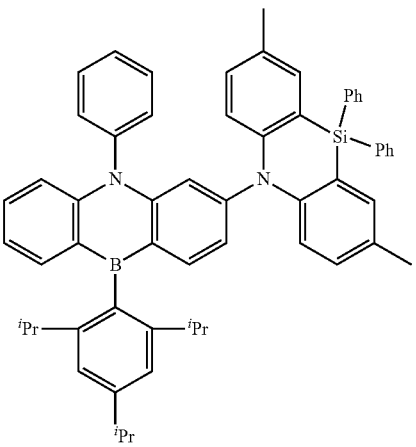
72
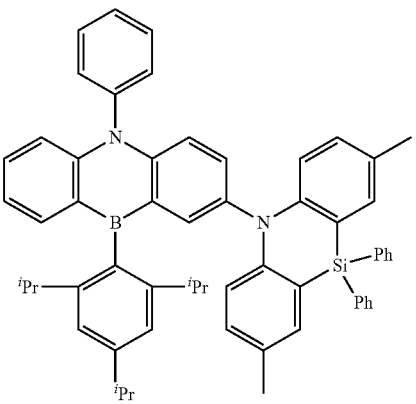
73
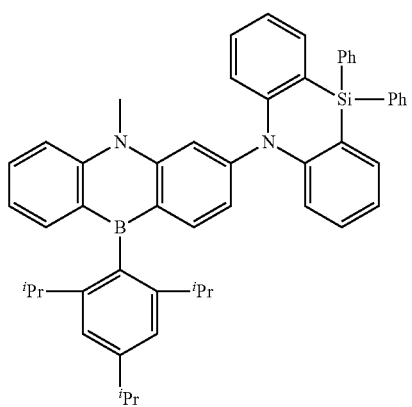

74

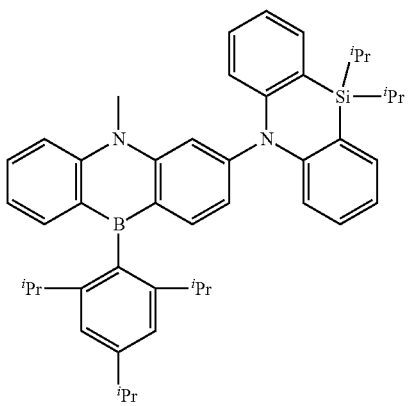

75

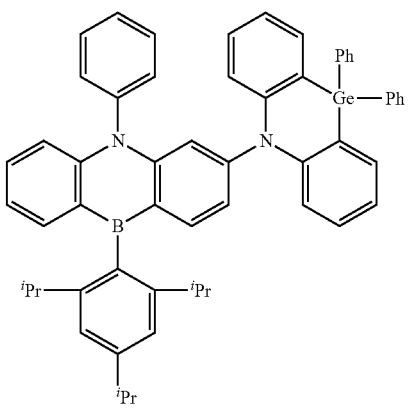

76

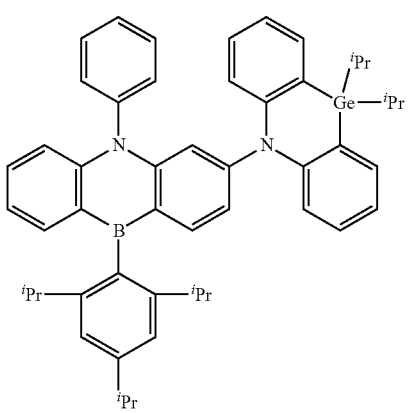

77

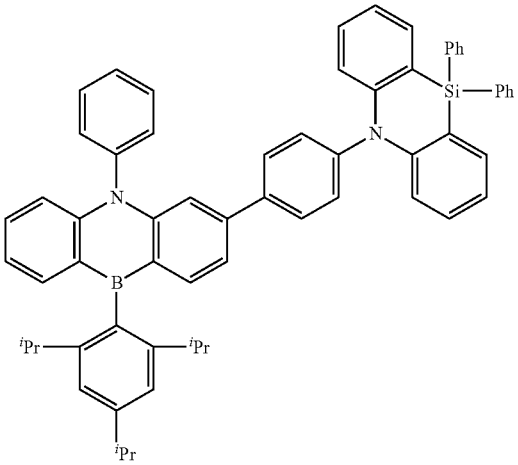

78

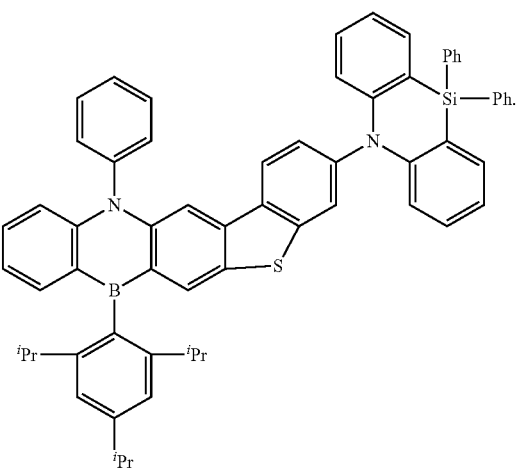

The compound of an embodiment may be a material to emit thermally activated delayed fluorescence. The compound of an embodiment may include an electron acceptor represented by Formula 1 and an electron donor represented by Formula 2.

In the compound of an embodiment, the electron acceptor represented by Formula 1 may include an azaborine moiety having both a boron atom (B) and a nitrogen atom (N) as ring-forming atoms, and may show excellent emission efficiency and long life characteristics.

In addition, the compound of an embodiment includes the polycyclic hetero group represented by Formula 2 as the electron donor, and may show excellent emission efficiency and improved life characteristics.

The compound of an embodiment may be a thermally activated delayed fluorescence dopant, having a difference ($\Delta E_{ST}$) between the lowest triplet excitation energy level (T1 level) and the lowest singlet excitation energy level (S1 level) of about 0.25 eV or less. However, an embodiment of the present disclosure is not limited thereto.

The compound of an embodiment represented by Formula 1 may be a light-emitting material having a light-emitting central wavelength ($ë_{max}$) in a wavelength region of about 490 nm or less. For example, the compound of an embodiment represented by Formula 1 may be a light-emitting material having a light-emitting central wavelength in a wavelength region of about 430 nm to about 490 nm. The compound of an embodiment, represented by Formula 1 may be a blue thermally activated delayed fluorescent dopant.

In the organic electroluminescence device 10 of an embodiment, the emission layer EML may be to emit delayed fluorescence. For example, the emission layer EML may be to emit thermally activated delayed fluorescence (TADF).

The organic electroluminescence device 10 of an embodiment may include a plurality of emission layers. The plurality of emission layers may be laminated one by one and provided in the electroluminescence device in a stated order. For example, the organic electroluminescence device 10 including the plurality of emission layers may be to emit white light. The organic electroluminescence device including the plurality of emission layers may be an organic electroluminescence device having a tandem structure. When the organic electroluminescence device 10 includes a plurality of emission layers, at least one emission layer EML may include the above-described compound represented by Formula 1.

In an embodiment, the emission layer EML includes a host and a dopant, and may include the compound of an embodiment as a dopant. For example, in the organic electroluminescence device 10 of an embodiment, the emission layer EML may include a host to emit delayed fluorescence and a dopant to emit delayed fluorescence, and may include the compound of an embodiment as the dopant to emit delayed fluorescence. The emission layer EML may include at least one of the compounds represented in Compound Group 1 as a thermally activated delayed fluorescent dopant.

In an embodiment, the emission layer EML is a delayed fluorescence emission layer, and the emission layer EML may include any suitable host material and the above-described compound of an embodiment. For example, in an embodiment, the compound of an embodiment may be used as a TADF dopant.

In an embodiment, the emission layer EML may include any suitable host material. For example, in an embodiment, the emission layer EML may include as the host material, tris(8-hydroxyquinolinato)aluminum ($Alq_3$), 4,4'-bis(N-carbazolyl)-1,1'-biphenyl (CBP), poly(N-vinylcarbazole) (PVK), 9,10-di(naphthalen-2-yl)anthracene (ADN), 4,4',4''-tris(carbazol-9-yl)-triphenylamine (TCTA), 1,3,5-tris(N-phenylbenzimidazol-2-yl)benzene (TPBi), 3-tert-butyl-9,10-di(naphth-2-yl)anthracene (TBADN), distyrylarylene (DSA), 4,4'-bis(9-carbazolyl)-2,2''-dimethyl-biphenyl (CDBP), 2-methyl-9,10-bis(naphthalen-2-yl)anthracene (MADN), bis[2-(diphenylphosphino)phenyl] ether oxide (DPEPO), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), 2,8-bis(diphenylphosphoryl)dibenzo[b,d]furan (PPF), 3,3'-bis(N-carbazolyl)-1,1'-biphenyl (mCBP), 1,3-bis(N-carbazolyl)benzene (mCP), etc. However, an embodiment of the present disclosure is not limited thereto, and any suitable host materials to emit delayed fluorescence may be included in addition to the suggested host materials.

In the organic electroluminescence device 10 of an embodiment, the emission layer EML may further include any suitable dopant materials. In an embodiment, the emission layer EML may further include as the dopant, styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-Avinyl)phenyl)-N-phenylbenzenamine (N-BDAVBi)), perylene and the derivatives thereof (for example, 2,5,8,11-Tetra-t-butylperylene (TBP)), pyrene and the derivatives thereof (for example, 1,1-dipyrene, 1,4-dipyrenylbenzene, and 1,4-bis(N,N-diphenylamino)pyrene), etc.

In the organic electroluminescence devices 10 of exemplary embodiments shown in FIGS. 1 to 3, an electron transport region ETR is provided on an emission layer EML. The electron transport region ETR may include at least one of an hole blocking layer HBL, an electron transport layer ETL, and an electron injection layer EIL. However, an embodiment of the present disclosure is not limited thereto.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. Further, the electron transport region ETR may have a single layer structure including a plurality of different materials, or a structure laminated from the emission layer EML including an electron transport layer ETL/electron injection layer EIL, or hole blocking layer HBL/electron transport layer ETL/electron injection layer EIL, without limitation. The thickness of the electron transport region ETR may be, for example, about 1,000 Å to about 1,500 Å.

The electron transport region ETR may be formed using any suitable method (such as a vacuum deposition method, a spin coating method, a cast method, a Langmuir-Blodgett (LB) method, an inkjet printing method, a laser printing method, and/or a laser induced thermal imaging (LITI) method).

When the electron transport region ETR includes an electron transport layer ETL, the electron transport region ETR may include an anthracene-based compound. The electron transport region may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1, 1'-biphenyl-4-olato) aluminum (BAlq), beryllium bis(benzoquinolin-10-olate) (Bebq2), 9,10-di(naphthalen-2-yl)anthracene (ADN), 1,3-bis[3,5-di(pyridine-3-yl)phenyl]benzene (BmPyPhB), or a mixture thereof, without limitation. The thickness of the electron transport layer ETL may be about 100 Å to about 1,000 Å, for example, about 150 Å to about 500 Å. When the thickness of the electron transport layer ETL satisfies the above-described range, satisfactory electron transport properties may be obtained without substantial increase of a driving voltage.

When the electron transport region ETR includes the electron injection layer EIL, the electron transport region ETR may include a metal halide such as LiF, NaCl, CsF, RbCl and RbI, a lanthanide metal such as Yb, a metal oxide such as $Li_2O$ and BaO, or lithium quinolate (LiQ). However, embodiments of the present disclosure are not limited thereto. The electron injection layer EIL may be also formed using a mixture material of an electron transport material and an insulating organo metal salt. The organo metal salt may be a material having an energy band gap of about 4 eV or more. For example, the organo metal salt may include, for example, metal acetates, metal benzoates, metal acetoacetates, metal acetylacetonates, or metal stearates. The thickness of the electron injection layer EIL may be about 1 Å to about 100 Å, or about 3 Å to about 90 Å. When the thickness of the electron injection layer EIL satisfies the above described range, satisfactory electron injection properties may be obtained without inducing a substantial increase in driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), and 4,7-diphenyl-1,10-phenanthroline (Bphen). However, embodiments of the present disclosure are not limited thereto.

The second electrode EL2 is provided on the electron transport region ETR. The second electrode EL2 may be a common electrode or a cathode. The second electrode EL2 may be a transmissive electrode, a transflective electrode or a reflective electrode. When the second electrode EL2 is a transmissive electrode, the second electrode EL2 may include a transparent metal oxide, for example, ITO, IZO, ZnO, ITZO, etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, etc.

In some embodiments, the second electrode EL2 may be connected with an auxiliary electrode. When the second electrode EL2 is connected with the auxiliary electrode, the resistance of the second electrode EL2 may decrease.

In some embodiments, a capping layer CPL may be further disposed on the second electrode EL2 of the organic electroluminescence device 10 of an embodiment. The capping layer CPL may include, for example, α-NPD, NPB, TPD, m-MTDATA, Alq3, CuPc, N4,N4,N4',N4'-tetra(biphenyl-4-yl)biphenyl-4,4'-diamine (TPD15), 4,4',4"-tris(carbazol-9-yl) triphenylamine) (TCTA), N,N'-bis(naphthalen-1-yl), etc.

The organic electroluminescence device 10 according to an embodiment of the present disclosure may be included in the emission layer EML disposed between the first electrode EL1 and the second electrode EL2, and may show improved life characteristics and excellent emission efficiency. In addition, the compound according to an embodiment may be a thermally activated delayed fluorescence dopant, and the emission layer EML may include the compound of an embodiment to emit thermally activated delayed fluorescence, to provide excellent emission efficiency properties in a blue wavelength region.

The compound of an embodiment may be included as a material for the organic electroluminescence device 10 in an organic layer other than the emission layer EML. For example, the organic electroluminescence device 10 according to an embodiment of the present disclosure may include the compound in at least one functional layer disposed between the first electrode EL1 and the second electrode EL2, or a capping layer CPL disposed on the second electrode EL2.

The compound of an embodiment includes an azaborine moiety including both N and B as ring-forming heteroatoms, and an azasiline group or an azagermine group which is substituted at the azaborine moiety and has a heavy atom, and thus, if used as a material for an organic electroluminescence device, the efficiency and life characteristics of the organic electroluminescence device may be even further improved.

Hereinafter, the compound according to an embodiment of the present disclosure and the organic electroluminescence device of an embodiment will be explained in more detail by referring to particular embodiments and comparative embodiments. In addition, the following embodiments are only illustrations to assist the understanding of the present disclosure, and the scope of the present disclosure is not limited thereto.

EXAMPLES

1. Synthesis of Compound of Embodiment

First, the synthetic method of the compound according to an embodiment will be explained by referring to the synthetic methods of Compounds 1, 9, 12, 30, 31, 65 and 67. In addition, the following synthetic methods of the compounds are only embodiments, and the synthetic method of the compound according to an embodiment of the present disclosure is not limited thereto.

(1) Synthesis of Compound 1

Compound 1 according to an embodiment may be synthesized, for example, by Reaction 1:

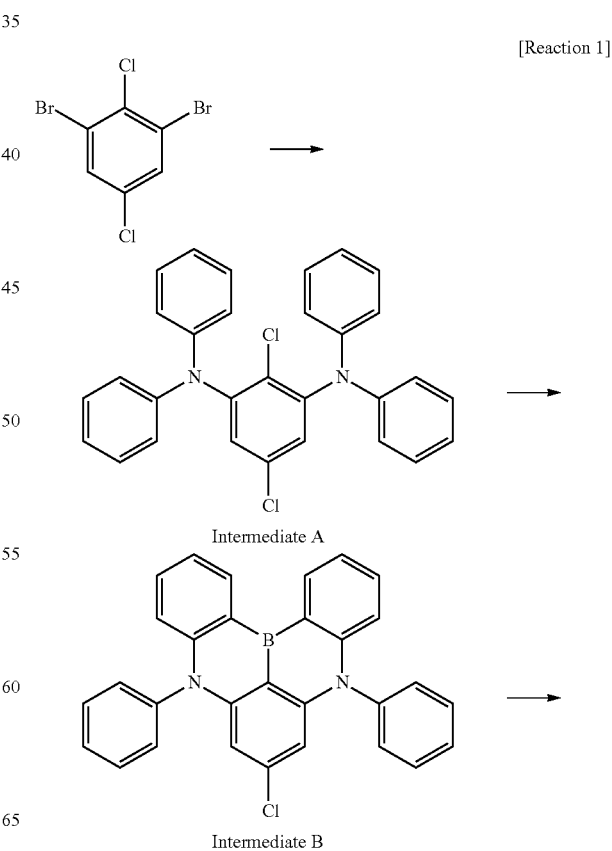

[Reaction 1]

Intermediate A

Intermediate B

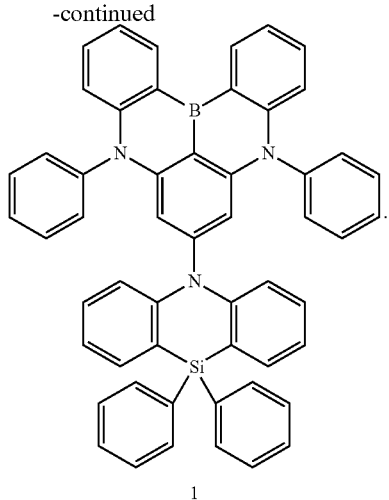

Synthesis of Intermediate Compound A

Under an argon (Ar) atmosphere, to a 1,000 mL three-neck flask, 16.9 g (100 mmol) of diphenylamine, 15.2 g (50 mmol) of 1,3-dibromo-2,5-dichlorobenzene, 1.42 g (2.0 mmol) of (Amphos)PdCl$_2$, and 10.6 g (110 mmol) of NaOtBu were added and stirred in 500 mL of a toluene solvent at about 100° C. for about 2 hours. After cooling in the air, water was added, an organic layer was isolated, and solvents were removed by distillation. The crude product thus obtained was separated by column chromatography (silica gel) to obtain 20.46 g (yield 85%) of Intermediate Compound A as a white solid compound. The molecular weight of Intermediate Compound A measured by FAB-MS was 481.

Synthesis of Intermediate Compound B

Under an argon atmosphere, to a 500 mL, three-neck flask, 200 mL of a dehydrated t-butylbenzene solution of 20.22 g (42 mmol) of Intermediate Compound A was added and stirred at about −78° C. 44 mL (84 mmol) of a pentane solution of 1.9 M t-BuLi was added thereto dropwisely. After finishing the dropwise addition, the temperature was elevated to about 60° C. and stirring was performed for about 2 hours. Then, a component having a lower boiling point than t-butylbenzene was removed by distillation. The temperature was decreased to about −30° C., and 8.0 mL (84 mmol) of BBr$_3$ was added thereto dropwisely. After finishing the dropwise addition, the temperature was elevated to room temperature and stirring was performed for about 2 hours. Then, the temperature was decreased to about 0° C., and 15 mL (84 mmol) of N,N-diisopropylethylamine was added dropwisely. After finishing the dropwise addition, the temperature was elevated to room temperature and stirring was performed for about 1 hour, and then, the temperature was elevated to about 120° C. and stirring and heating was performed for about 8 hours. The reaction solution was cooled to room temperature, and a NaOAc aqueous solution cooled in an ice bath and toluene were added and a solution was separated. Then, the solution thus obtained was separated by short column chromatography, and recrystallized by a toluene/hexane solvent to obtain 5.54 g (yield 29%) of Intermediate Compound B as a yellow solid. The molecular weight of Intermediate Compound B measured by FAB-MS was 454.

Synthesis of Compound 1

Under an argon atmosphere, to a 100 mL, three-neck flask, 2.73 g (6.0 mmol) of Intermediate Compound B, 2.10 g (6.0 mmol) of 10,10-diphenyl-5,10-dihydrodibenzo[b,e][1,4]azasiline, 0.055 g (0.06 mmol) of Pd$_2$(dba)$_3$, 0.11 g (0.24 mmol) of Ruphos, and 3.82 g (18.0 mmol) of K$_2$PO$_4$ were added and stirred in 30 mL of a toluene solvent at about 110° C. for about 8 hours. After cooling in the air, water was added, an organic layer was isolated, and solvents were removed by distillation. The crude product thus obtained was separated by silica gel column chromatography to obtain 3.32 g (yield 72%) of Compound 1 as a yellow solid. The molecular weight of Compound 1 measured by FAB-MS was 767. In addition, the δ (chemical shift values) of Compound 1 measured by $^1$H-NMR (CDCl$_3$) were [7.71 (2H), 7.50-7.16 (24H), 7.10-6.98 (10H), 6.49 (2H)].

(2) Synthesis of Compound 9

Compound 9 according to an embodiment may be synthesized, for example, by Reaction 2:

[Reaction 2]

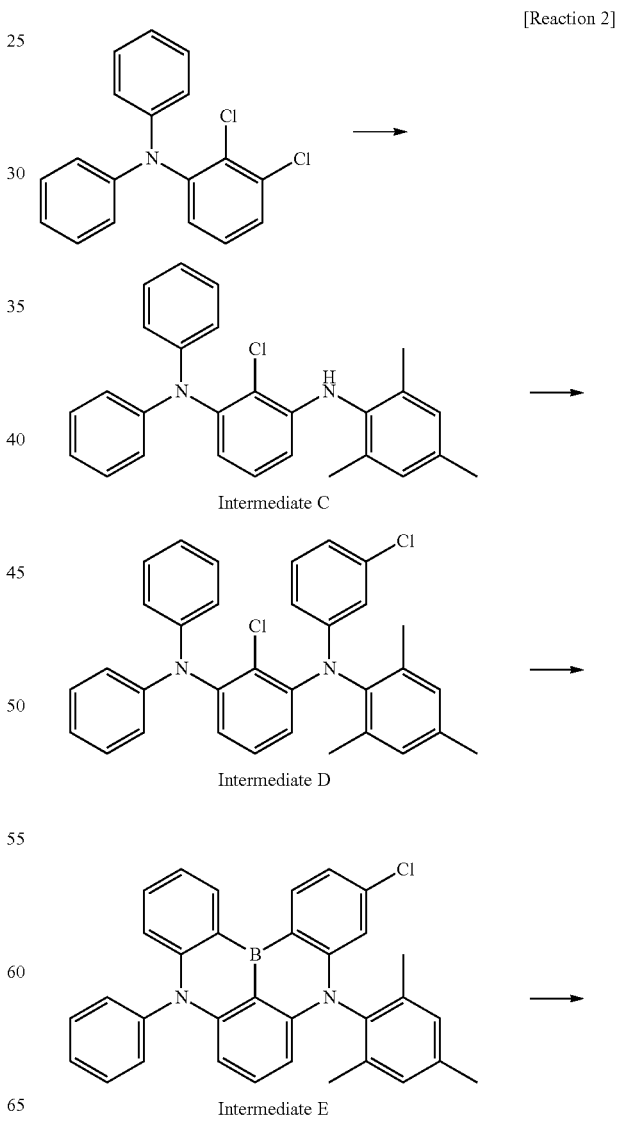

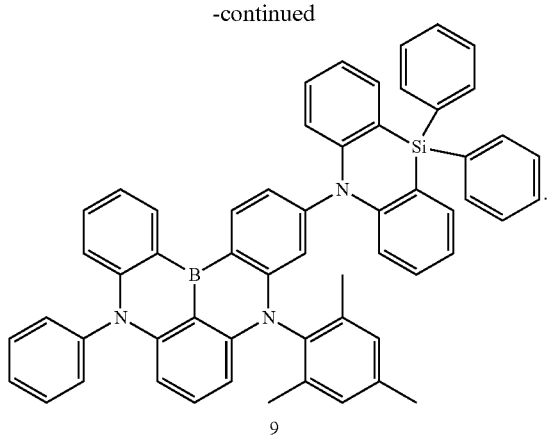

9

Synthesis of Intermediate Compound C

Under an argon atmosphere, to a 200 mL three-neck flask, 7.86 g (25 mmol) of 2,3-dichloro-N,N-diphenyl-1,3-aniline, 3.8 mL (27 mmol) of 2,4,6-trimethylaniline, 0.35 g (0.5 mmol) of (Amphos)PdCl$_2$, and 2.59 g (27 mmol) of NaOtBu were added and stirred in 50 mL of a xylene solvent at about 120° C. for about 8 hours. After cooling in the air, water was added, an organic layer was isolated, and solvents were removed by distillation. The crude product thus obtained was separated by silica gel column chromatography to obtain 9.09 g (yield 88%) of Intermediate Compound C as a white solid compound. The molecular weight of Intermediate Compound C measured by FAB-MS was 412.

Synthesis of Intermediate Compound D

Under an argon atmosphere, to a 200 mL three-neck flask, 5.97 g (22 mmol) of Intermediate Compound C, 2.8 mL (24 mmol) of 1-bromo-3-chlorobenzene, 0.20 g (0.22 mmol) of Pd$_2$(dba)$_3$, 0.18 g (0.88 mmol) of P$^t$Bu$_3$, and 2.31 g (24 mmol) of NaOtBu were added and stirred in 50 mL of a toluene solvent at about 100° C. for about 2 hours. After cooling in the air, water was added, an organic layer was isolated, and solvents were removed by distillation. The crude product thus obtained was separated by silica gel column chromatography to obtain 10.6 g (yield 92%) of Intermediate Compound D as a white solid compound. The molecular weight of Intermediate Compound D measured by FAB-MS was 523.

Synthesis of Intermediate Compound E

Under an argon atmosphere, to a 300 mL, three-neck flask, 100 mL of a dehydrated t-butylbenzene solution of 6.78 g (20 mmol) of Intermediate Compound D was added and stirred at about −78° C. 21 mL (40 mmol) of a pentane solution of 1.9 M t-BuLi was added thereto dropwisely. After finishing the dropwise addition, the temperature was elevated to about 60° C. and stirring was performed for about 2 hours. Then, a component having a lower boiling point than t-butylbenzene was removed by distillation. The temperature was decreased to about −30° C. and 3.8 mL (40 mmol) of BBr$_3$ was added thereto dropwisely. After finishing the dropwise addition, the temperature was elevated to room temperature and stirring was performed for about 2 hours. Then, the temperature was decreased again to about 0° C. and 7.0 mL (40 mmol) of N,N-diisopropylethylamine was added thereto dropwisely. After finishing the dropwise addition, the temperature was elevated to room temperature and stirring was performed for about 1 hour and then, the temperature was elevated to about 120° C. and stirring and heating was performed for about 8 hours. The reaction solution was cooled to room temperature, and a NaOAc aqueous solution cooled in an ice bath and toluene were added and a solution was separated. Then, the solution thus obtained was separated by short column chromatography, and recrystallized by a toluene/hexane solvent to obtain 3.18 g (yield 32%) of Intermediate Compound E as a yellow solid. The molecular weight of Intermediate Compound E measured by FAB-MS was 496.

Synthesis of Compound 9

Under an argon atmosphere, to a 200 mL, three-neck flask, 3.13 g (6.3 mmol) of Intermediate Compound E, 2.30 g (6.3 mmol) of 10,10-diphenyl-5,10-dihydrodibenzo[b,e][1,4]azasiline, 0.060 g (0.06 mmol) of Pd$_2$(dba)$_3$, 0.12 g (0.13 mmol) of Ruphos, and 4.01 g (18.9 mmol) of K$_2$PO$_4$ were added and stirred in 30 mL of a toluene solvent at about 110° C. for about 8 hours. After cooling in the air, water was added, an organic layer was isolated, and solvents were removed by distillation. The crude product thus obtained was separated by silica gel column chromatography to obtain 3.52 g (yield 69%) of Compound 9 as a yellow solid. The molecular weight of Compound 9 measured by FAB-MS was 809. In addition, the δ (chemical shift values) of Compound 9 measured by $^1$H-NMR (CDCl$_3$) were [7.73-7.65 (2H), 7.48-7.16 (21H), 7.10-6.98 (6H), 6.86-6.81 (4H), 6.77 (2H), 2.26 (3H), 2.12 (6H)].

(3) Synthesis of Compound 30

Compound 30 according to an embodiment may be synthesized, for example, by Reaction 3:

[Reaction 3]

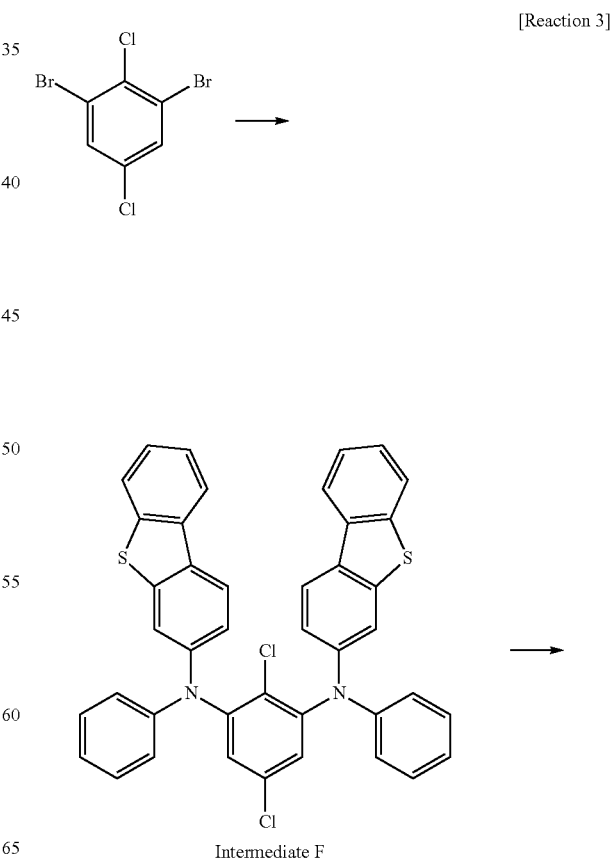

Intermediate F

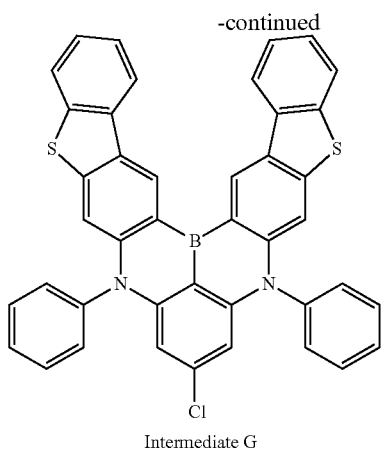

Intermediate G

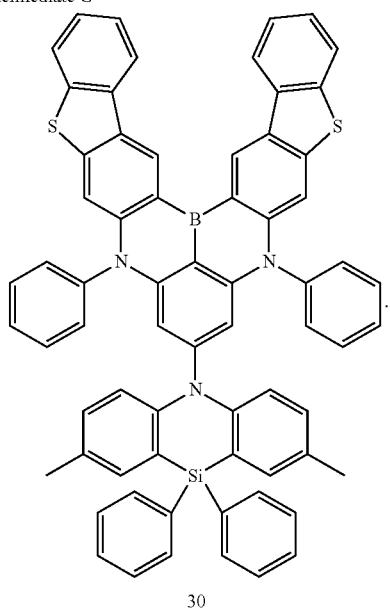

30

Synthesis of Intermediate Compound F

Under an argon atmosphere, to a 500 mL three-neck flask, 9.86 g (50 mmol) of N-phenyl-3-dibenzothiophenamine, 10.65 g (25 mmol) of 1,3-dibromo-2,5-dichlorobenzene, 0.71 g (1.0 mmol) of (Amphos)PdCl$_2$, and 5.29 g (55 mmol) of NaOtBu were added and stirred in 250 mL of a toluene solvent at about 100° C. for about 2 hours. After cooling in the air, water was added, an organic layer was isolated, and solvents were removed by distillation. The crude product thus obtained was separated by silica gel column chromatography to obtain 16.13 g (yield 93%) of Intermediate Compound F as a white solid compound. The molecular weight of Intermediate Compound F measured by FAB-MS was 693.

Synthesis of Intermediate Compound G

Under an argon atmosphere, to a 300 mL, three-neck flask, 120 mL of a dehydrated t-butylbenzene solution of 16.0 g (23 mmol) of Intermediate Compound F was added and stirred at about −78° C. 24 mL (46 mmol) of a pentane solution of 1.9 M t-BuLi was added thereto dropwisely. After finishing the dropwise addition, the temperature was elevated to about 60° C. and stirring was performed for about 2 hours. Then, a component having a lower boiling point than t-butylbenzene was removed by distillation in a reduced pressure. The temperature was decreased to about −30° C., and 4.4 mL (46 mmol) of BBr$_3$ was added thereto dropwisely. After finishing the dropwise addition, the temperature was elevated to room temperature and stirring was performed for about 2 hours. Then, the temperature was decreased to about 0° C. again, and 8.0 mL (46 mmol) of N,N-diisopropylethylamine was added thereto dropwisely. After finishing the dropwise addition, the temperature was elevated to room temperature and stirring was performed for about 1 hour. Then, the temperature was elevated to about 120° C. and stirring and heating was performed for about 8 hours. The reaction solution was cooled to room temperature, and a NaOAc aqueous solution cooled in an ice bath and toluene were added and a solution was separated. Then, the solution thus obtained was separated by short column chromatography, and recrystallized by a toluene/hexane solvent to obtain 3.38 g (yield 22%) of Intermediate Compound G as a yellow solid. The molecular weight of Intermediate Compound G measured by FAB-MS was 667.

Synthesis of Compound 30

Under an argon atmosphere, to a 200 mL, three-neck flask, 3.34 g (5.0 mmol) of Intermediate Compound G, 1.89 g (5.0 mmol) of 10,10-diphenyl-3,6-dimethyl-5,10-dihydrodibenzo[b,e][1,4]azasiline, 0.055 g (0.05 mmol) of Pd$_2$(dba)$_3$, 0.093 g (0.20 mmol) of Ruphos, and 3.18 g (15.0 mmol) of K$_2$PO$_4$ were added and stirred in 25 mL of a toluene solvent at about 110° C. for about 8 hours. After cooling in the air, water was added, an organic layer was separated, and solvents were removed by distillation. The crude product thus obtained was separated by silica gel column chromatography to obtain 2.97 g (yield 59%) of Compound 30 as a yellow solid. The molecular weight of Compound 30 measured by FAB-MS was 1008. In addition, the δ values of Compound 30 measured by $^1$H-NMR (CDCl$_3$) were [8.45 (2H), 7.95-7.85 (4H), 7.77 (2H), 7.58-7.36 (16H), 7.27-7.21 (8H), 7.10-6.98 (6H), 6.49 (2H), 2.36 (2H)].

(4) Synthesis of Compound 31

Compound 31 according to an embodiment may be synthesized, for example, by Reaction 4:

[Reaction 4]

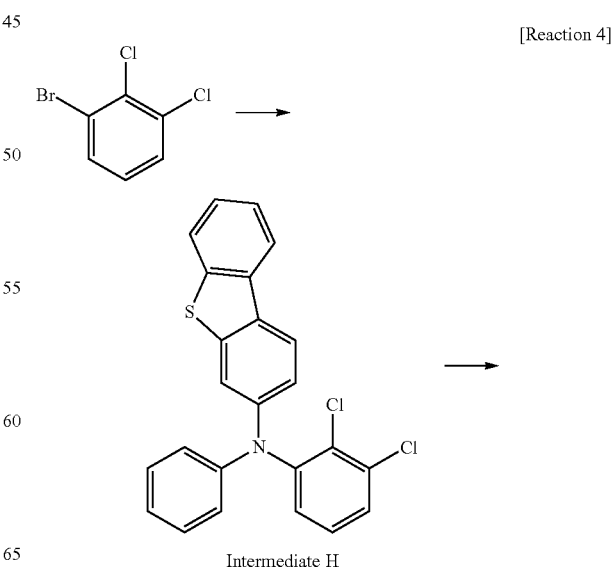

Intermediate H

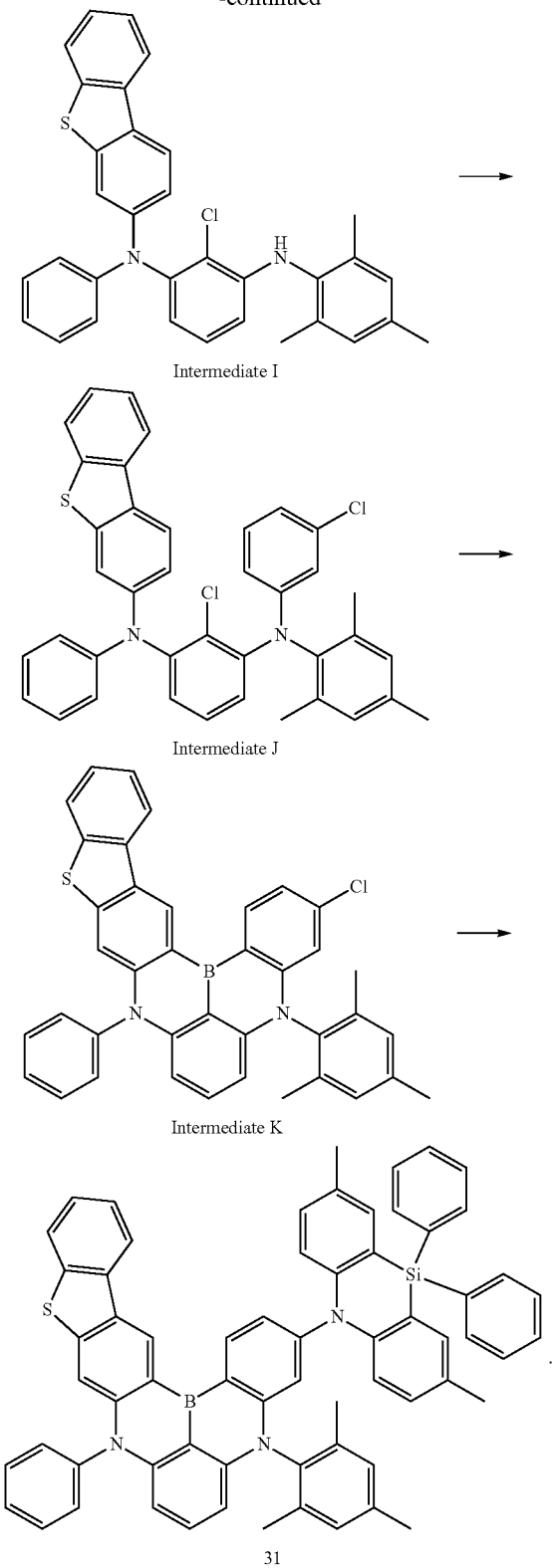

Synthesis of Intermediate Compound H

Under an argon atmosphere, to a 300 mL three-neck flask, 8.26 g (30 mmol) of N-phenyl-3-dibenzothiophenamine, 6.78 g (30 mmol) of 1-bromo-2,3-dichlorobenzene, 0.27 g (0.30 mmol) of Pd$_2$(dba)$_2$, 0.69 g (1.2 mmol) of Xanphos, and 3.17 g (33 mmol) of NaOtBu were added and stirred in 150 mL of a toluene solvent at about 100° C. for about 2 hours. After cooling in the air, water was added, an organic layer was isolated, and solvents were removed by distillation. The crude product thus obtained was separated by silica gel column chromatography to obtain 11.35 g (yield 90%) of Intermediate Compound H as a white solid compound. The molecular weight of Intermediate Compound H measured by FAB-MS was 420.

Synthesis of Intermediate Compound I

Under an argon atmosphere, to a 300 mL three-neck flask, 11.24 g (27 mmol) of Intermediate Compound H, 4.2 mL (30 mmol) of 2,4,6-trimethylaniline, 0.38 g (0.54 mmol) of (Amphos)PdCl$_2$, and 2.88 g (30 mmol) of NaOtBu were added and stirred in 55 mL of a xylene solvent at about 120° C. for about 8 hours. After cooling in the air, water was added, an organic layer was isolated, and solvents were removed by distillation. The crude product thus obtained was separated by silica gel column chromatography to obtain 11.35 g (yield 81%) of Intermediate Compound I as a white solid compound. The molecular weight of Intermediate Compound I measured by FAB-MS was 519.

Synthesis of Intermediate Compound J

Under an argon atmosphere, to a 300 mL three-neck flask, 11.0 g (21 mmol) of Intermediate Compound I, 2.6 mL (22 mmol) of 1-bromo-3-chlorobenzene, 0.19 g (0.21 mmol) of Pd$_2$(dba)$_3$, 0.17 g (0.84 mmol) of P$^t$Bu$_3$, and 2.12 g (22 mmol) of NaOtBu were added and stirred in 85 mL of a toluene solvent at about 100° C. for about 3 hours. After cooling in the air, water was added, an organic layer was isolated, and solvents were removed by distillation. The crude product thus obtained was separated by silica gel column chromatography to obtain 10.31 g (yield 78%) of Intermediate Compound J as a white solid compound. The molecular weight of Intermediate Compound J measured by FAB-MS was 629.

Synthesis of Intermediate Compound K

Under an argon atmosphere, to a 300 mL, three-neck flask, 80 mL of a dehydrated t-butylbenzene solution of 10.08 g (16 mmol) of Intermediate Compound J was added and stirred at about −78° C. 17 mL (32 mmol) of a pentane solution of 1.9 M t-BuLi was added thereto dropwisely. After finishing the dropwise addition, the temperature was elevated to about 60° C. and stirring was performed for about 2 hours. Then, a component having a lower boiling point than t-butylbenzene was removed by distillation in a reduced pressure. The temperature was decreased to about −30° C., and 3.0 mL (32 mmol) of BBr$_3$ was added thereto dropwisely. After finishing the dropwise addition, the temperature was elevated to room temperature and stirring was performed for about 2 hours. Then, the temperature was decreased to about 0° C. again, and 5.6 mL (32 mmol) of N,N-diisopropylethylamine was added thereto dropwisely. After finishing the dropwise addition, the temperature was elevated to room temperature and stirring was performed for about 1 hour. Then, the temperature was elevated to about 120° C., and stirring and heating was performed for about 8 hours. The reaction solution was cooled to room temperature, and a NaOAc aqueous solution cooled in an ice bath and toluene were added and a solution was separated. Then, the solution thus obtained was separated by short column chromatography, and recrystallized by a toluene/hexane solvent to obtain 3.76 g (yield 39%) of Intermediate Compound K as a yellow solid. The molecular weight of Intermediate Compound K measured by FAB-MS was 602.

Synthesis of Compound 31

Under an argon atmosphere, to a 200 mL, three-neck flask, 3.74 g (6.2 mmol) of Intermediate Compound K, 2.57 g (6.8 mmol) of 10,10-diphenyl-3,6-dimethyl-5,10-dihydrodibenzo[b,e][1,4]azasiline, 0.060 g (0.06 mmol) of $Pd_2(dba)_3$, 0.12 g (0.13 mmol) of Ruphos, and 3.95 g (18.6 mmol) of $K_2PO_4$ were added and stirred in 70 mL of a toluene solvent at about 110° C. for about 8 hours. After cooling in the air, water was added, an organic layer was separated, and solvents were removed by distillation. The crude product thus obtained was separated by silica gel column chromatography to obtain 3.34 g (yield 57%) of Compound 31 as a yellow solid. The molecular weight of Compound 31 measured by FAB-MS was 944. In addition, the δ values of Compound 31 measured by $^1$H-NMR (CDCl$_3$) were [8.45 (1H), 7.93 (1H), 7.87 (1H), 7.77 (1H), 7.67 (1H), 7.58-7.36 (14H), 7.29-7.21 (7H), 7.10-6.98 (3H), 6.86-6.81 (4H), 6.77 (2H), 2.36 (2H), 2.26 (3H), 2.12 (6H)].

(5) Synthesis of Compound 12

Compound 12 according to an embodiment may be synthesized, for example, by Reaction 5:

[Reaction 5]

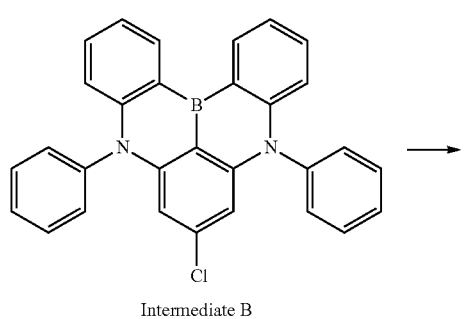

Intermediate B

→

12

Under an argon atmosphere, to a 100 mL, three-neck flask, 1.36 g (3.0 mmol) of Intermediate Compound B, 1.18 g (3.0 mmol) of 10,10-diphenyl-5,10-dihydrodibenzo[b,e][1,4]azasiline, 0.14 g (0.15 mmol) of Pd$_2$(dba)$_3$, 0.28 g (0.6 mmol) of Ruphos, and 1.91 g (9.0 mmol) of K$_3$PO$_4$ were added and stirred in 15 mL of a toluene solvent at about 80° C. for about 24 hours. After cooling in the air, water was added, an organic layer was separated, and solvents were removed by distillation. The crude product thus obtained was separated by silica gel column chromatography to obtain 1.57 g (yield 75%) of Compound 12 as a yellow solid. The molecular weight of Compound 12 measured by FAB-MS was 699. In addition, the δ values of Compound 12 measured by $^1$H-NMR (CDCl$_3$) were [7.71 (2H), 7.44-7.37 (4H), 7.31-7.16 (10H), 7.10-6.98 (10H), 6.49 (2H), 1.45 (2H), 0.97 (12H)].

(6) Synthesis of Compound 65

Compound 65 according to an embodiment may be synthesized, for example, by Reaction 6:

[Reaction 6]

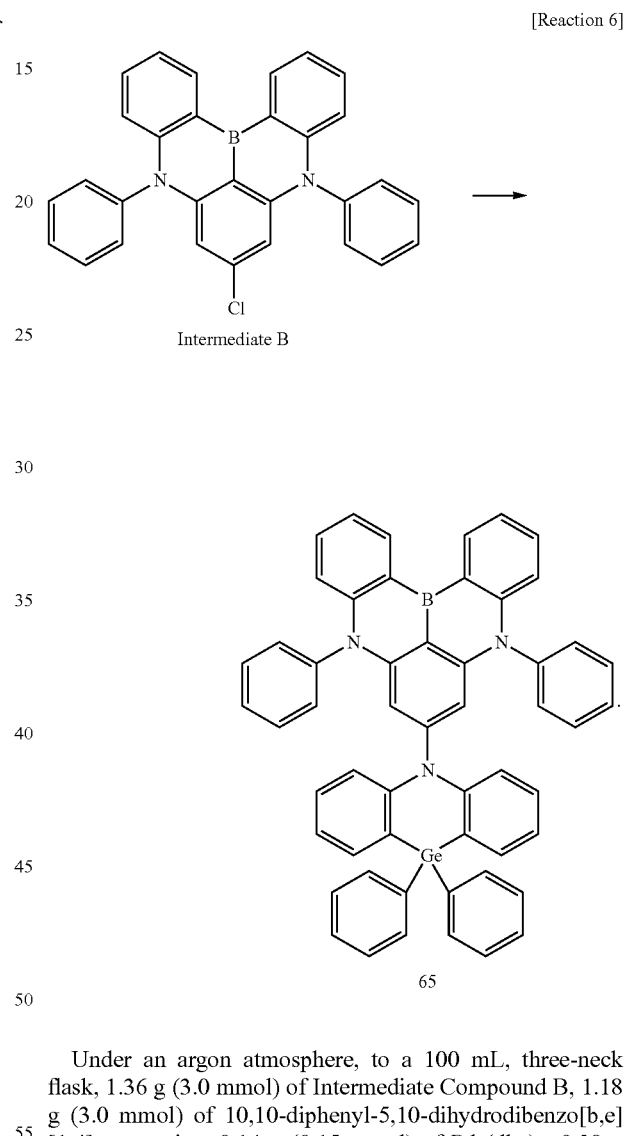

Under an argon atmosphere, to a 100 mL, three-neck flask, 1.36 g (3.0 mmol) of Intermediate Compound B, 1.18 g (3.0 mmol) of 10,10-diphenyl-5,10-dihydrodibenzo[b,e][1,4]azagermine, 0.14 g (0.15 mmol) of Pd$_2$(dba)$_3$, 0.28 g (0.6 mmol) of Ruphos, and 1.91 g (9.0 mmol) of K$_3$PO$_4$ were added and stirred in 15 mL of a toluene solvent at about 80° C. for about 24 hours. After cooling in the air, water was added, an organic layer was separated, and solvents were removed by distillation. The crude product thus obtained was separated by silica gel column chromatography to obtain 1.25 g (yield 51%) of Compound 65 as a yellow solid. The molecular weight of Compound 65 measured by FAB-MS was 812. In addition, the δ values of Compound 65 measured by $^1$H-NMR (CDCl$_3$) were [7.71 (2H), 7.38-7.16 (24H), 7.10-6.98 (10H), 6.49 (2H)].

(7) Synthesis of Compound 67

Compound 67 according to an embodiment may be synthesized, for example, by Reaction 7:

[Reaction 7]

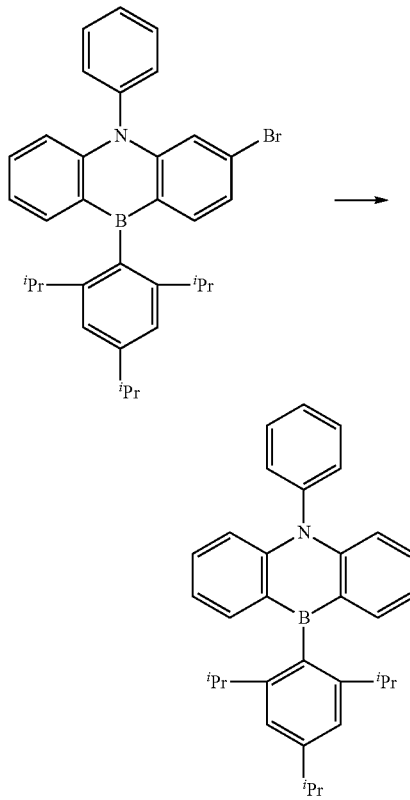

67

Under an argon atmosphere, to a 100 mL, three-neck flask, 2.68 g (5.0 mmol) of 3-bromo-5,10-dihydro-5-phenyl-10-[2,4,6-tris(1-methylethyl)phenyl]phenazaborine, 1.75 g (5.0 mmol) of 10,10-diphenyl-5,10-dihydrodibenzo[b,e][1,4]azasiline, 0.046 g (0.05 mmol) of $Pd_2(dba)_3$, 0.040 g (0.20 mmol) of $P^tBu_3$, and 0.48 g (5.0 mmol) of NaOtBu were added and stirred in 25 mL of a toluene solvent at about 100° C. for about 2 hours. After cooling in the air, water was added, an organic layer was separated, and solvents were removed by distillation. The crude product thus obtained was separated by silica gel column chromatography to obtain 3.10 g (yield 77%) of Compound 67 as a yellow solid. The molecular weight of Compound 67 measured by FAB-MS was 804. In addition, the δ values of Compound 67 measured by $^1$H-NMR ($CDCl_3$) were [7.73-7.65 (2H), 7.48-7.36 (14H), 7.31-7.16 (8H), 7.10-6.98 (6H), 6.86-6.81 (2H), 2.90-2.85 (3H), 1.22-1.16 (18H)].

2. Manufacture and evaluation of organic electroluminescence device 2-1. Example A of organic electroluminescence device Embodiment organic electroluminescence devices including the compound of an embodiment in an emission layer were manufactured according to the method described below. The organic electroluminescence devices of Example 1 to Example 6 were manufactured using Compounds 1, 9, 30, 31, 12, and 65, respectively, as the dopant materials of the emission layer. The organic electroluminescence devices of comparative Example 1 and Comparative Example 2 were manufactured using Comparative Compounds C1 and C2, respectively, as the dopant materials of an emission layer.

The compounds used in Example 1 to Example 6, and Comparative Example 1 and Comparative Example 2 are shown in Table 1:

TABLE 1

| Compound 1 | 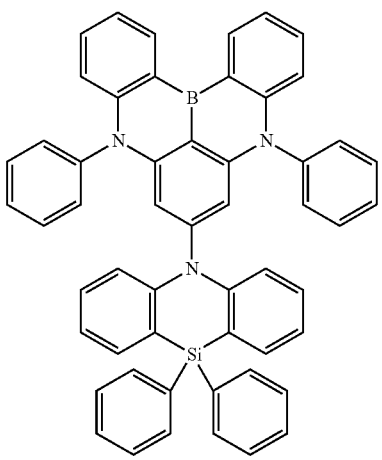 |
|---|---|

1

TABLE 1-continued
Compound 9
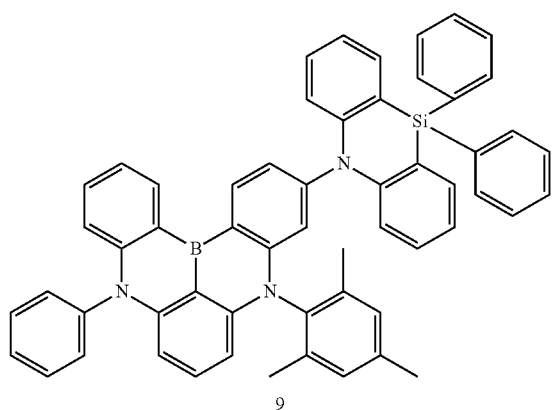 [SMILES: Cc1cc(C)c(N2c3cc(N4c5ccccc5[Si](c5ccccc5)(c5ccccc5)c5ccccc54)ccc3B3c4ccccc4N(c4ccccc4)c4cccc2c43)c(C)c1]
9
Compound 30
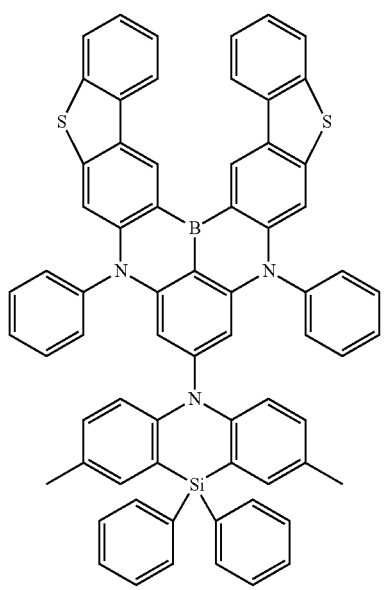
30
Compound 31
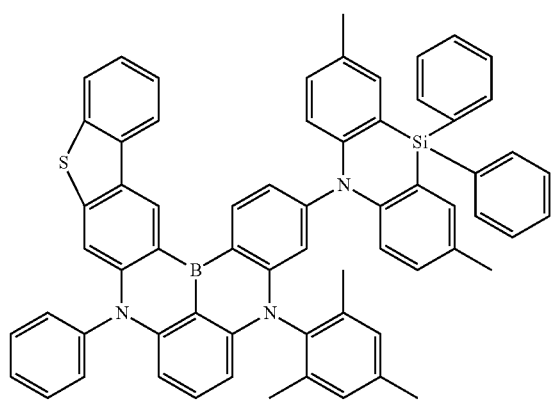
31

TABLE 1-continued
| Compound 12 | 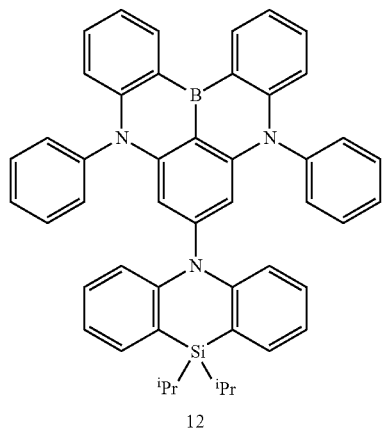 [SMILES: CC(C)[Si]1(C(C)C)c2ccccc2N(c2cc3c4c(c2)N(c2ccccc2)c2ccccc2B4c2ccccc2N3c2ccccc2)c2ccccc21] |
| --- | --- |
| Compound 65 | 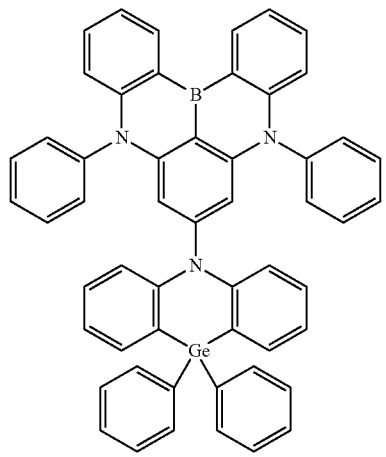 |
| Comparative Compound C1 | 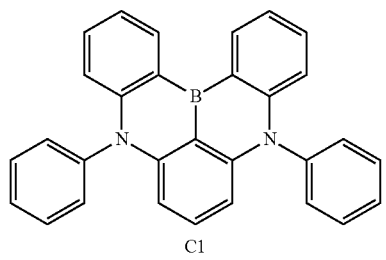 |

TABLE 1-continued

Comparative Compound C2

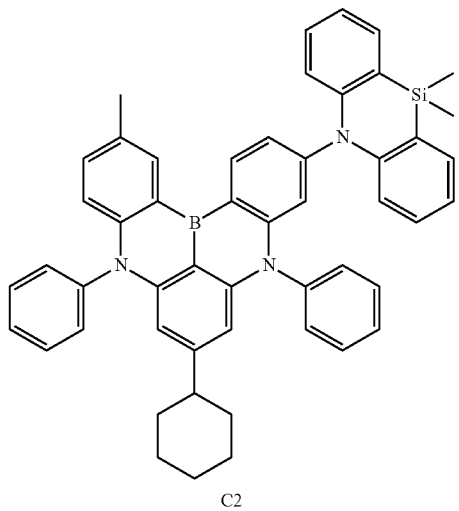

C2

(Manufacture of Organic Electroluminescence Device A)

ITO of a thickness of about 1,500 Å was patterned on a glass substrate, and then, was washed with ultra-pure water, cleaned with ultrasonic waves, exposed to UV for about 30 minutes, and then, treated with ozone. Then, HAT-CN was deposited to a thickness of about 100 Å, α-NPD was deposited to a thickness of about 800 Å, and mCP was deposited to a thickness of about 50 Å to form a hole transport region.

Then, an emission layer was formed by co-depositing the Example Compound or the Comparative Compound with mCBP in a ratio of 1:99 to form a layer with a thickness of about 200 Å. For example, the emission layer formed by the co-deposition was obtained by mixing Compounds 1, 9, 30, 31, 12, and 65 with mCBP in Example 1 to Example 6, respectively, and Comparative Compound C1 and Comparative Compound C2 with mCBP in Comparative Example 1 and Comparative Example 2, respectively, and depositing the mixture as a layer.

After that, on the emission layer, a layer with a thickness of about 100 Å was formed using BmPyPhB, a layer with a thickness of about 300 Å was formed using TPBi, and a layer with a thickness of about 50 Å was formed using LiQ to form an electron transport region. Then, a second electrode with a thickness of about 1,000 Å was formed using aluminum (Al).

In embodiments, the hole transport region, the emission layer, the electron transport region, and the second electrode were formed using a vacuum deposition apparatus.

(Evaluation of Properties of Organic Electroluminescence Device A)

The evaluation results of the organic electroluminescence devices of Example 1 to Example 6, and Comparative Example 1 and Comparative Example 2 are shown in Table 2. In Table 2, the emission efficiency and half life of the organic electroluminescence devices thus manufactured are compared and shown. In the evaluation results of the properties for the Examples and the Comparative Example shown in Table 2, the emission efficiency represents a current efficiency value at a current density of about 5 mA/cm$^2$, and half life represents the time required for the luminance to decrease by half from an initial luminance of about 100 cd/m$^2$.

TABLE 2

| Division | Dopant material | Emission efficiency (EQE) (%) | Half life (hrs) |
|---|---|---|---|
| Example 1 | Compound 1 | 10.8 | 6.9 |
| Example 2 | Compound 9 | 10.2 | 16.5 |
| Example 3 | Compound 30 | 18.4 | 33.4 |
| Example 4 | Compound 31 | 15.6 | 39.8 |
| Example 5 | Compound 12 | 11.6 | 4.2 |
| Example 6 | Compound 65 | 12.6 | 4.4 |
| Comparative Example 1 | Comparative Compound C1 | 4.8 | 2.2 |
| Comparative Example 2 | Comparative Compound C2 | 9.8 | 0.8 |

Referring to the results of Table 2, the organic electroluminescence devices of Example 1 to Example 6 were found to show higher efficiency and longer life characteristics when compared with the organic electroluminescence devices of Comparative Example 1 and Comparative Example 2.

Comparative Compound C1 does not include an azasiline group substituent when compared with the compounds used in the Examples, and when comparing Example 1 to Example 6 with Comparative Example 1, improved emission efficiency and life characteristics were observed in Examples 1 to 6 including a polycyclic hetero group such as azasiline as a substituent among the compounds used as the material for an emission layer.

Comparative Compound C2 includes a azasiline group substituent as the compounds used in the Examples, but the Si was substituted with methyl groups, while the compounds used in Example 1 to Example 6 were substituted at Si with phenyl or isopropyl groups. Since a diphenylsilylene group (or isopropyl group) is stable (e.g., more stable) when compared with a dimethylsilylene group, the lifetime of Example 1 to Example 6 was increased compared with Comparative Example 2.

As shown in the Examples, when a heavy atom is included in a substituent that is substituted at a polycyclic hetero group in the compounds used in the emission layer, a reverse intersystem crossing (RISC) phenomenon between a triplet and a singlet energy state may be facilitated, and emission efficiency may be subsequently improved. In addition, due to the substituent having a heavy atom, life characteristics were improved.

2-2. Example B of Organic Electroluminescence Device

Embodiments of an organic electroluminescence device including the compound of an embodiment in an emission layer were manufactured by a method described below. The organic electroluminescence device of Example 7 was manufactured using Compound 67 as the dopant material of the emission layer. The organic electroluminescence devices of Comparative Example 3 to Comparative Example 6 were manufactured using Comparative Compounds C3 to C6 as the dopant materials of an emission layer.

The compounds used in Example 7 and Comparative Example 3 to Comparative Example 6 are shown in Table 3:

TABLE 3

Compound 67

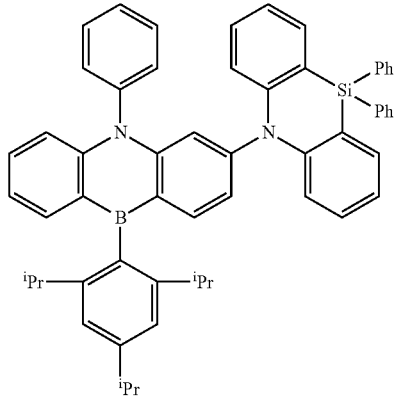

67

Comparative Compound C3

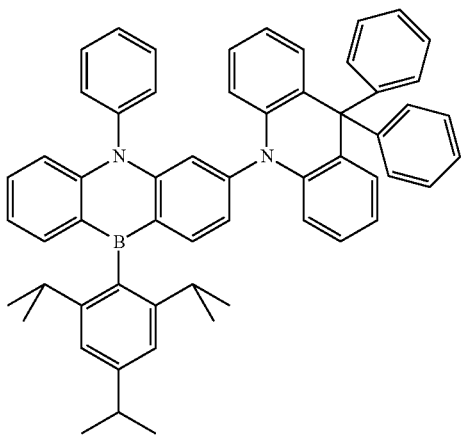

C3

TABLE 3-continued

Comparative Compound C4

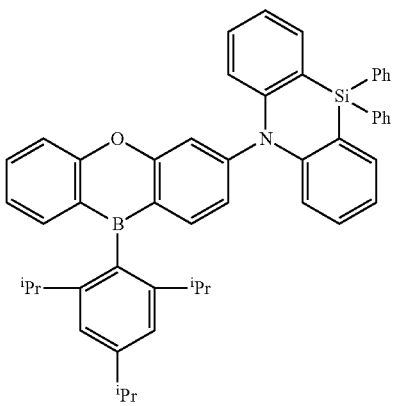

C4

Comparative Compound C5

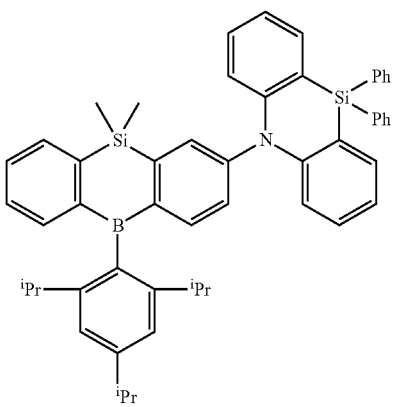

C5

Comparative Compound C6

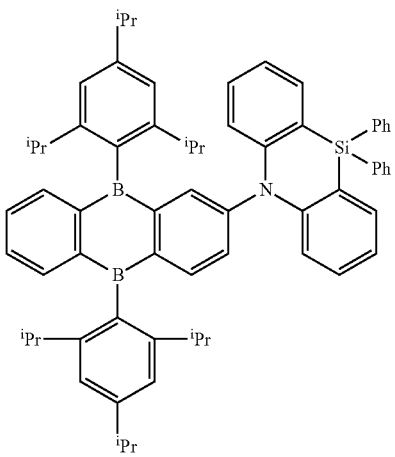

C6

(Manufacture of Organic Electroluminescence Device B)

ITO of a thickness of about 1,500 Å was patterned on a glass substrate, and then, was washed with ultra-pure water, cleaned with ultrasonic waves, exposed to UV for about 30 minutes, and then, treated with ozone. Then, HAT-CN was deposited to a thickness of about 100 Å, α-NPD was deposited to a thickness of about 800 Å, and mCP was deposited to a thickness of about 50 Å to form a hole transport region.

Then, an emission layer was formed by co-depositing the Example Compound or the Comparative Compound with DPEPO in a ratio of 20:80 to form a layer with a thickness of about 200 Å. That is, the emission layer formed by the co-deposition was obtained by mixing Compound 67 with DPEPO in Example 7, and Comparative Compound C3 to Comparative Compound C6 with DPEPO in Comparative Example 3 to Comparative Example 6, respectively, and depositing the mixture as a layer.

After that, on the emission layer, a layer with a thickness of about 100 Å was formed using DPEPO, a layer with a thickness of about 300 Å was formed using TPBi, and a layer with a thickness of about 50 Å was formed using LiQ to form an electron transport region. Then, a second electrode with a thickness of about 1,000 Å was formed using aluminum (Al).

In each of the embodiments, the hole transport region, the emission layer, the electron transport region, and the second electrode were each formed using a vacuum deposition apparatus.

(Evaluation of Properties of Organic Electroluminescence Device B)

The evaluation results of the organic electroluminescence devices in Example 7, and Comparative Example 3 to Comparative Example 6 are shown in Table 4. In Table 4, the emission efficiency and half life of the organic electroluminescence devices thus manufactured are compared and shown. In the evaluation results of the properties for the Example and the Comparative Examples shown in Table 4, the Emission efficiency represents a current efficiency value at a current density of about 5 mA/cm$^2$, and Half life represents the time required for the luminance to decrease by half from an initial luminance of about 100 cd/m$^2$.

TABLE 4

| Division | Dopant material | Emission efficiency (EQE) (%) | Half life (hrs) |
| --- | --- | --- | --- |
| Example 7 | Compound 67 | 19.6 | 3.9 |
| Comparative Example 3 | Comparative Compound C3 | 11.4 | 0.2 |
| Comparative Example 4 | Comparative Compound C4 | 16.8 | 2.9 |
| Comparative Example 5 | Comparative Compound C5 | 16.2 | 0.6 |
| Comparative Example 6 | Comparative Compound C6 | 18.5 | 0.9 |

Referring to the results of Table 4, the organic electroluminescence device of Example 7 was found to show higher efficiency and longer life characteristics when compared with the organic electroluminescence devices of Comparative Example 3 to Comparative Example 6.

Comparative Compound C3 includes an acridan group instead of an azasiline group as the polycyclic hetero group compound when compared with Compound 67 used in the Example, and when comparing Example 7 with Comparative Example 3, improved emission efficiency and life characteristics were shown.

In addition, Comparative Compound C4 to Comparative Compound C6 included an azasiline group substituent as in the compound used in Example 7, but were different in using O, Si, B, etc., instead of a nitrogen atom in the azaborine moiety corresponding to a core part. Referring to the results of Example 7 and Comparative Example 4 to Comparative Example 6, a case where an azaborine moiety was included in a core part corresponding to an electron donor, life characteristics were improved when compared with a case where O, Si, B, etc. were used instead of N as a heteroatom.

The compound of an embodiment may show excellent emission efficiency and improved life characteristics by having a core part including an azaborine moiety, and an azasiline group or azagermine group having a large molecular weight as a substituent, and easily generating reverse intersystem crossing. The organic electroluminescence device of an embodiment includes the compound of an embodiment in an emission layer so as to have narrow half width in a light-emitting wavelength region, and show excellent color characteristics, high emission efficiency and long life characteristics.

The organic electroluminescence device of an embodiment may show improved device properties of long life and high efficiency.

The compound of an embodiment is included in an emission layer of an organic electroluminescence device, and may contribute to the increase of the life and efficiency of the organic electroluminescence device.

As used herein, the term "about" and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure".

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the exemplary embodiments of the present invention have been described, it is understood that the present invention should not be limited to these exemplary embodiments, but that various changes and modifications can be made by one ordinary skilled in the art within the spirit and scope of the present invention as defined by the following claims and equivalents thereof.

What is claimed is:

1. An organic electroluminescence device, comprising:

a first electrode;

a second electrode on the first electrode; and an emission layer between the first electrode and the second electrode, wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxide thereof, and wherein the emission layer comprises a compound represented by Formula 1:

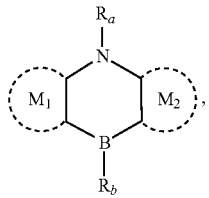

[Formula 1]

wherein in Formula 1, $M_1$ and $M_2$ are each independently a substituted or unsubstituted hydrocarbon ring of 5 to 30 carbon atoms to form a ring, or a substituted or unsubstituted heterocycle of 2 to 30 carbon atoms to form a ring, $R_a$ is a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted silyl group, a substituted or unsubstituted carbonyl group, a substituted or unsubstituted oxy group, a substituted or unsubstituted thio group, a substituted or unsubstituted boryl group, a substituted or unsubstituted phosphinyl group, a substituted or unsubstituted phosphineoxy group, a substituted or unsubstituted phosphine sulfide group, a substituted or unsubstituted sulfonyl group, or a substituted or unsubstituted sulfinyl group, $R_b$ is a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted oxy group, a substituted or unsubstituted thio group, or a substituted or unsubstituted amino group, $R_a$ and/or $R_b$ are optionally combined with $M_1$ or $M_2$ to form a ring, and one substituent from among all substituents of $M_1$ and/or one substituent from among all substituents of $M_2$ is a polycyclic hetero group represented by Formula 2:

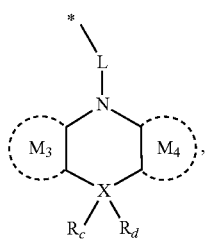

[Formula 2]

wherein in Formula 2,
X is Si or Ge,
$M_3$ and $M_4$ are each independently a substituted or unsubstituted hydrocarbon ring of 5 to 30 carbon atoms to form a ring, or a substituted or unsubstituted heterocycle of 2 to 30 carbon atoms to form a ring, and $M_3$ and $M_4$ are not combined with $R_a$ or $R_b$ to form a ring, L is a direct linkage, a substituted or unsubstituted arylene group of 6 to 30 carbon atoms to form a ring, or a substituted or unsubstituted heteroarylene group of 2 to 30 carbon atoms to form a ring, and $R_c$ and $R_d$ are each independently a substituted or unsubstituted alkyl group of 3 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted oxy group, a substituted or unsubstituted thio group, or a substituted or unsubstituted amino group, or $R_c$ and $R_d$ are combined with each other to form a substituted or unsubstituted hydrocarbon ring of 5 to 30 carbon atoms to form a ring, or a substituted or unsubstituted heterocycle of 2 to 30 carbon atoms to form a ring, and wherein in $M_1$ and $M_2$, a substituent of the substituted hydrocarbon ring and a substituent of the substituted heterocycle are each independently selected from the group consisting of the polycyclic hetero group represented by Formula 2, a deuterium atom, a halogen atom, a substituted or unsubstituted linear alkyl group of 1 to 20 carbon atoms, a substituted or unsubstituted branched alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted amino group, a substituted or unsubstituted silyl group, a substituted or unsubstituted carbonyl group, a substituted or unsubstituted oxy group, and a substituted or unsubstituted thio group.

2. The organic electroluminescence device of claim 1, wherein Formula 1 is represented by Formula 1-1 or Formula 1-2:

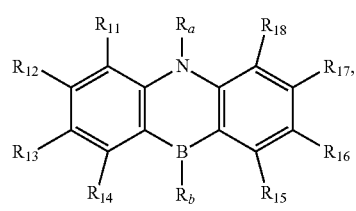

[Formula 1-1]

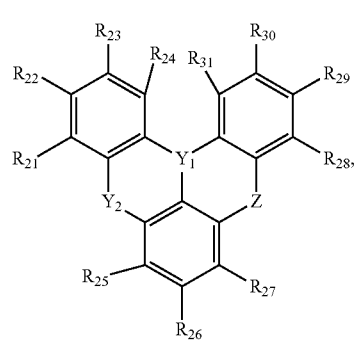

[Formula 1-2]

wherein in Formula 1-2, $Y_1$ is B and $Y_2$ is $NR_a$, or $Y_1$ is N and $Y_2$ is $BR_b$, Z is a direct linkage, O, S, C=O, $BR_e$, $NR_f$, $CR_gR_h$, $SiR_iR_j$, $Ge_R_kR_l$, $POR_m$, $PSR_n$, SO, or $SO_2$, and $R_e$ to $R_n$ are each independently a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, or a substituted or unsubstituted heteroaryl group of 2 to 30 carbon atoms to form a ring, wherein in Formula 1-1 and Formula 1-2, $R_{11}$ to $R_{18}$ and $R_{21}$ to $R_{27}$ are each independently a hydrogen atom, a deuterium atom, a halogen atom, a substituted or unsubstituted linear alkyl group of 1 to 20 carbon atoms, a substituted or unsubstituted branched alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted amino group, a substituted or unsubstituted silyl group, a substituted or unsubstituted carbonyl group, a substituted or unsubstituted oxy group, or a substituted or unsubstituted thio group, or are combined with an adjacent group to form a fused ring, $R_{28}$ to $R_{31}$ are each independently a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted amino group, a substituted or unsubstituted silyl group, a substituted or unsubstituted carbonyl group, a substituted or unsubstituted oxy group, or a substituted or unsubstituted thio group, or are combined with an adjacent group to form a fused ring, one of $R_{11}$ to $R_{18}$ or a substituent of the fused ring formed from $R_{11}$ to $R_{18}$ is the polycyclic hetero group represented by Formula 2, one of $R_{21}$ to $R_{31}$ or a substituent of the fused ring formed from $R_{21}$ to $R_{31}$ is the polycyclic hetero group represented by Formula 2, and $R_a$ and $R_b$ are the same as defined in Formula 1.

3. The organic electroluminescence device of claim 1, wherein Formula 2 is represented by Formula 2-1 or Formula 2-2:

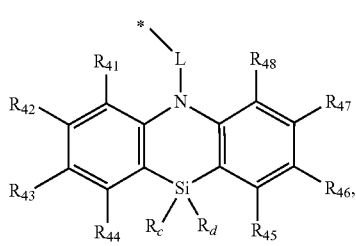

[Formula 2-1]

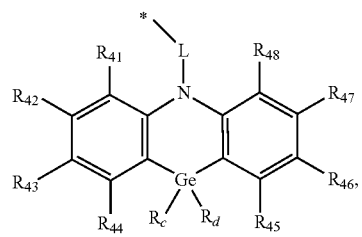

[Formula 2-2]

wherein in Formula 2-1 and Formula 2-2, $R_{41}$ to $R_{48}$ are each independently a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted amino group, a substituted or unsubstituted silyl group, a substituted or unsubstituted carbonyl group, a substituted or unsubstituted oxy group, or a substituted or unsubstituted thio group, and L, $R_c$, and $R_d$ are the same as defined in Formula 2.

4. The organic electroluminescence device of claim 2, wherein Formula 1-1 is represented by Formula 1-1A or Formula 1-1B:

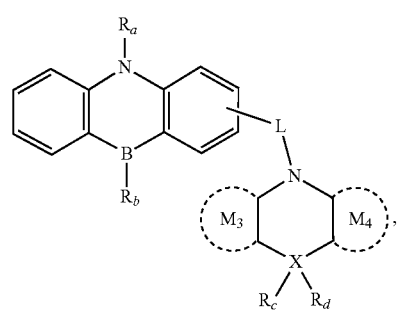

[Formula 1-1A]

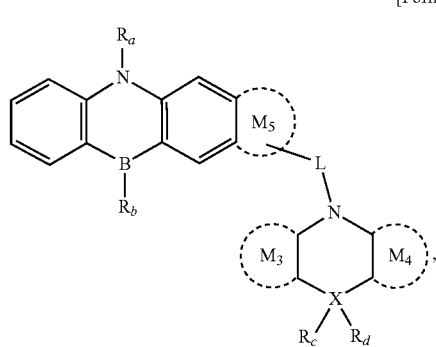

[Formula 1-1B]

wherein in Formula 1-1B, $M_5$ is a substituted or unsubstituted hydrocarbon ring of 5 to 30 carbon atoms to form a ring, or a substituted or unsubstituted heterocycle of 2 to 30 carbon atoms to form a ring, and wherein in Formula 1-1A and Formula 1-1B, $R_a$ and $R_b$ are the same as defined in Formula 1, and X, L, $M_3$, $M_4$, $R_c$, and $R_d$ are the same as defined in Formula 2.

5. The organic electroluminescence device of claim 2, wherein Formula 1-2 is represented by one selected from Formulae 1-2A to 1-2C:

[Formula 1-2A]

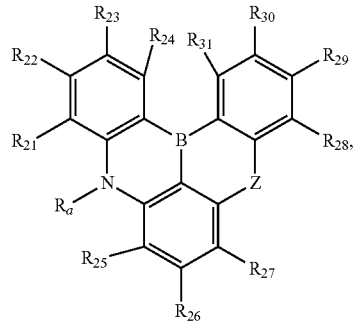

[Formula 1-2B]

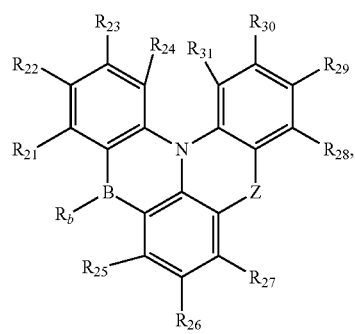

[Formula 1-2C]

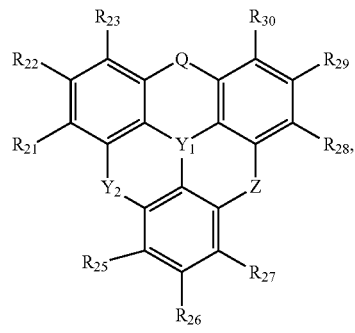

wherein in Formula 1-2C,

Q is direct linkage, O, S, C=O, $BR_g$, or $NR_h$, and $R_g$ and $R_h$ are each independently a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, or a substituted or unsubstituted heteroaryl group of 2 to 30 carbon atoms to form a ring, wherein in Formula 1-2A to Formula 1-2C, $R_a$, $R_b$, $Y_1$, $Y_2$, Z, and $R_{21}$ to $R_{31}$ are the same as defined in Formula 1-2.

6. The organic electroluminescence device of claim 2, wherein Formula 1-2 is represented by one selected from Formula 1-2D to Formula 1-2F:

[Formula 1-2D]

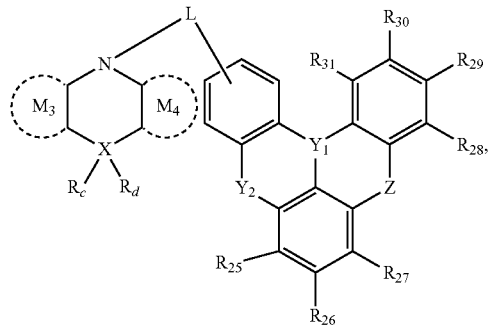

[Formula 1-2E]

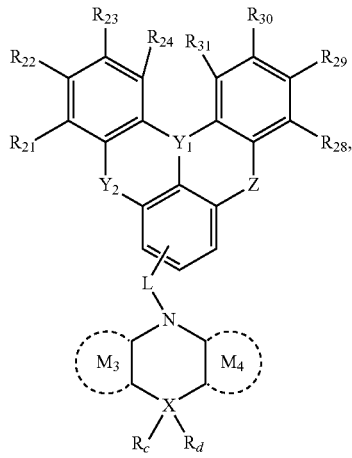

[Formula 1-2F]

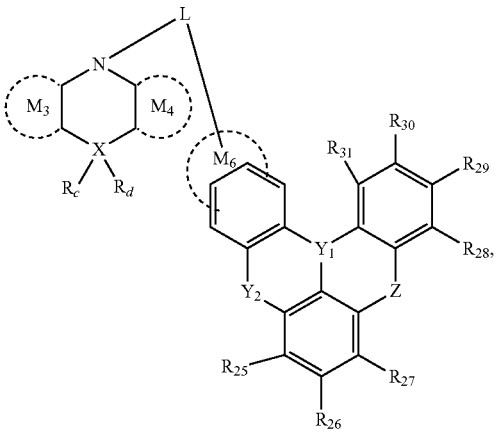

wherein in Formula 1-2F, $M_6$ is a substituted or unsubstituted hydrocarbon ring of 5 to 30 carbon atoms to form a ring, or a substituted or unsubstituted heterocycle of 2 to 30 carbon atoms to form a ring, and in Formula 1-2D to Formula 1-2F, $R_{21}$ to $R_{31}$, $Y_1$, $Y_2$, and Z are the same as defined in Formula 1-2, and X, L, $M_3$, $M_4$, $R_c$, and $R_d$ are the same as defined in Formula 2.

7. The organic electroluminescence device of claim 1, wherein the emission layer is to emit delayed fluorescence.

8. The organic electroluminescence device of claim 1, wherein the emission layer is a delayed fluorescence emission layer comprising a host and a dopant, and the dopant comprises the compound represented by Formula 1.

9. The organic electroluminescence device of claim 1, wherein the emission layer is to emit blue light having a peak emission wavelength of 430 nm to 490 nm.
10. The organic electroluminescence device of claim 1, wherein the emission layer comprises at least one compound selected from Compound Group 1:
[Compound Group 1]
1
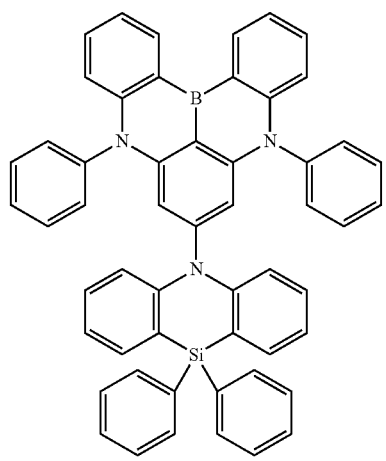
2
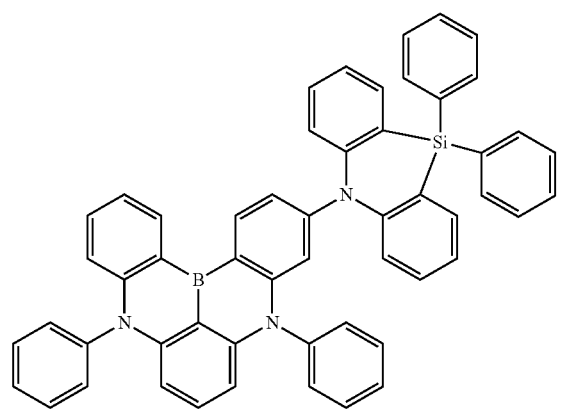
3
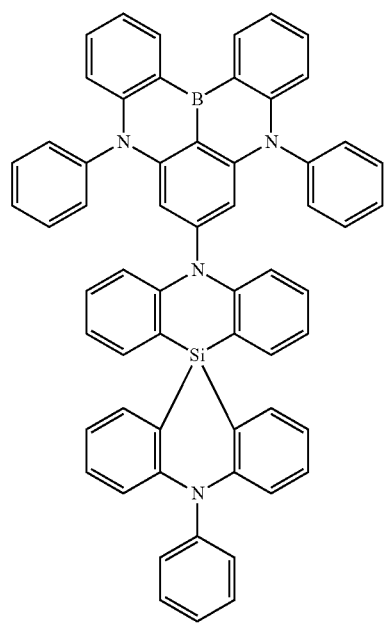
4
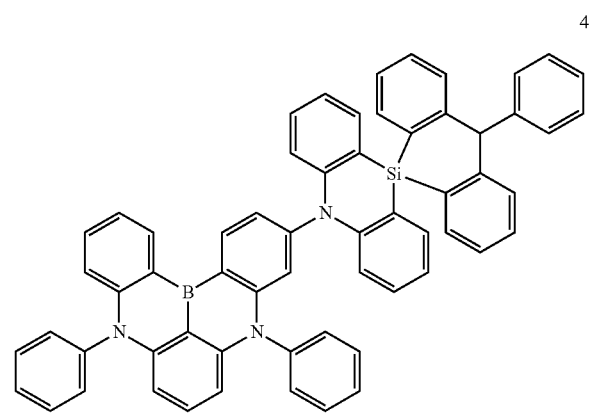
5
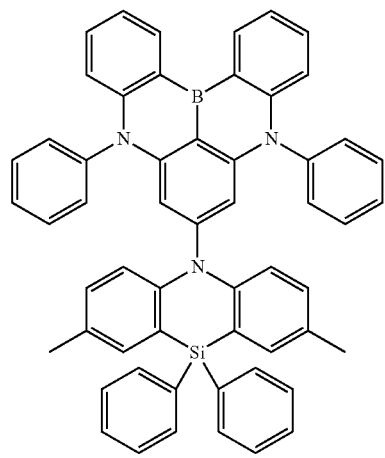

-continued
6
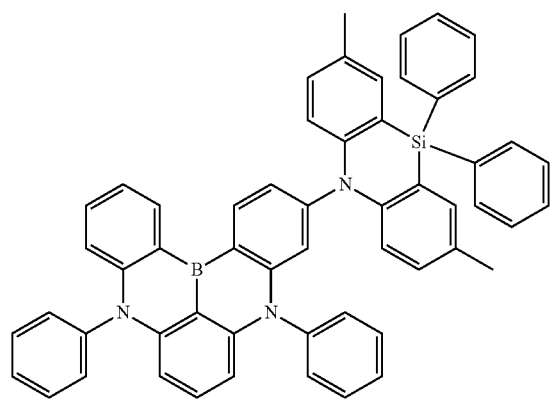
7
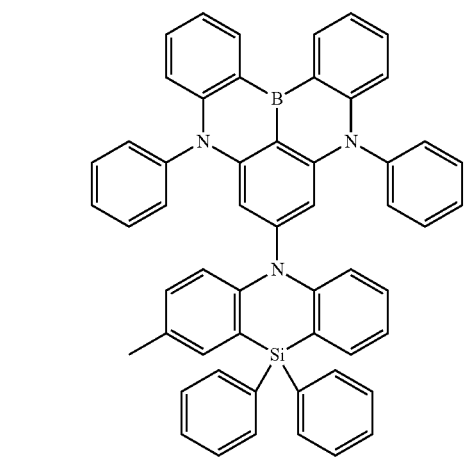
8
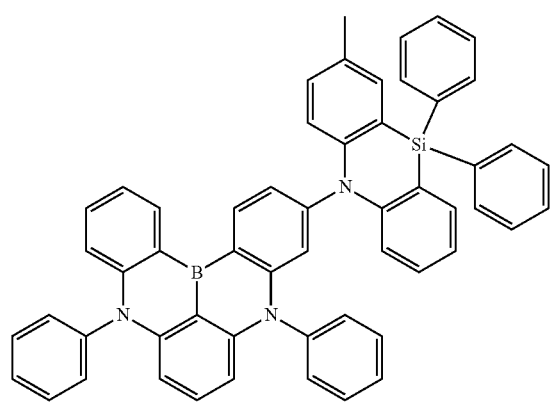
-continued
9
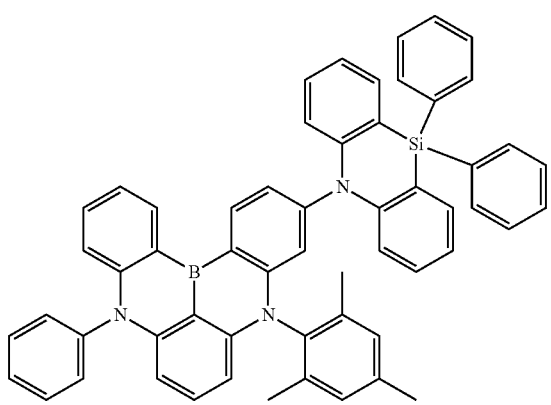
10
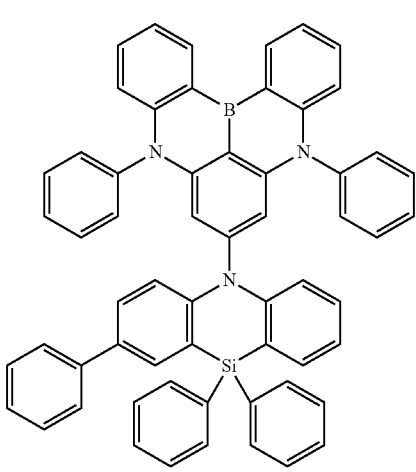
11
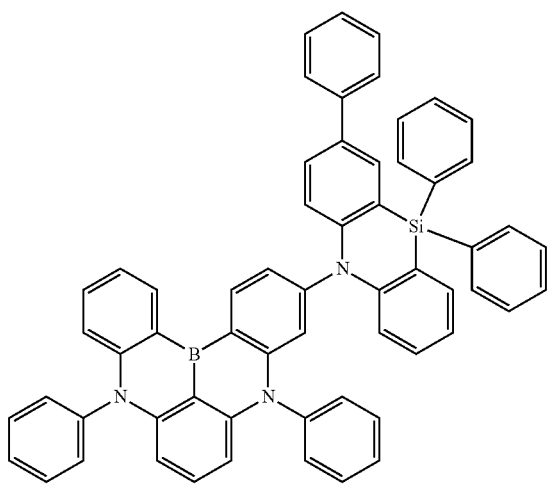

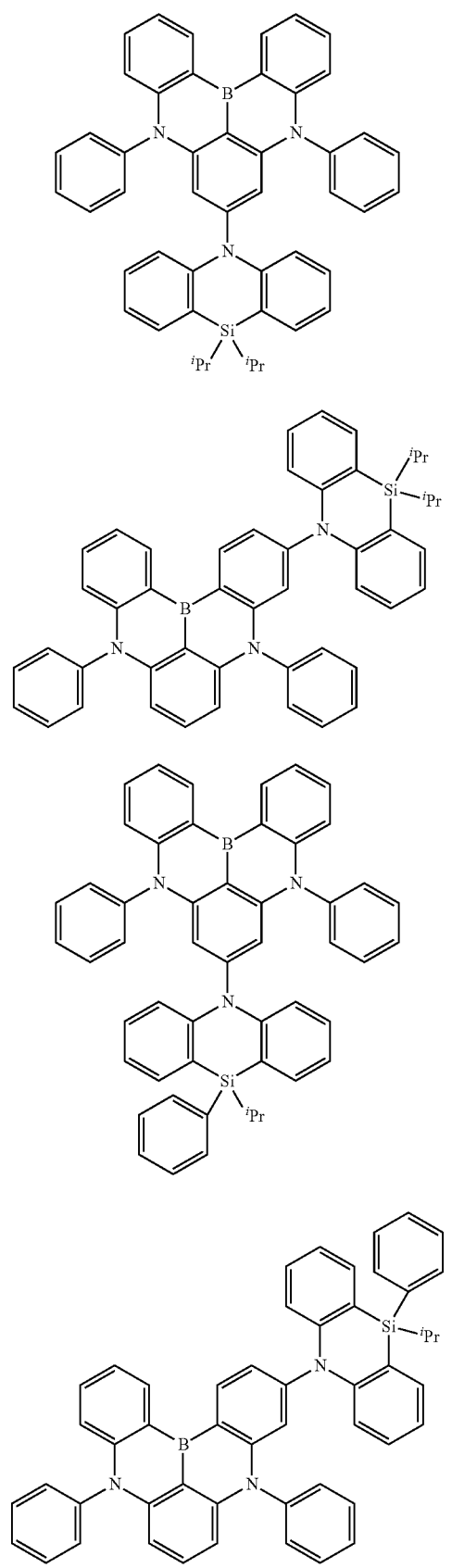
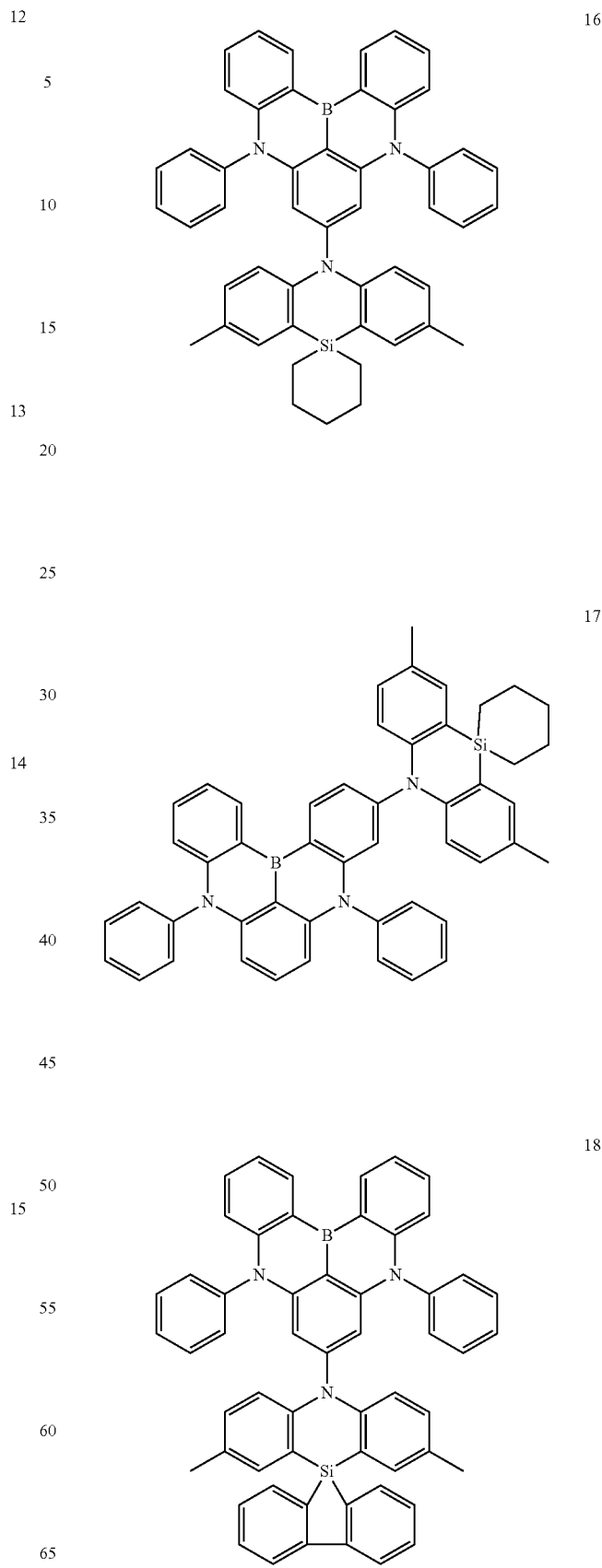

19
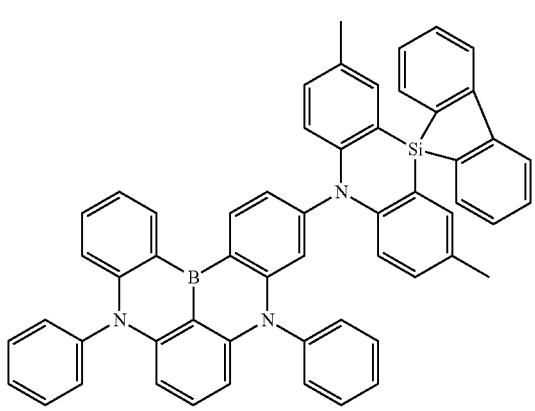
20
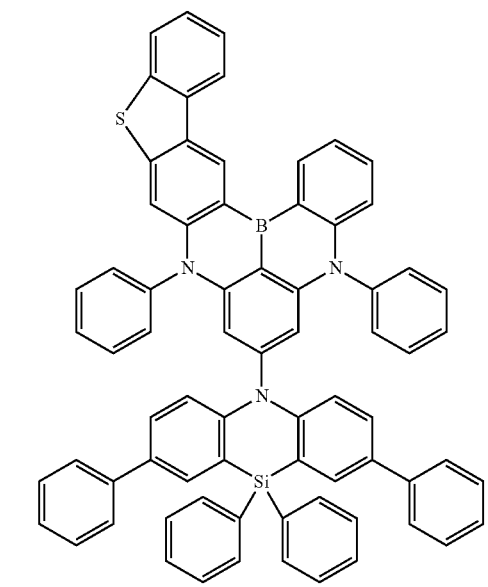
21
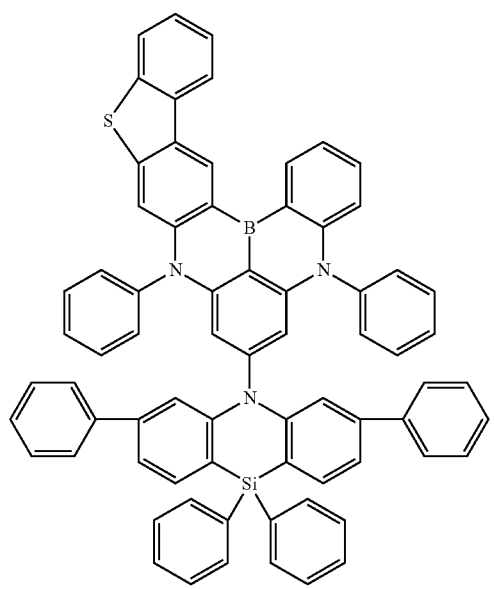
22
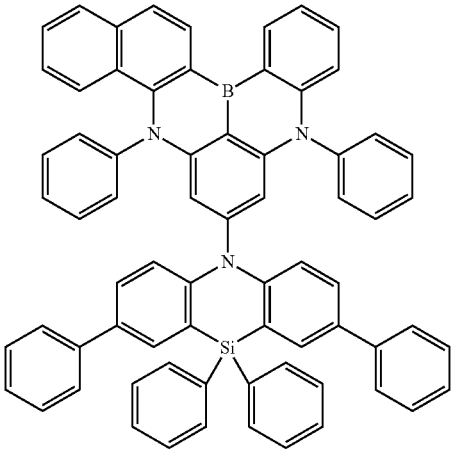
23
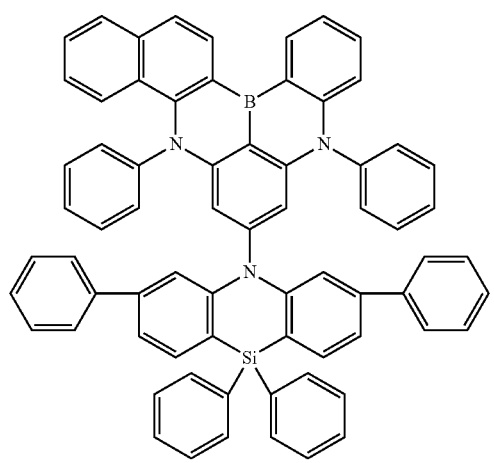
24
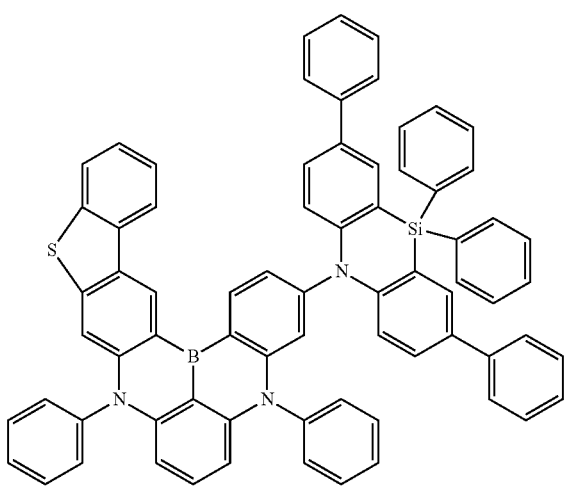

25
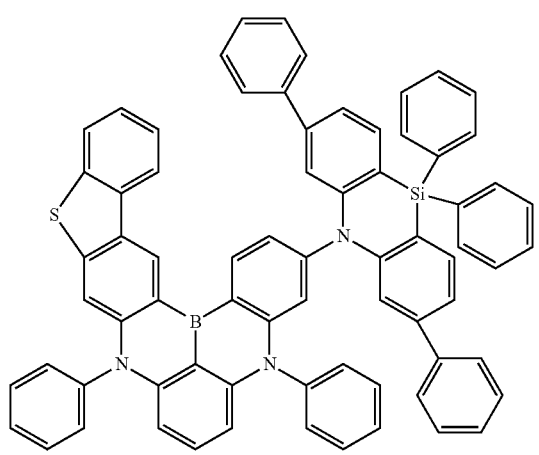
26
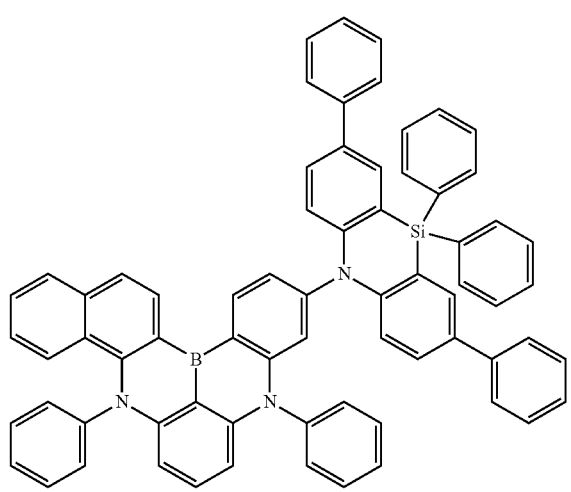
27
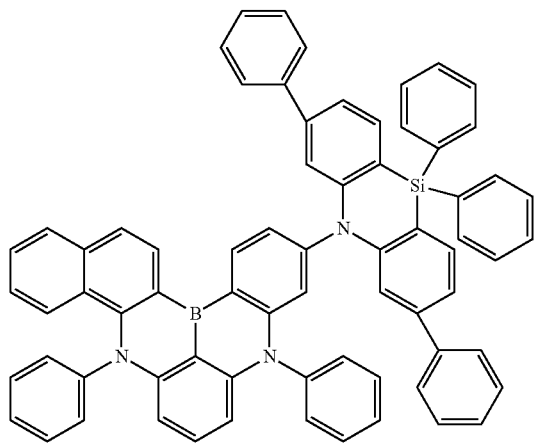
28
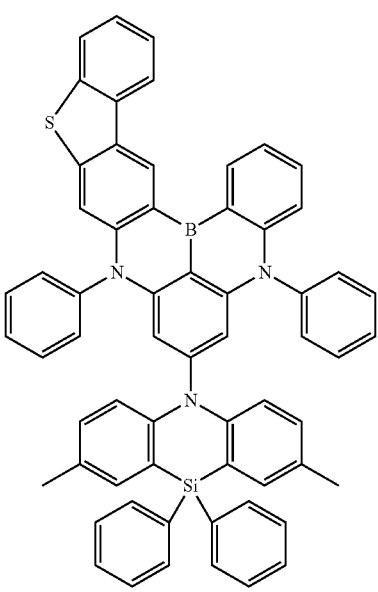
29
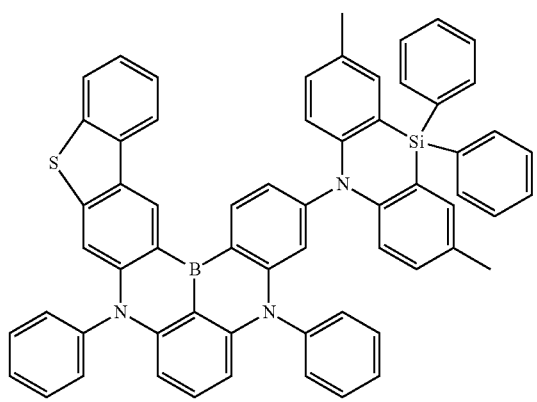
30
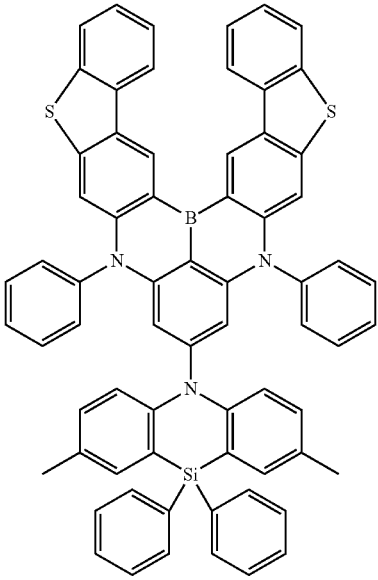

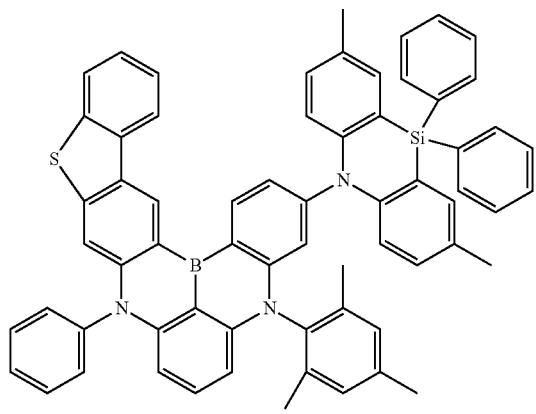
31
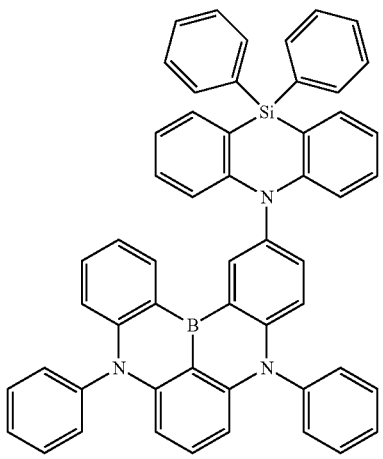
35
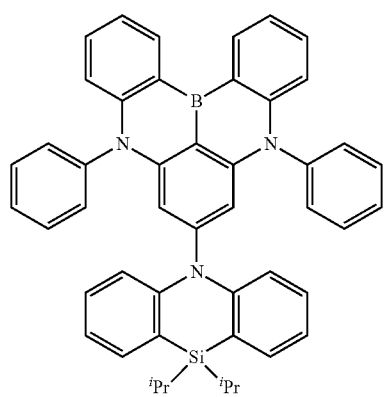
32
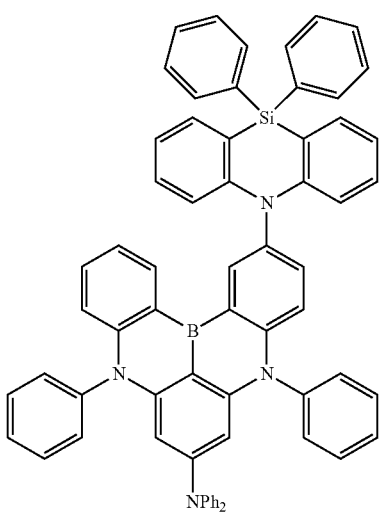
36
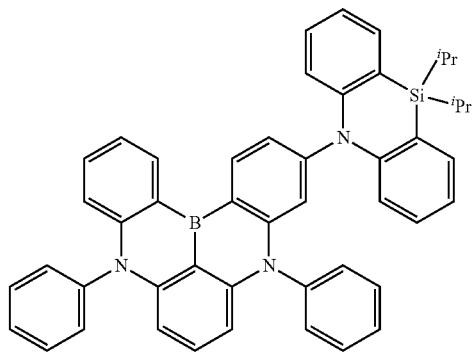
33
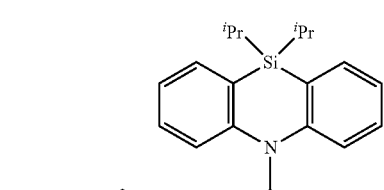
34
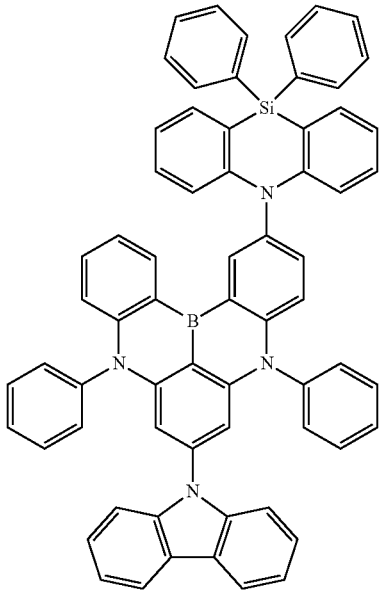
37
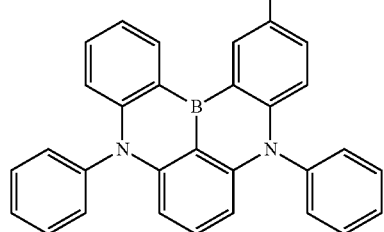

38
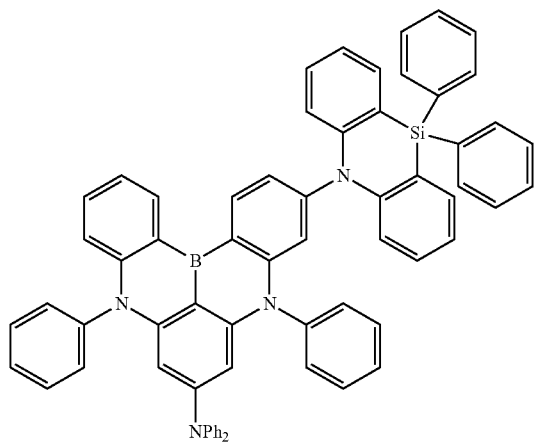
39
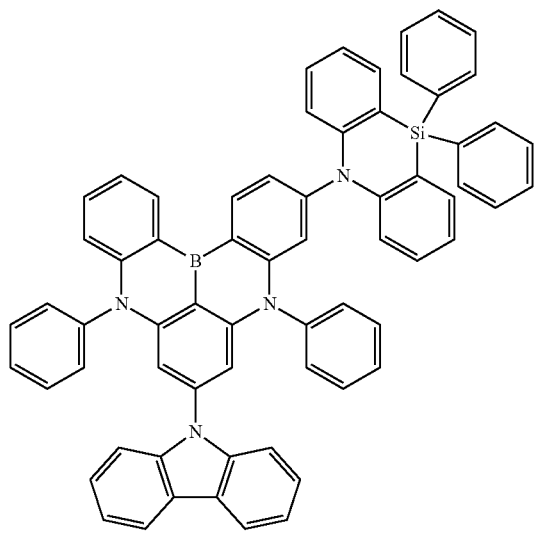
40
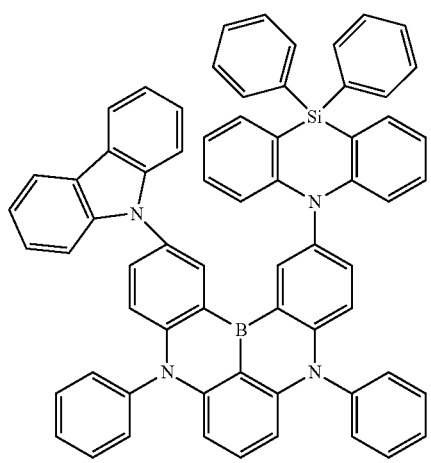
41
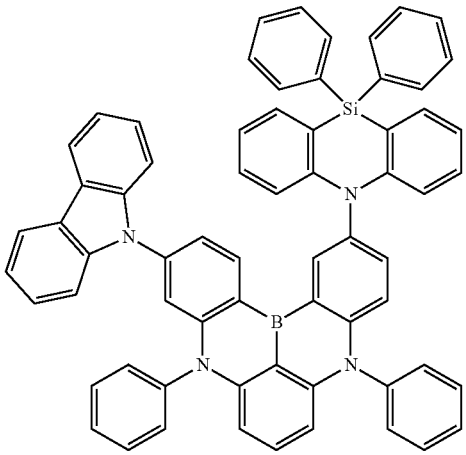
42
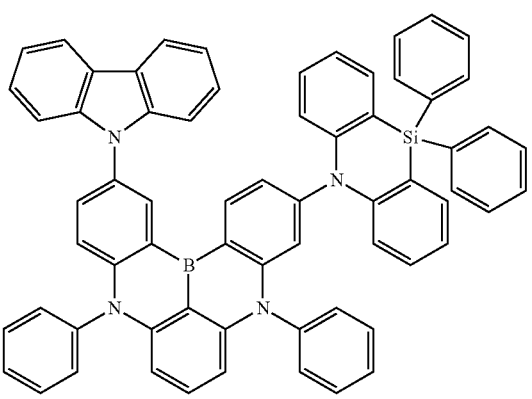
43
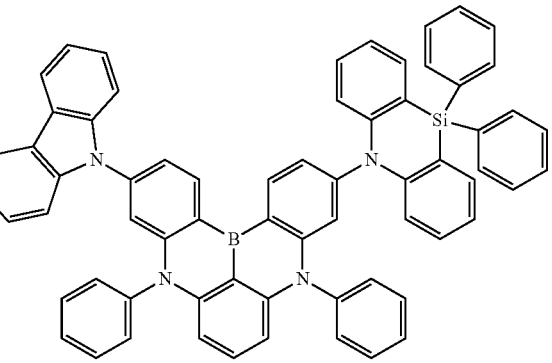

93 94
-continued -continued
44 47
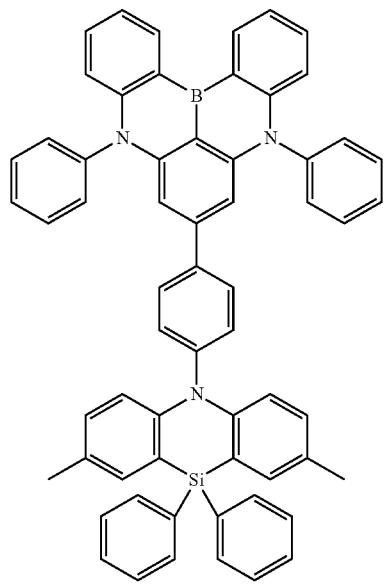
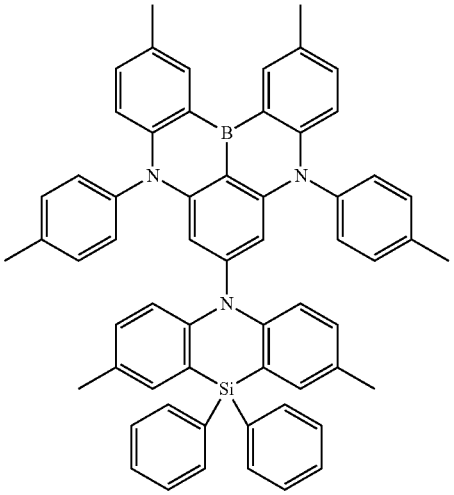
45 48
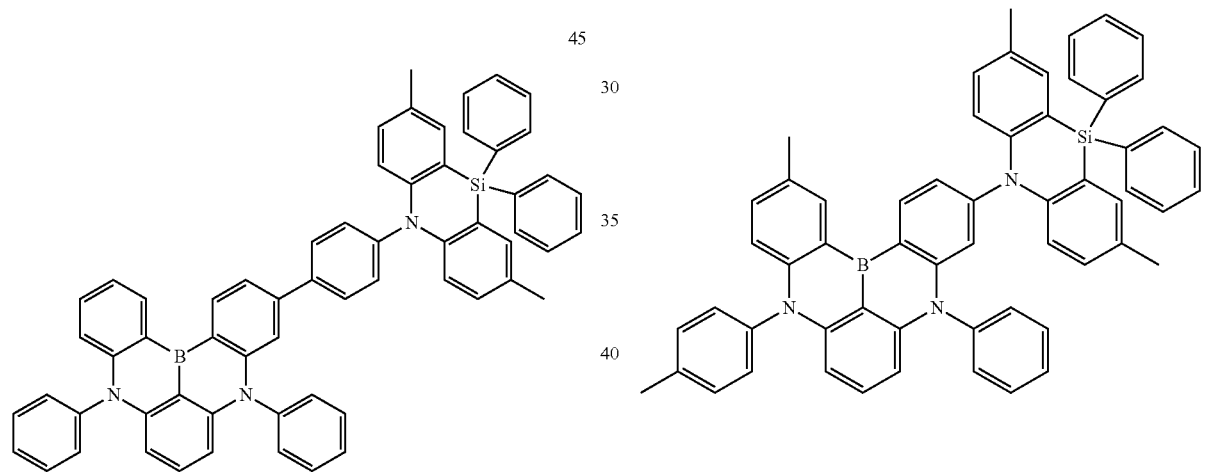
46 49
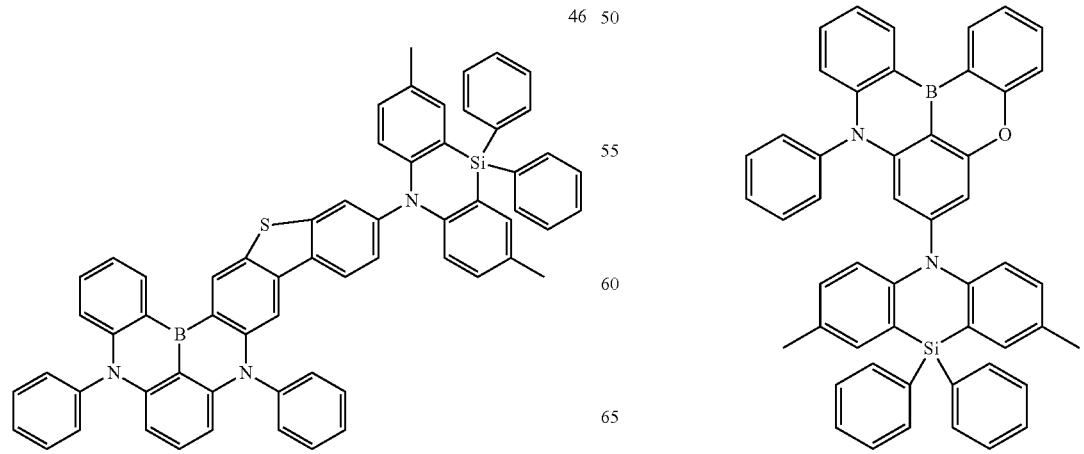

50
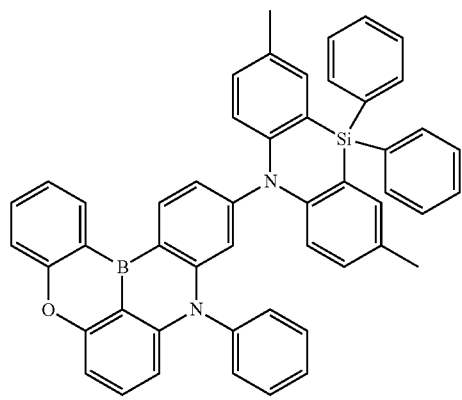
51
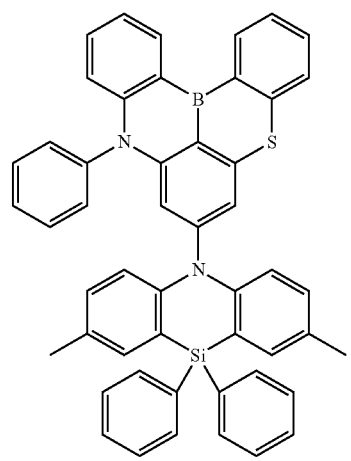
52
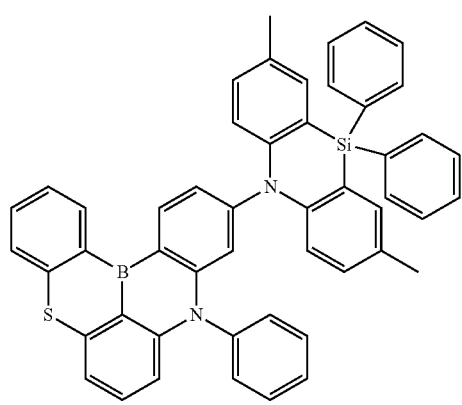
53
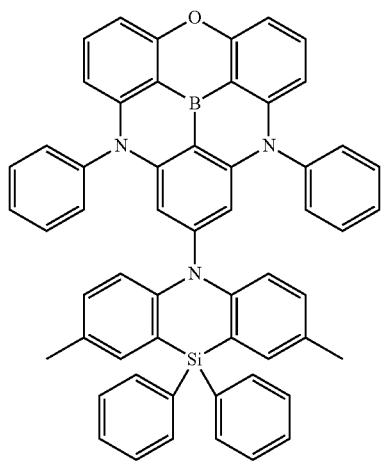
54
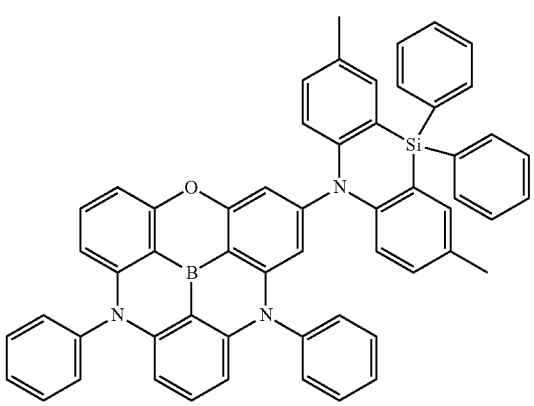
55
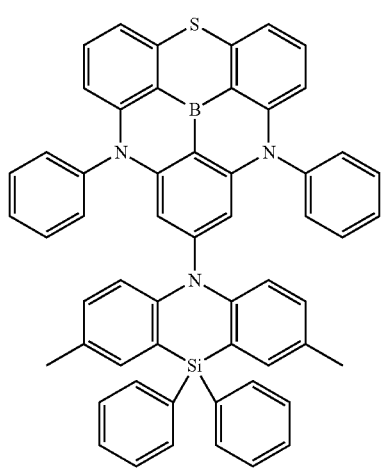

56
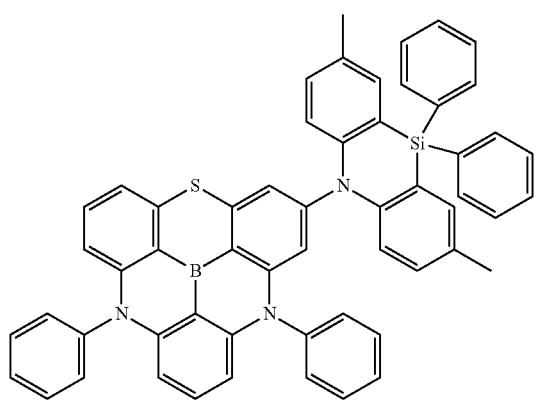
57
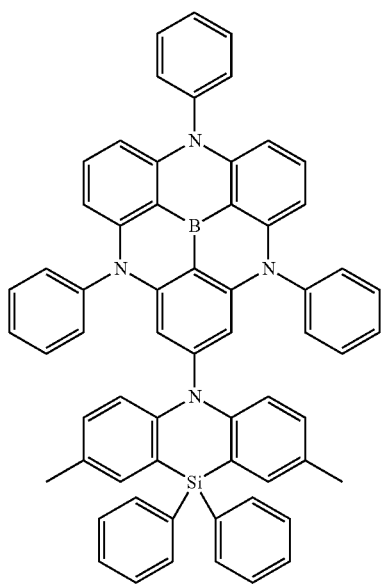
58
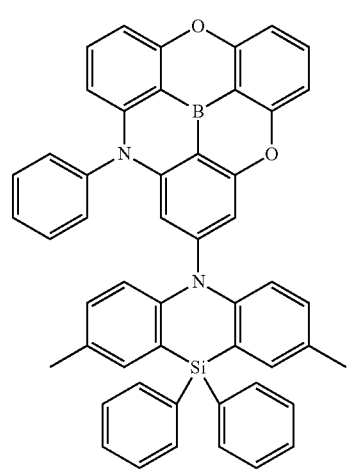
59
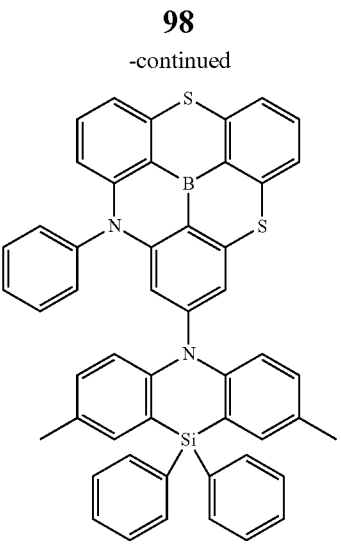
60
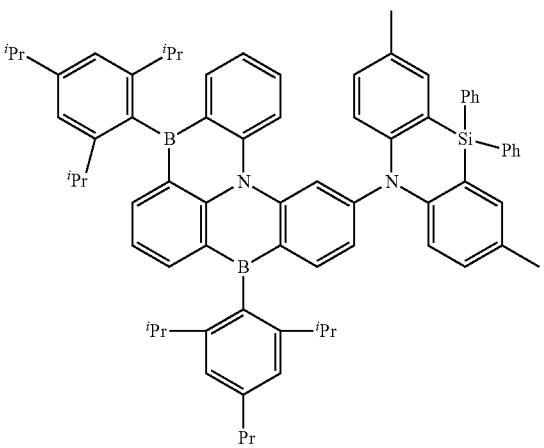
61
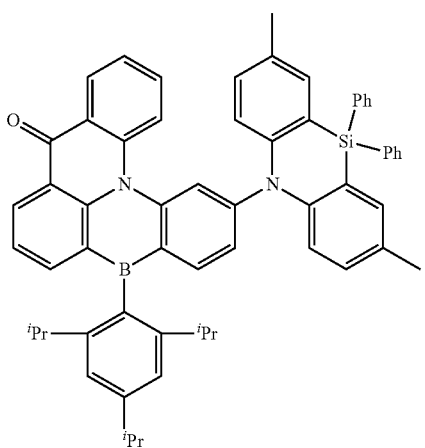

62
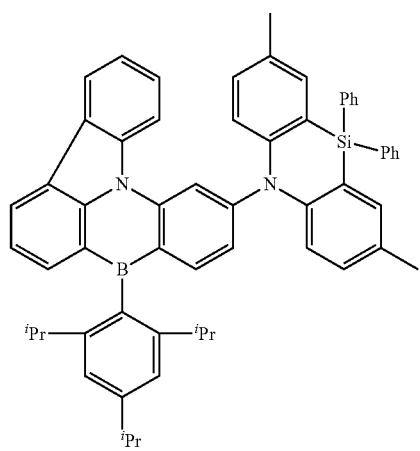
63
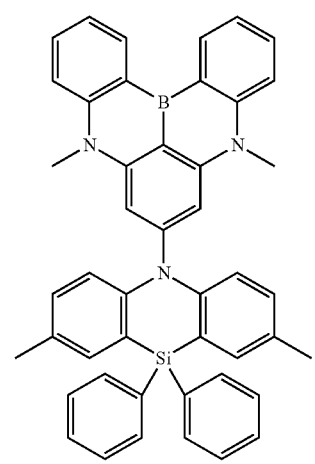
64
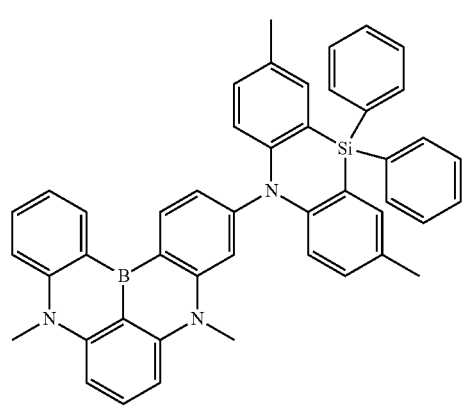
65
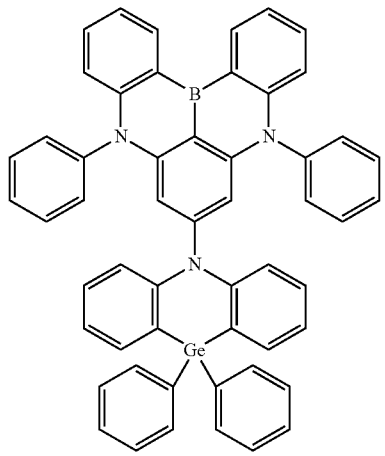
66
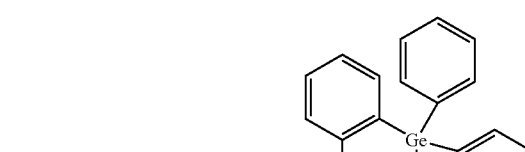
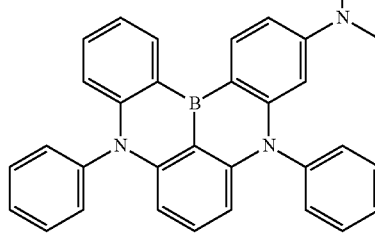
67
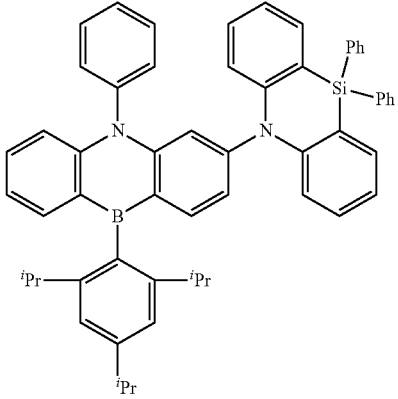
68
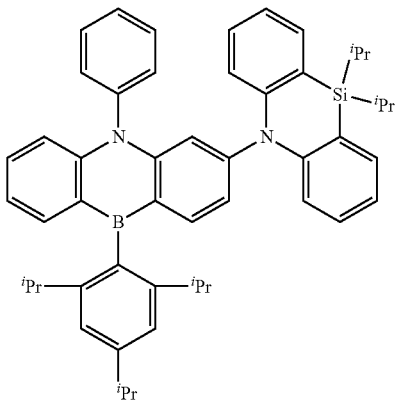

-continued
69
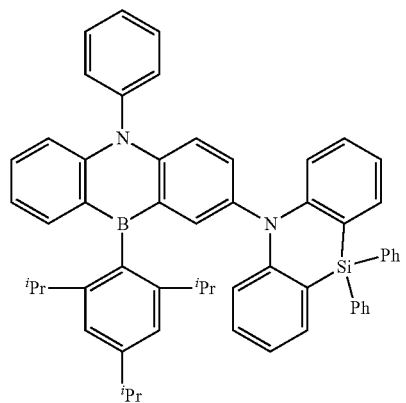
70
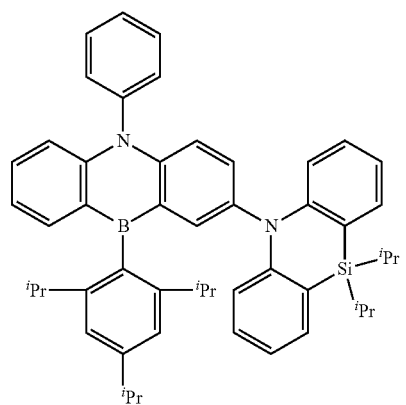
71
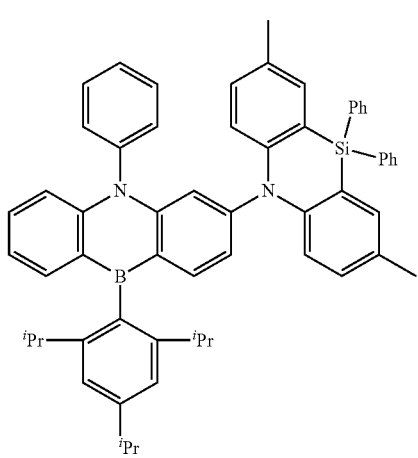
72
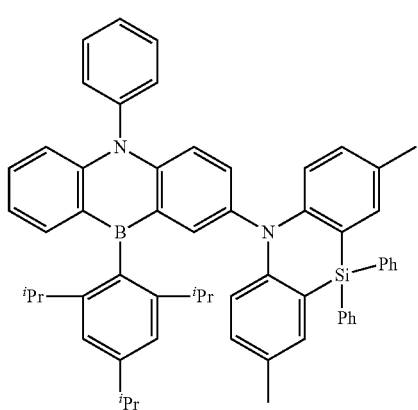
-continued
73
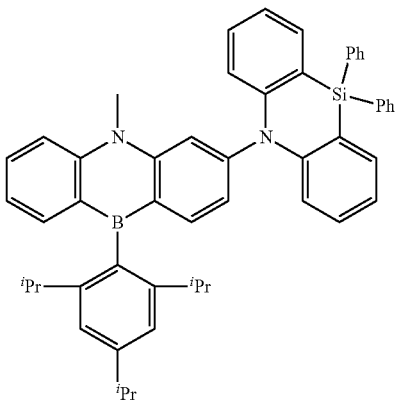
74
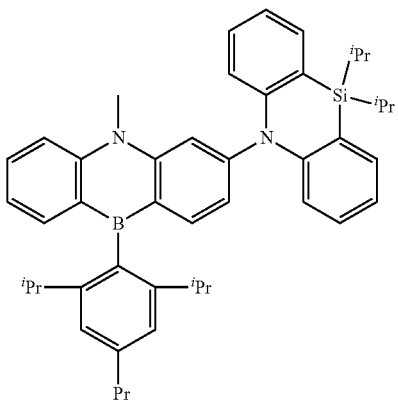
75
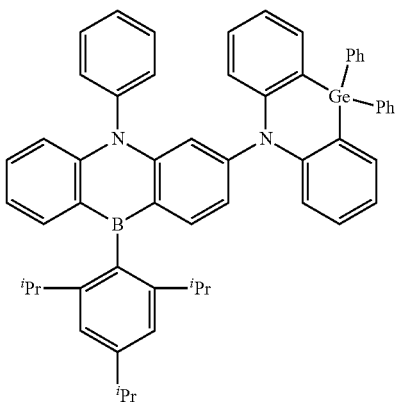
76
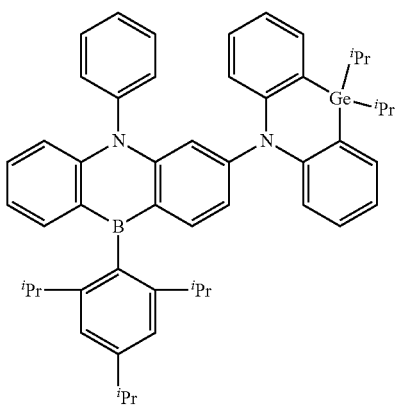

-continued

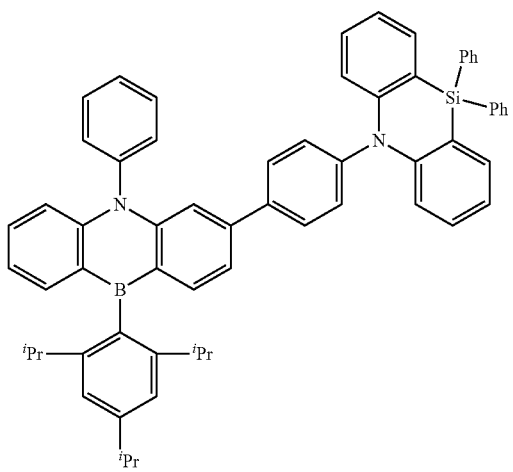

77

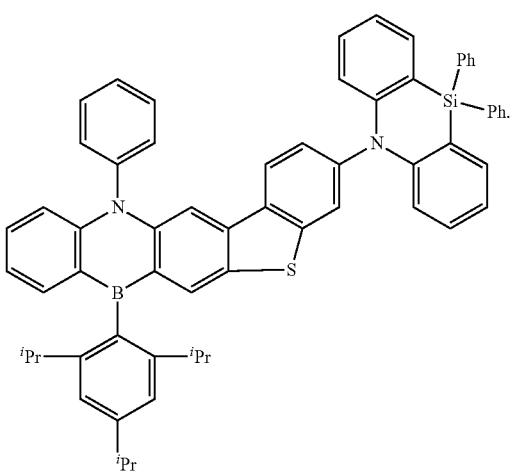

78

11. A compound represented by Formula 1:

[Formula 1]

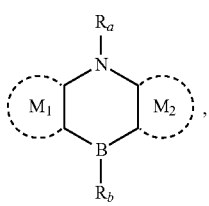

wherein in Formula 1,

M₁ and M₂ are each independently a substituted or unsubstituted hydrocarbon ring of 5 to 30 carbon atoms to form a ring, or a substituted or unsubstituted heterocycle of 2 to 30 carbon atoms to form a ring, $R_a$ is a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted silyl group, a substituted or unsubstituted carbonyl group, a substituted or unsubstituted oxy group, a substituted or unsubstituted thio group, a substituted or unsubstituted boryl group, a substituted or unsubstituted phosphinyl group, a substituted or unsubstituted phosphineoxy group, a substituted or unsubstituted phosphine sulfide group, a substituted or unsubstituted sulfonyl group, or a substituted or unsubstituted sulfinyl group, $R_b$ is a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted oxy group, a substituted or unsubstituted thio group, or a substituted or unsubstituted amino group, $R_a$ and/or $R_b$ are optionally combined with M₁ or M₂ to form a ring, and one substituent from among all substituents of M₁ and/or one substituent from among all substituents of M₂ is a polycyclic hetero group represented by Formula 2:

[Formula 2]

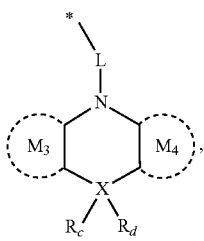

wherein in Formula 2,

X is Si or Ge,

M₃ and M₄ are each independently a substituted or unsubstituted hydrocarbon ring of 5 to 30 carbon atoms to form a ring, or a substituted or unsubstituted heterocycle of 2 to 30 carbon atoms to form a ring, and M₃ and M₄ are not combined with $R_a$ or $R_b$ to form a ring, L is a direct linkage, a substituted or unsubstituted arylene group of 6 to 30 carbon atoms to form a ring, or a substituted or unsubstituted heteroarylene group of 2 to 30 carbon atoms to form a ring, and $R_c$ and $R_d$ are each independently a substituted or unsubstituted alkyl group of 3 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted oxy group, a substituted or unsubstituted thio group, or a substituted or unsubstituted amino group, or $R_c$ and $R_d$ are combined with each other to form a substituted or unsubstituted hydrocarbon ring of 5 to 30 carbon atoms to form a ring, or a substituted or unsubstituted heterocycle of 2 to 30 carbon atoms to form a ring, and wherein in M₁ and M₂, a substituent of the substituted hydrocarbon ring and a substituent of the substituted heterocycle are each independently selected from the group consisting of the polycyclic hetero group represented by Formula 2, a deuterium atom, a halogen atom, a substituted or unsubstituted linear alkyl group of 1 to 20 carbon atoms, a substituted or unsubstituted branched alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted amino group, a substituted or unsubstituted silyl group, a substituted or unsubstituted carbonyl group, a substituted or unsubstituted oxy group, and a substituted or unsubstituted thio group.

12. The compound of claim 11, wherein Formula 1 is represented by Formula 1-1 or Formula 1-2:

[Formula 1-1]

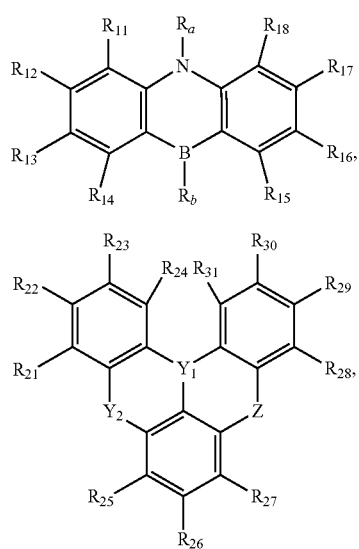

[Formula 1-2]

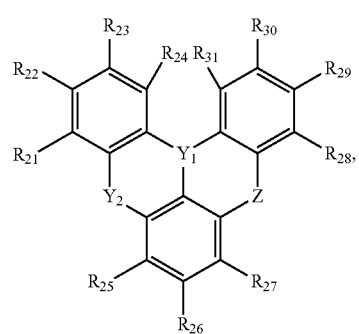

wherein in Formula 1-2, $Y_1$ is B and $Y_2$ is $NR_a$, or $Y_1$ is N and $Y_2$ is $BR_b$, Z is a direct linkage, O, S, C=O, $BR_e$, $NR_f$, $CR_gR_h$, $SiR_iR_j$, $G_eR_kR_l$, $POR_m$, $PSR_n$, SO, or $SO_2$, and $R_e$ to $R_n$ are each independently a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, or a substituted or unsubstituted heteroaryl group of 2 to 30 carbon atoms to form a ring, wherein in Formula 1-1 and Formula 1-2, $R_{11}$ to $R_{18}$ and $R_{21}$ to $R_{27}$ are each independently a substituent of a hydrogen atom, a deuterium atom, a halogen atom, a substituted or unsubstituted linear alkyl group of 1 to 20 carbon atoms, a substituted or unsubstituted branched alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted amino group, a substituted or unsubstituted silyl group, a substituted or unsubstituted carbonyl group, a substituted or unsubstituted oxy group, or a substituted or unsubstituted thio group, or are combined with an adjacent group to form a fused ring, $R_{28}$ to $R_{31}$ are each independently a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted amino group, a substituted or unsubstituted silyl group, a substituted or unsubstituted carbonyl group, a substituted or unsubstituted oxy group, or a substituted or unsubstituted thio group, or are combined with an adjacent group to form a fused ring, one of $R_{11}$ to $R_{18}$ or a substituent of the fused ring formed from $R_{11}$ to $R_{18}$ is the polycyclic hetero group represented by Formula 2, one of $R_{21}$ to $R_{31}$ or a substituent of the fused ring formed from $R_{21}$ to $R_{31}$ is the polycyclic hetero group represented by Formula 2, and $R_a$ and $R_b$ are the same as defined in Formula 1.

13. The compound of claim 11, wherein Formula 2 is represented by Formula 2-1 or Formula 2-2:

[Formula 2-1]

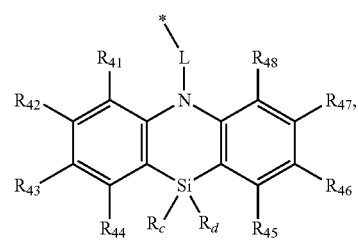

[Formula 2-2]

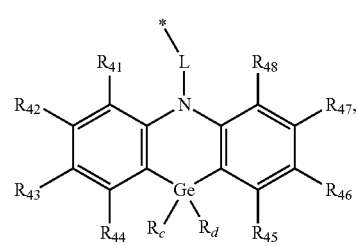

wherein in Formula 2-1 and Formula 2-2, $R_{41}$ to $R_{48}$ are each independently a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, a substituted or unsubstituted heteroaryl group of 2 to 30 carbon atoms to form a ring, a substituted or unsubstituted amino group, a substituted or unsubstituted silyl group, a substituted or unsubstituted carbonyl group, a substituted or unsubstituted oxy group, or a substituted or unsubstituted thio group, and L, $R_c$, and $R_d$ are the same as defined in Formula 2.

14. The compound of claim 12, wherein Formula 1-1 is represented by Formula 1-1A or Formula 1-1B:

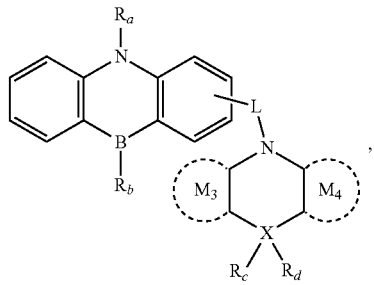

[Formula 1-1A]

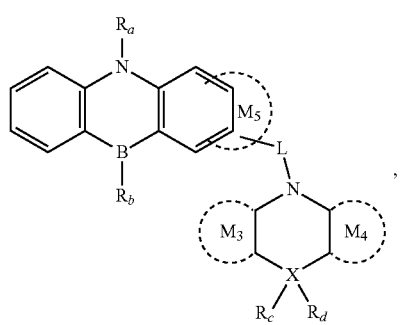

[Formula 1-1B]

wherein in Formula 1-1B, $M_5$ is a substituted or unsubstituted hydrocarbon ring of 5 to 30 carbon atoms to form a ring, or a substituted or unsubstituted heterocycle of 2 to 30 carbon atoms to form a ring, and wherein in Formula 1-1A and Formula 1-1B, $R_a$ and $R_b$ are the same as defined in Formula 1, and X, L, $M_3$, $M_4$, $R_c$, and $R_d$ are the same as defined in Formula 2.

15. The compound of claim 12, wherein Formula 1-2 is represented by one selected from Formulae 1-2A to 1-2C:

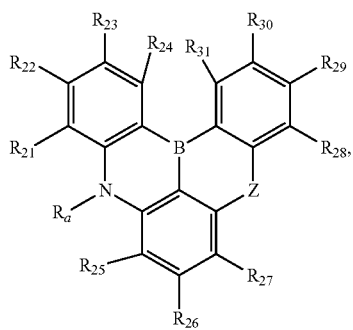

[Formula 1-2A]

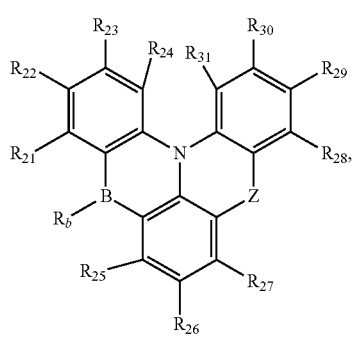

[Formula 1-2B]

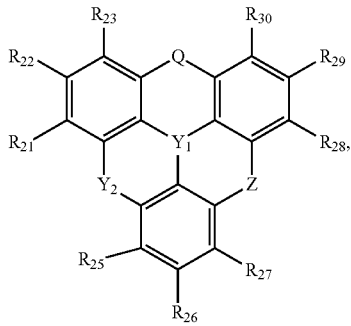

[Formula 1-2C]

wherein in Formula 1-2C,
Q is a direct linkage, O, S, C=O, $BR_g$, or $NR_h$, and
$R_g$ and $R_h$ are each independently a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms to form a ring, or a substituted or unsubstituted heteroaryl group of 2 to 30 carbon atoms to form a ring, wherein in Formula 1-2A to Formula 1-2C,
$R_a$, $R_b$, $Y_1$, $Y_2$, Z, and $R_{21}$ to $R_{31}$ are the same as defined in Formula 1-2.

16. The compound of claim 12, wherein Formula 1-2 is represented by one selected from Formula 1-2D to Formula 1-2F:

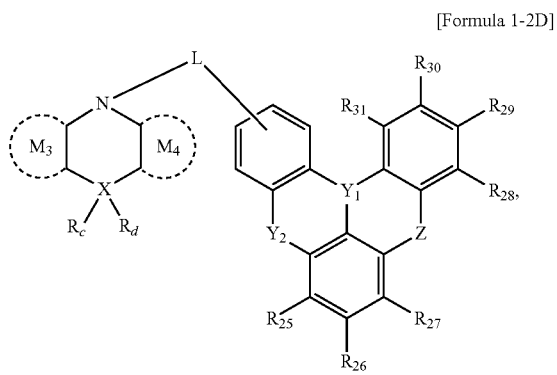

[Formula 1-2D]

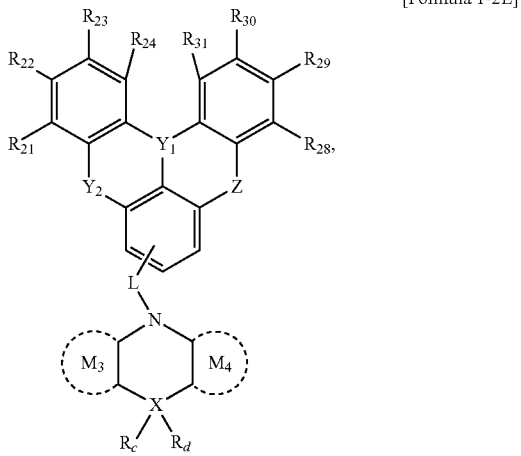

[Formula 1-2E]

-continued

[Formula 1-2F]

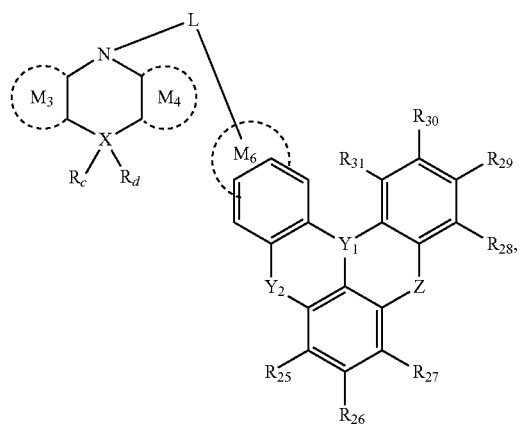

wherein in Formula 1-2F, $M_6$ is a substituted or unsubstituted hydrocarbon ring of 5 to 30 carbon atoms to form a ring, or a substituted or unsubstituted heterocycle of 2 to 30 carbon atoms to form a ring, and in Formula 1-2D to Formula 1-2F, $R_{21}$ to $R_{31}$, $Y_1$, $Y_2$, and Z are the same as defined in Formula 1-2, and X, L, $M_3$, $M_4$, $R_c$, and $R_d$ are the same as defined in Formula 2.

17. The compound of claim 11, wherein $M_1$ and $M_2$ are each independently a substituted or unsubstituted benzene ring, a substituted or unsubstituted naphthalene ring, or a substituted or unsubstituted dibenzothiophene ring.

18. The compound of claim 11, wherein $M_3$ and $M_4$ are substituted or unsubstituted benzene rings.

19. The compound of claim 11, wherein the compound represented by Formula 1 is a material to emit thermally activated delayed fluorescence.

20. The compound of claim 11, wherein Formula 1 is at least one selected from Compound Group 1:

[Compound Group 1]

1

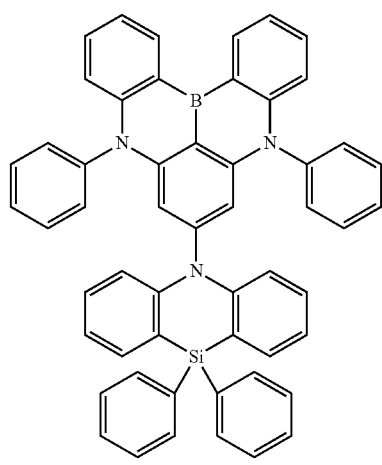

-continued

2

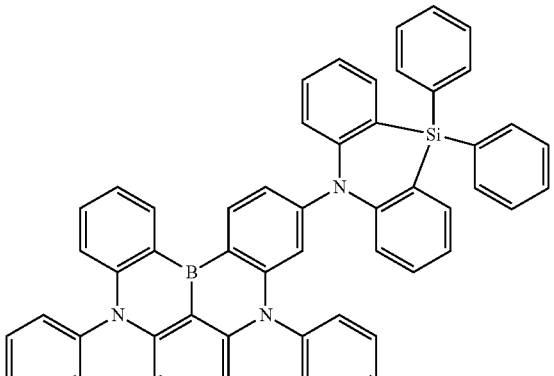

3

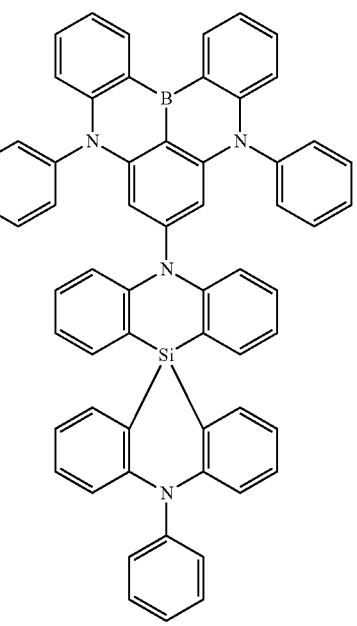

4

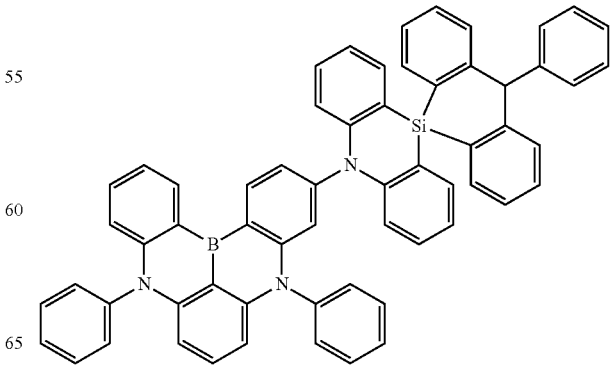

5
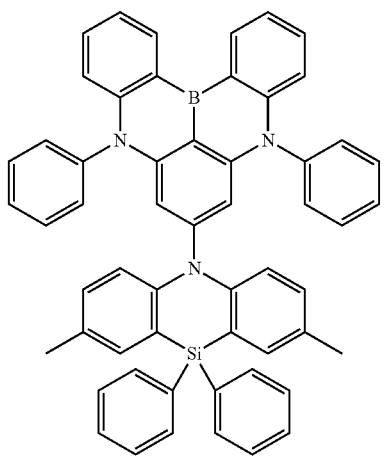
6
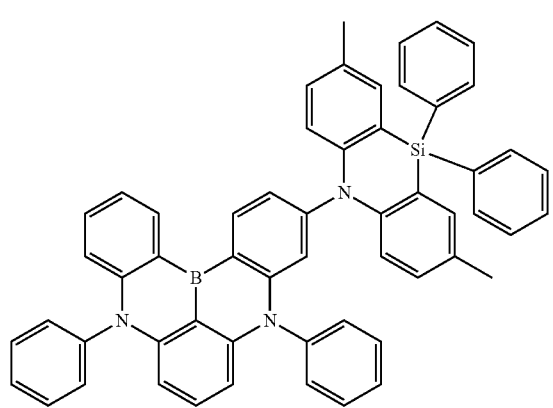
7
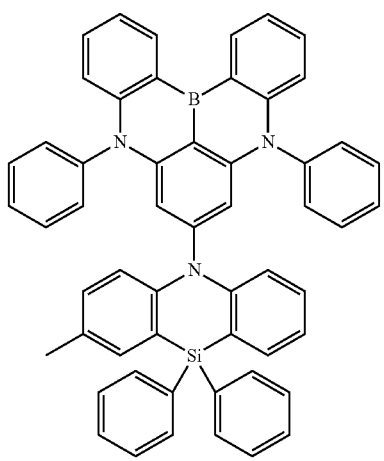
8
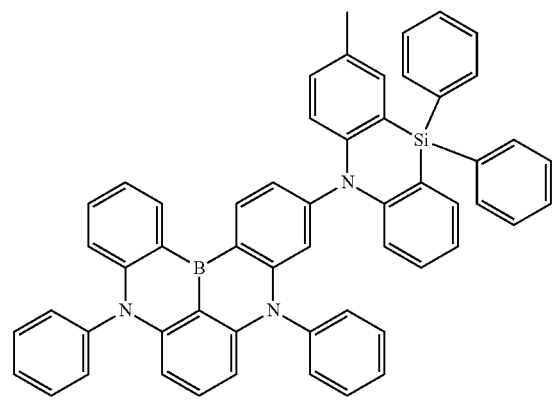
9
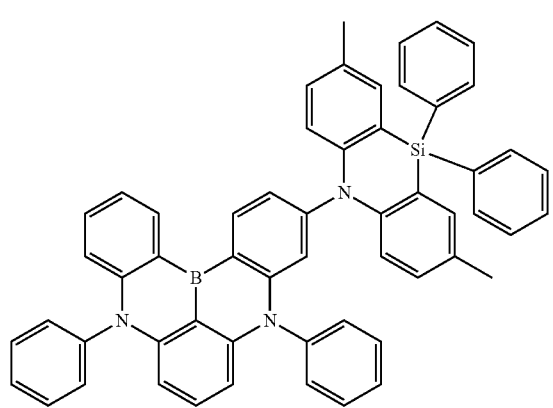
10
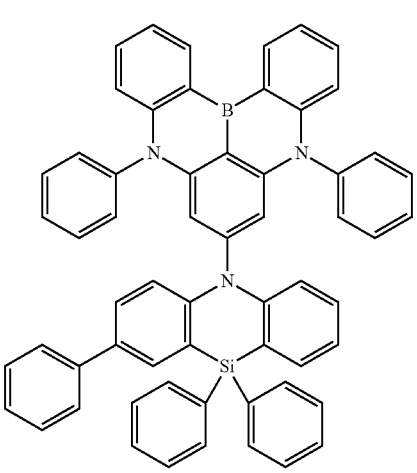

11
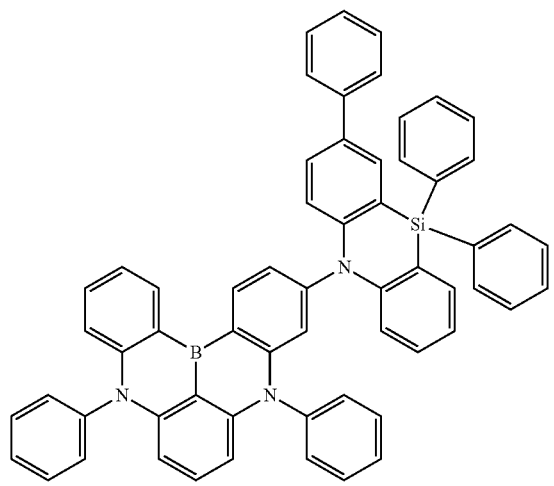
12
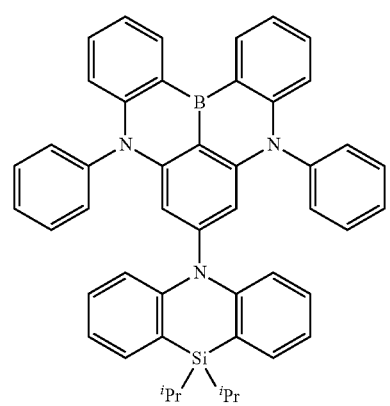
13
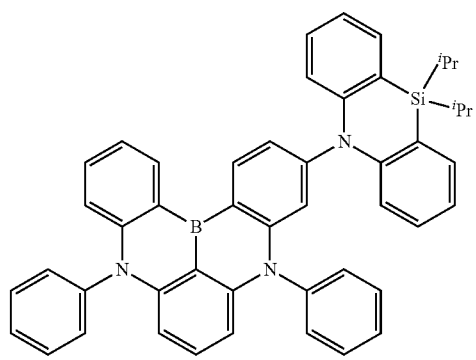
14
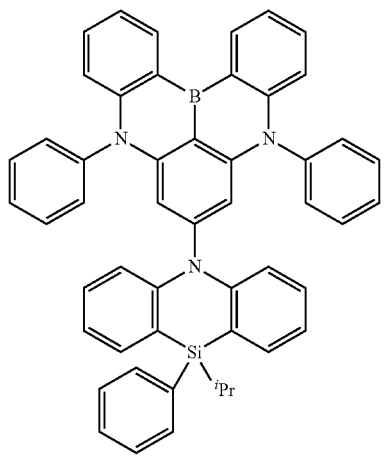
15
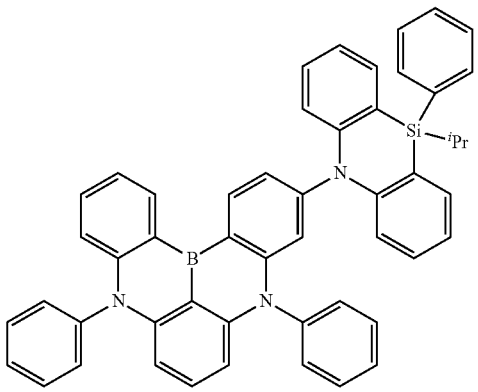
16
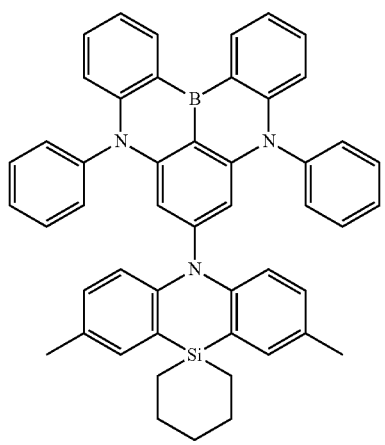

-continued
17
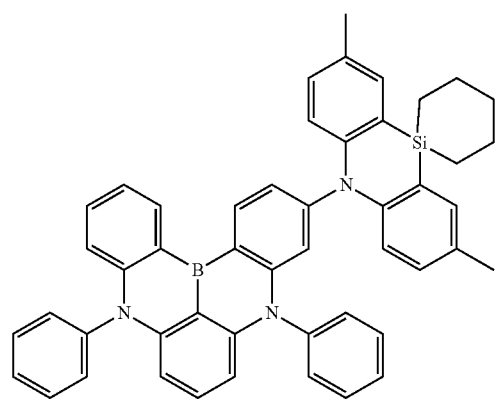
18
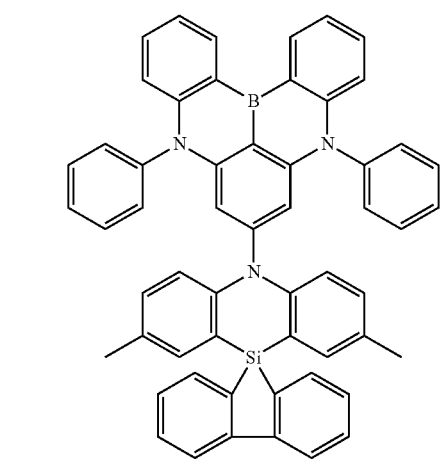
19
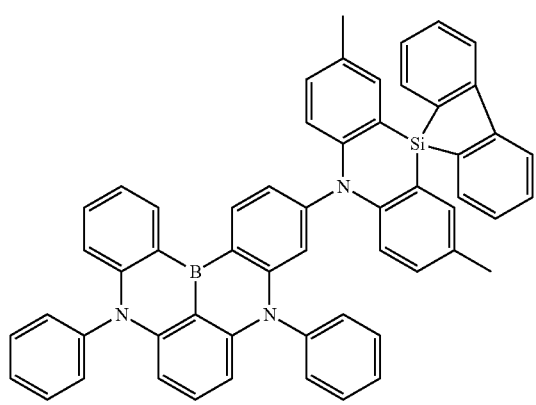
-continued
20
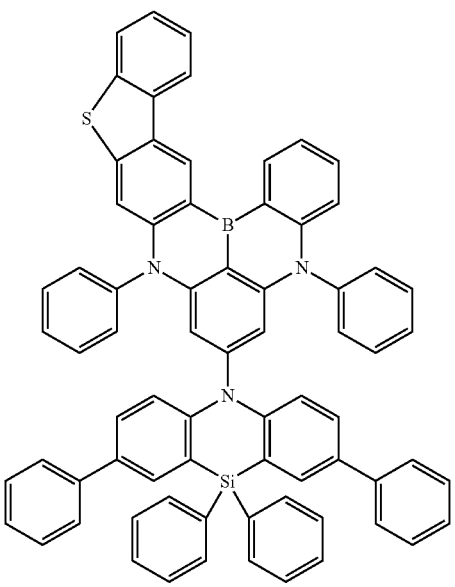
21
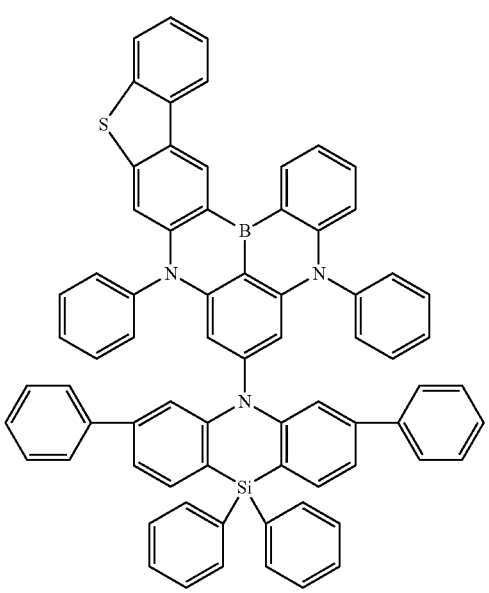
22
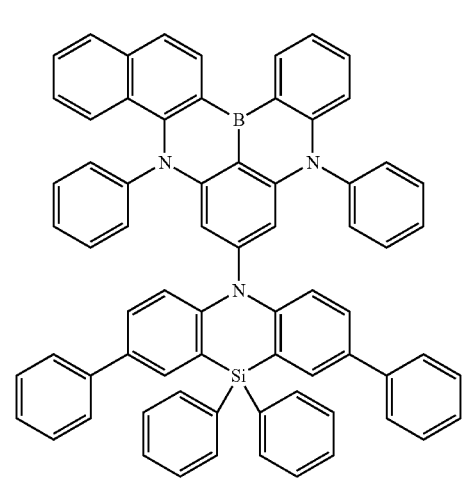

-continued
23
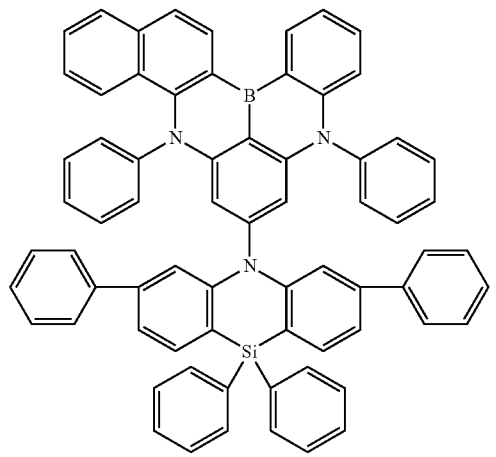
24
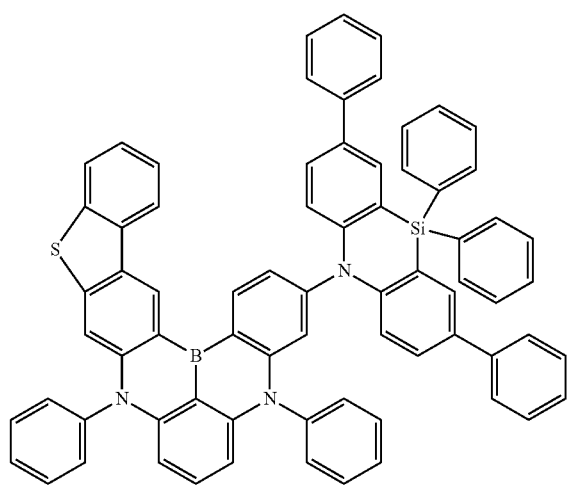
25
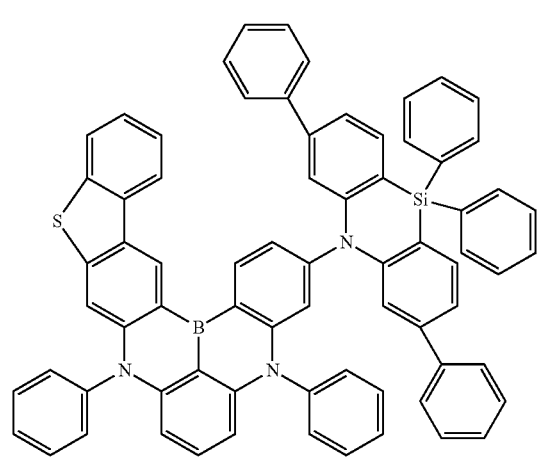
-continued
26
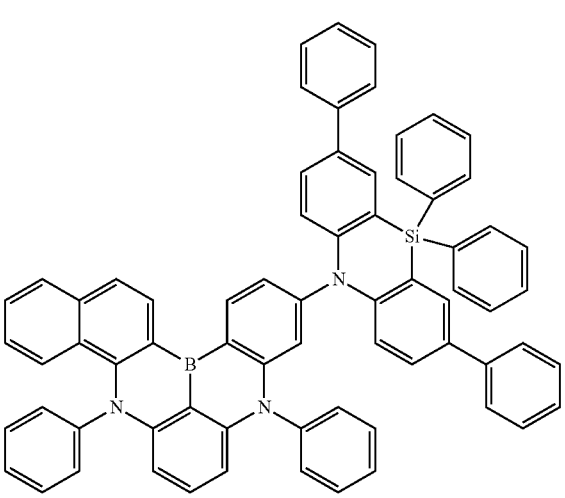
27
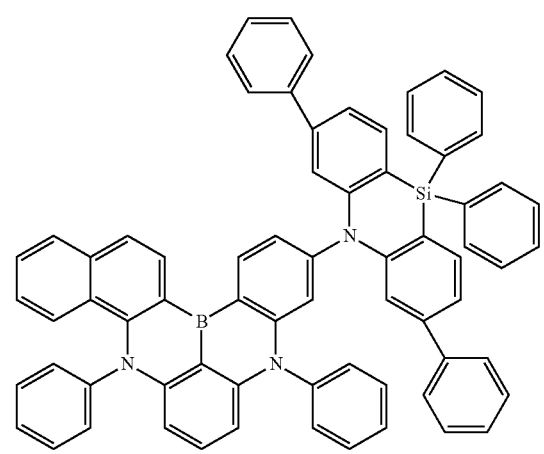
28
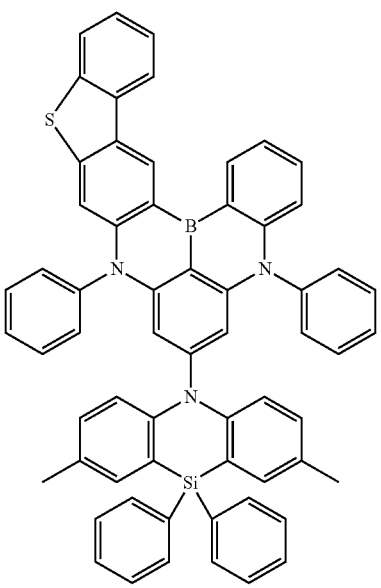

29
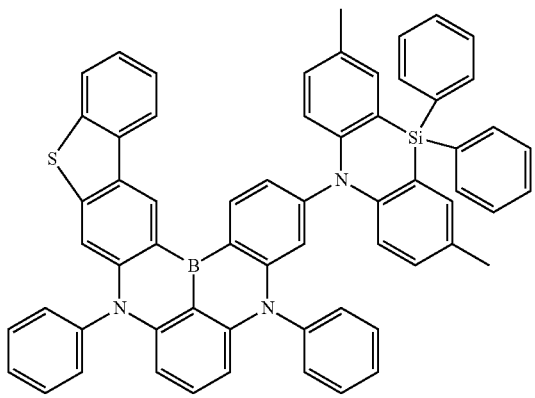
30
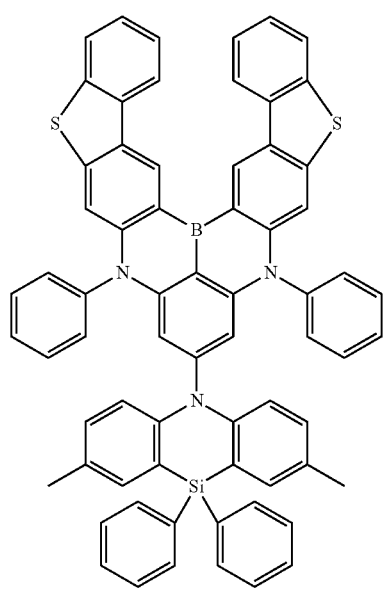
31
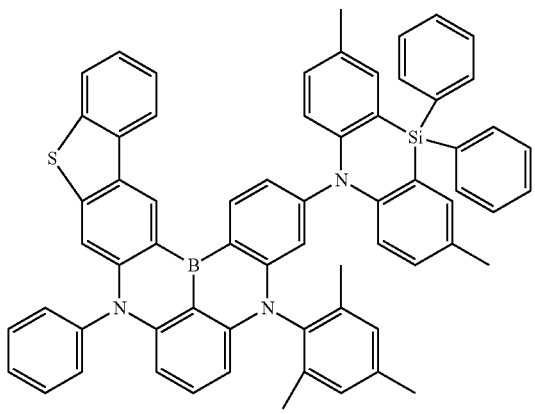
32
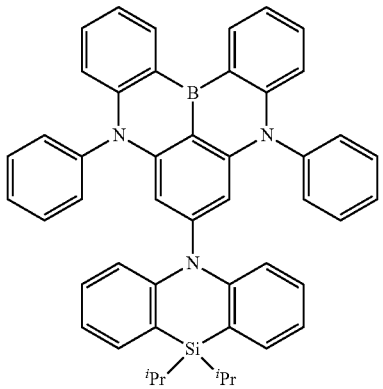
33
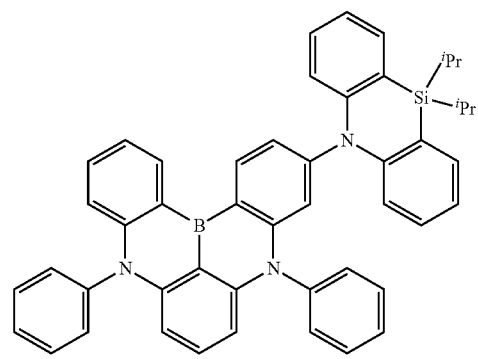
34
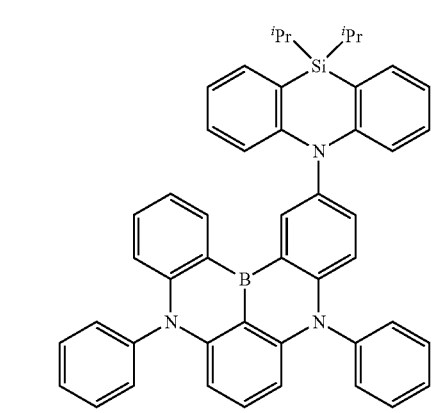
35
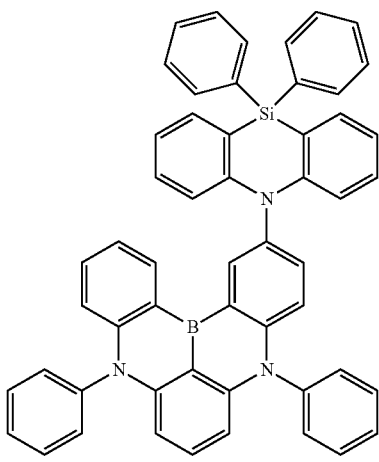

36
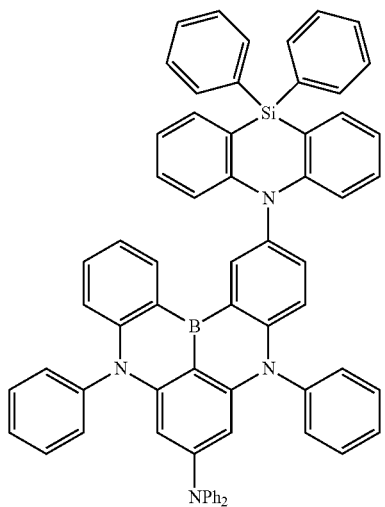
39
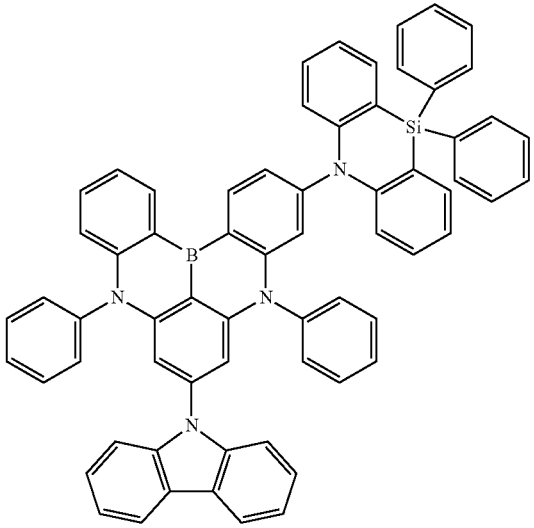
37
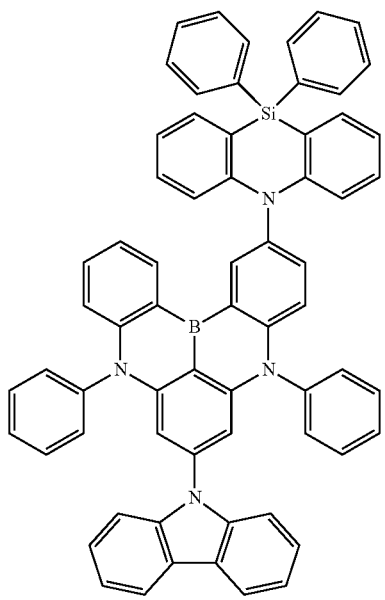
40
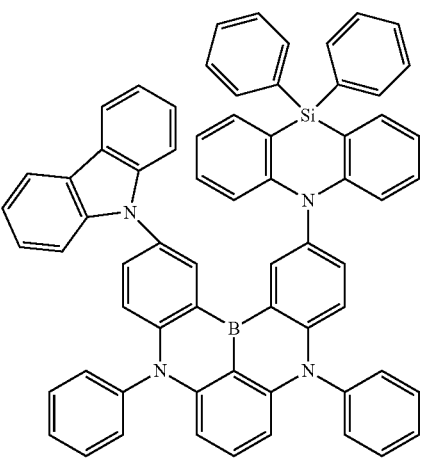
38
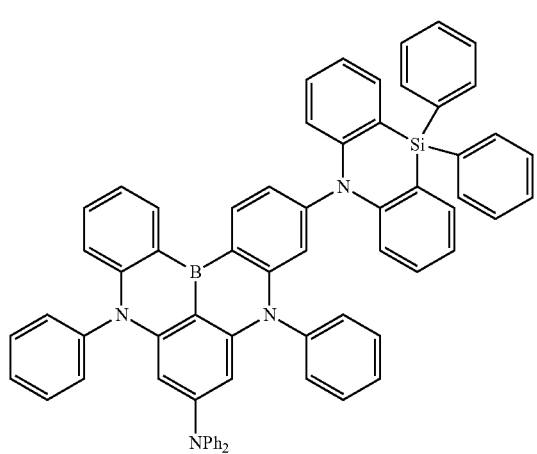
41
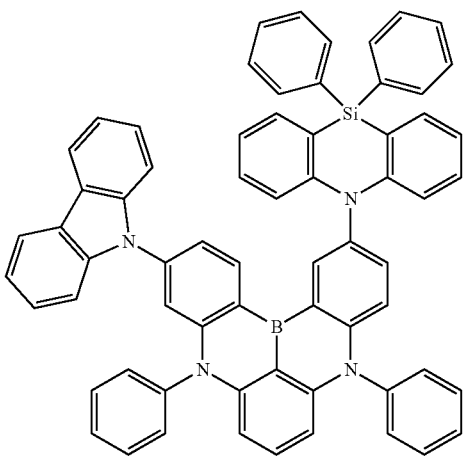

42
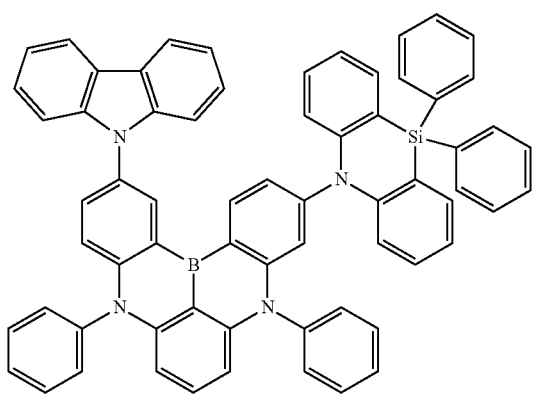
43
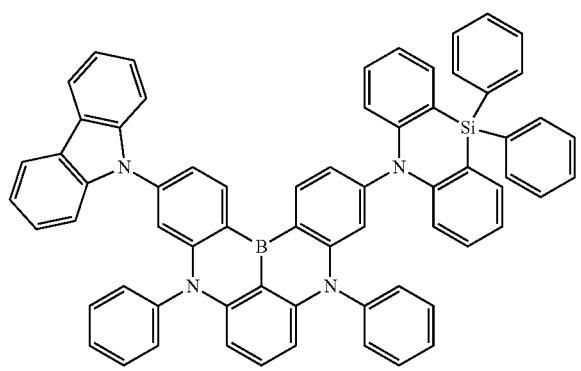
44
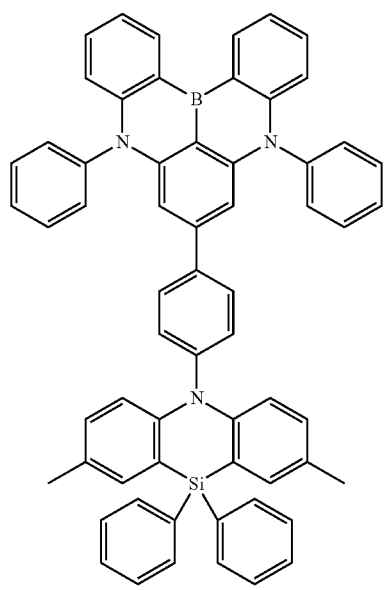
45
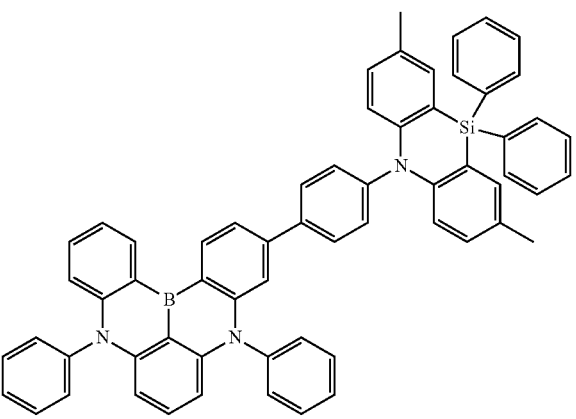
46
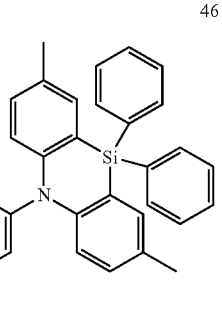
47
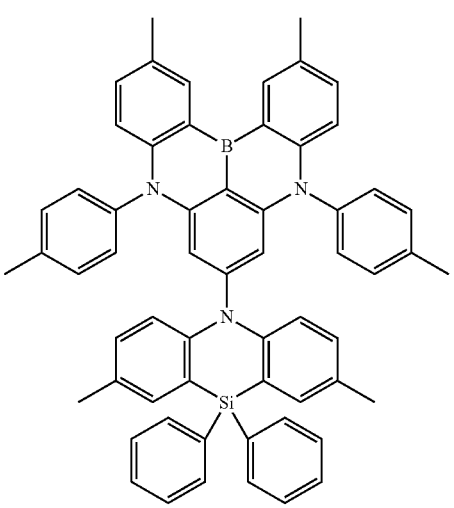

-continued
48
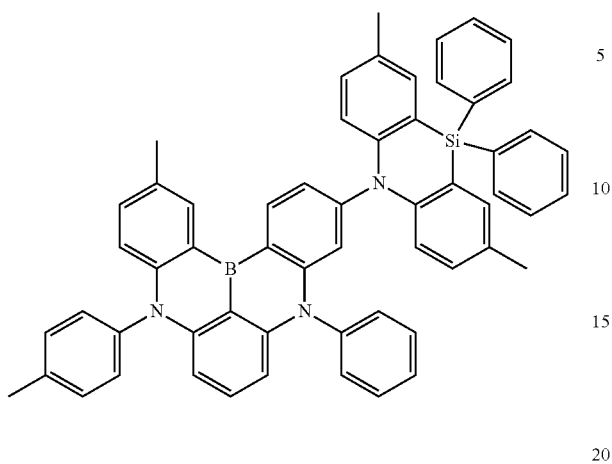
49
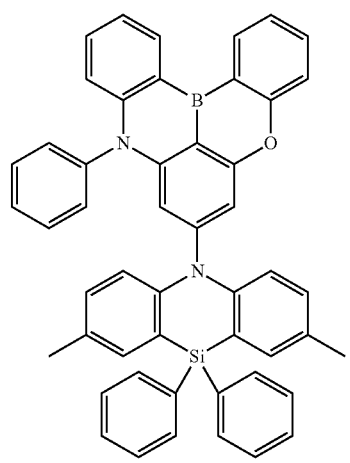
50
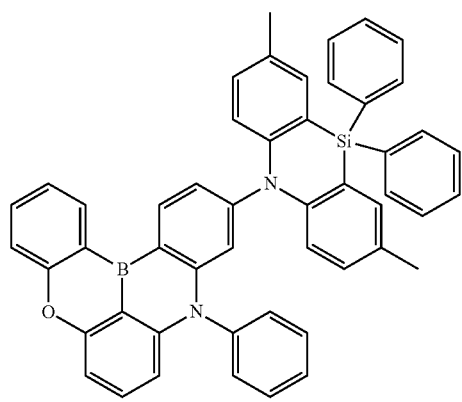
-continued
51
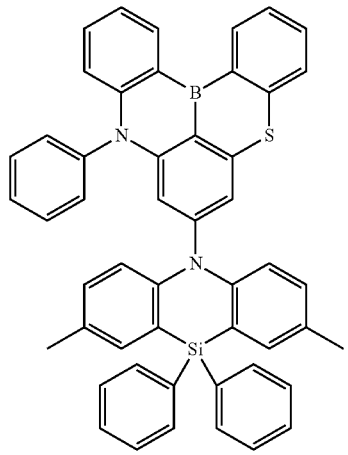
52
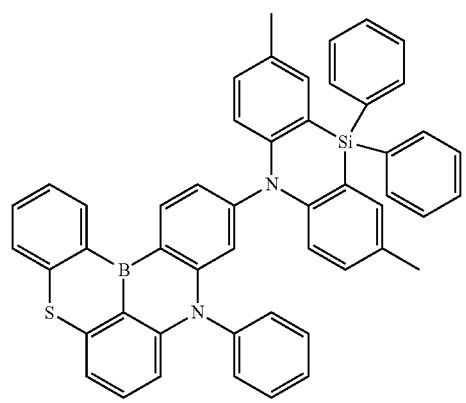
53
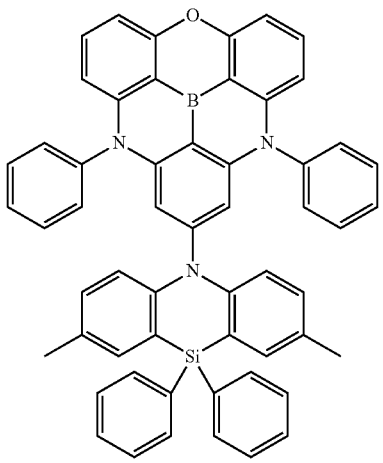

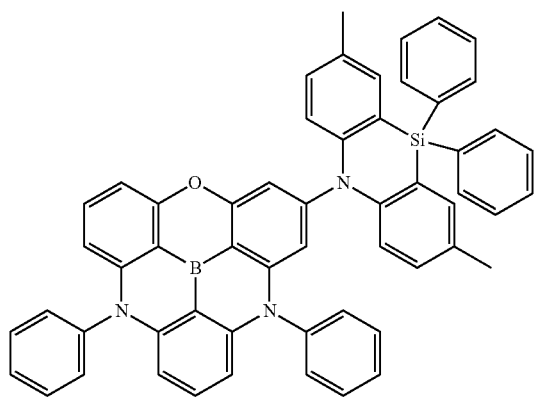
54
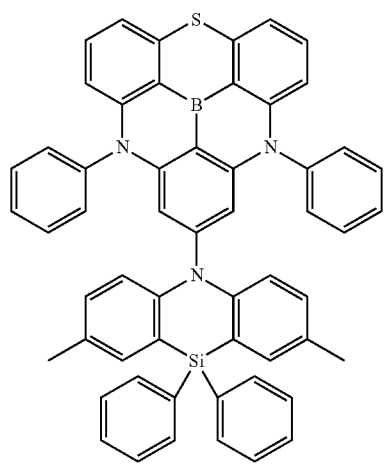
55
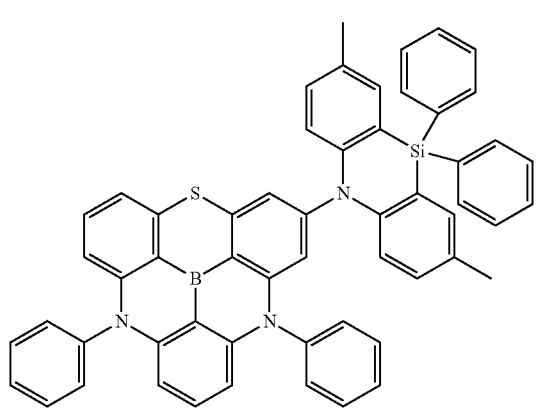
56
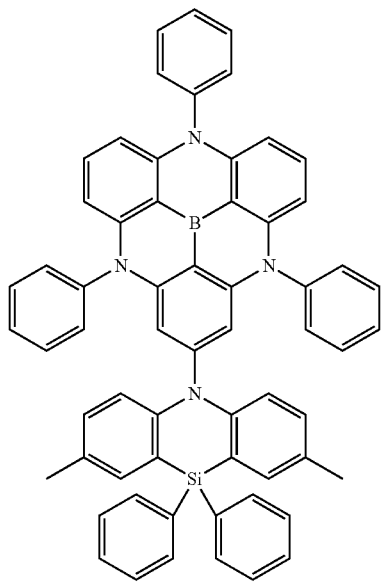
57
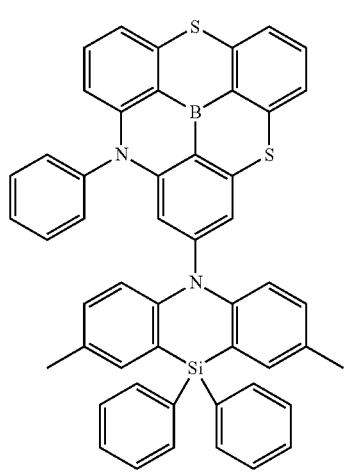
58
59

60
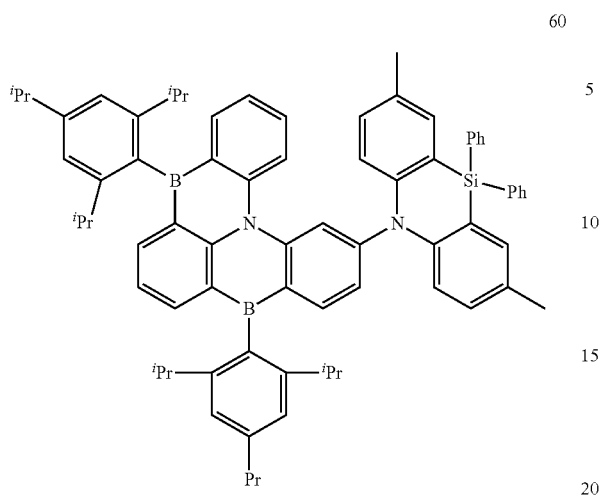
61
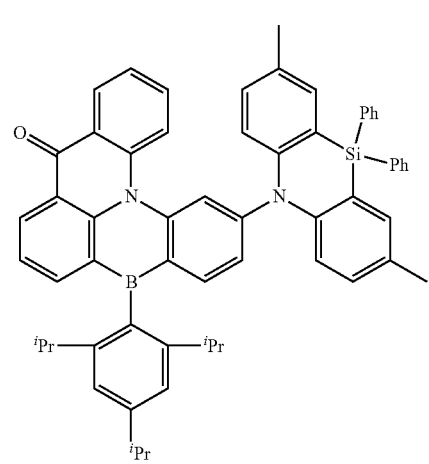
62
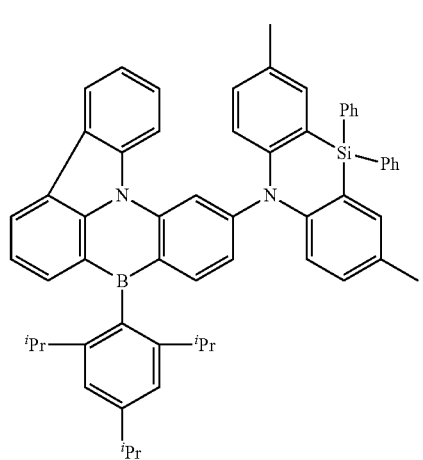
63
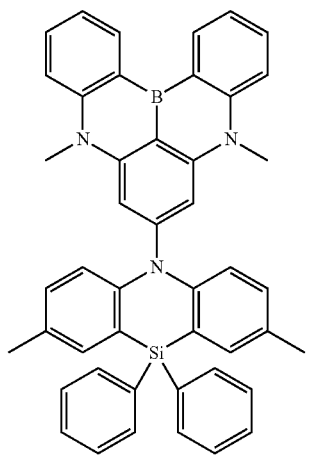
64
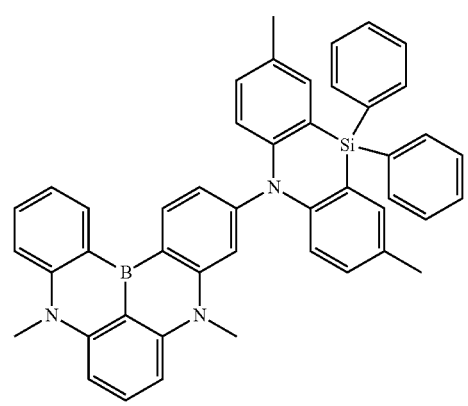
65
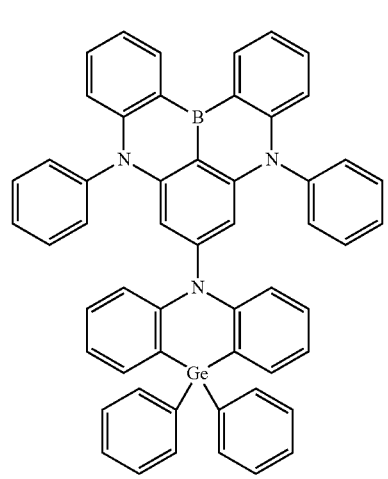

131
-continued
66
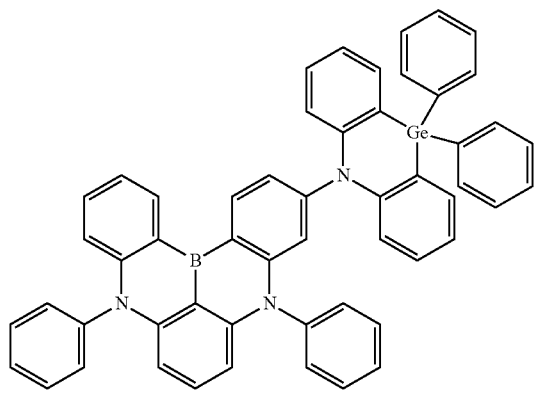
67
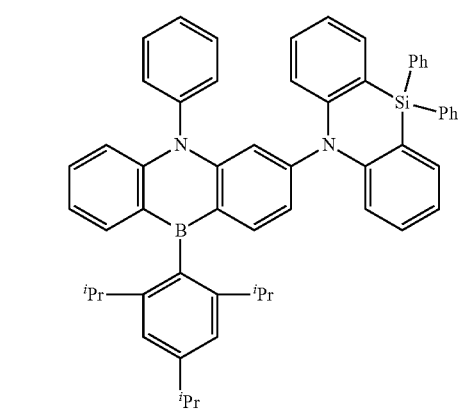
68
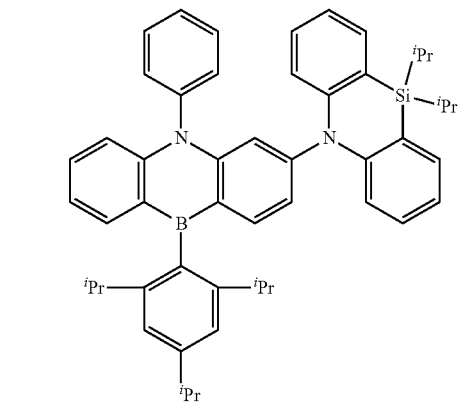
69
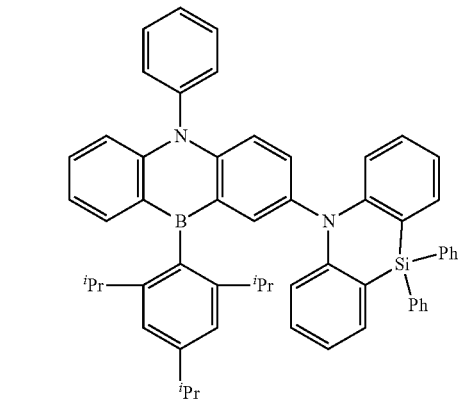
132
-continued
70
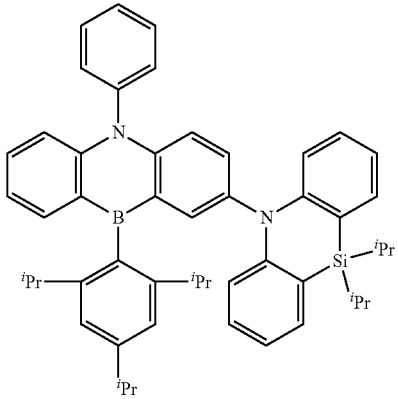
71
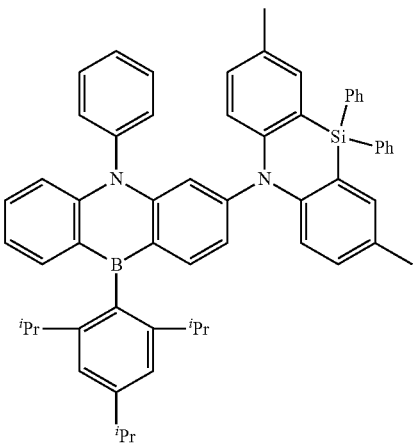
72
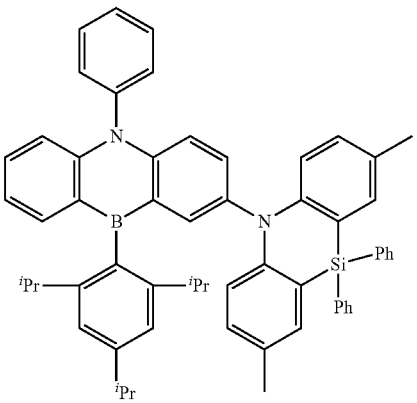
73
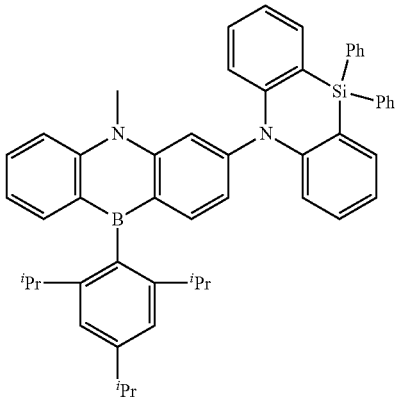

-continued
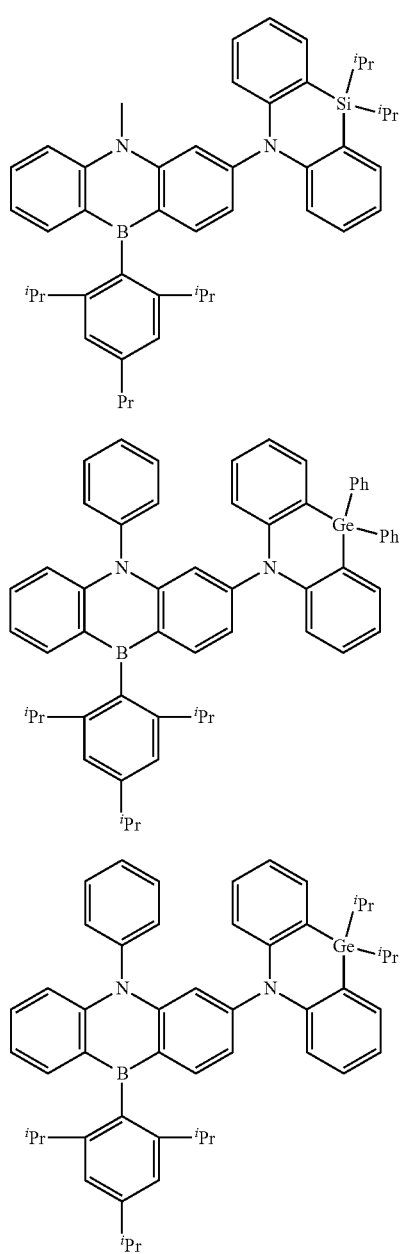
74
75
76
-continued
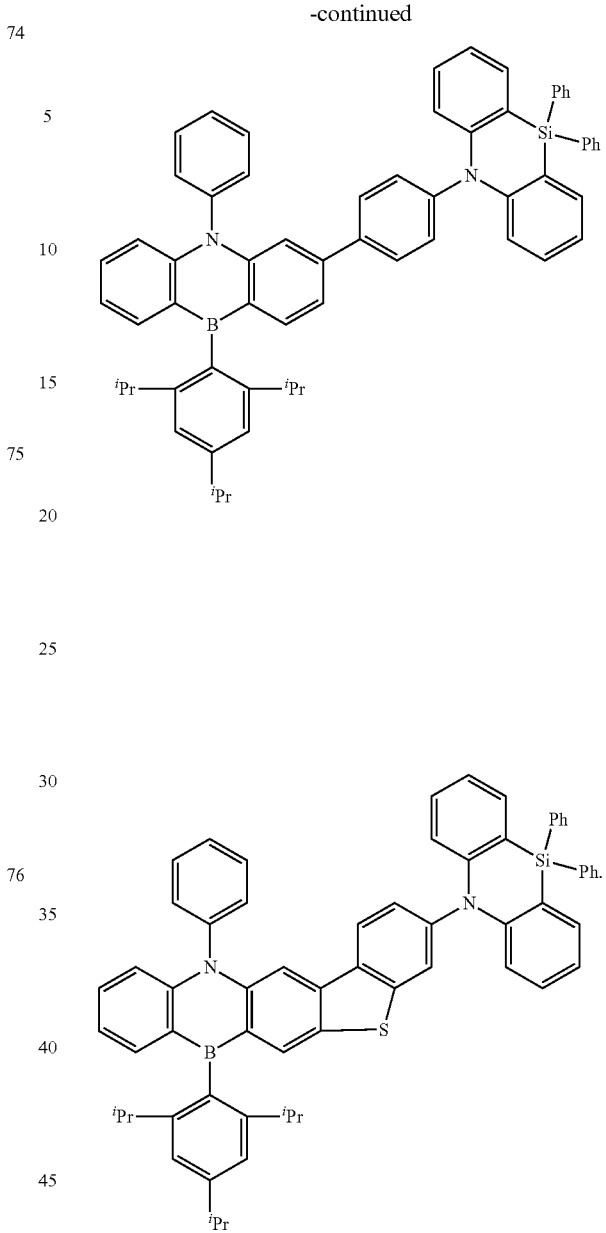
77
78
* * * * *